(12) United States Patent
Yamazaki et al.

(10) Patent No.: US 7,230,601 B2
(45) Date of Patent: Jun. 12, 2007

(54) DISPLAY SYSTEM

(75) Inventors: Shunpei Yamazaki, Tokyo (JP); Jun Koyama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 447 days.

(21) Appl. No.: 10/132,431

(22) Filed: Apr. 25, 2002

(65) Prior Publication Data

US 2002/0158829 A1  Oct. 31, 2002

(30) Foreign Application Priority Data

Apr. 27, 2001 (JP) ............................. 2001-133727

(51) Int. Cl.
*G09G 3/36* (2006.01)
(52) U.S. Cl. ............................ 345/92; 345/87; 345/90; 345/98; 345/100; 345/204; 349/42; 349/43; 349/47; 349/52
(58) Field of Classification Search .................. 345/87, 345/80, 92, 93, 90, 98, 100, 204–206; 257/66, 257/72, 206; 349/42–47
See application file for complete search history.

(56) References Cited

U.S. PATENT DOCUMENTS

| | | | | |
|---|---|---|---|---|
| 5,757,054 A | * | 5/1998 | Miyawaki et al. | ........... 257/390 |
| 5,834,797 A | * | 11/1998 | Yamanaka | ..................... 257/57 |
| 6,025,822 A | * | 2/2000 | Motegi et al. | ................. 345/98 |
| 6,147,451 A | * | 11/2000 | Shibata et al. | ............... 313/506 |
| 6,198,133 B1 | | 3/2001 | Yamazaki et al. | ........... 257/347 |
| 6,252,248 B1 | | 6/2001 | Sano et al. | ..................... 257/59 |
| 6,327,006 B1 | | 12/2001 | Sato et al. | ..................... 349/44 |
| 6,340,830 B1 | | 1/2002 | Takemura | .................... 257/350 |
| 6,534,788 B1 | * | 3/2003 | Yeo et al. | ...................... 257/72 |
| 6,611,300 B1 | * | 8/2003 | Ohkubo et al. | ................ 349/43 |
| 6,724,011 B2 | * | 4/2004 | Segawa et al. | ................ 257/72 |
| 6,888,522 B1 | * | 5/2005 | Shibata et al. | ................ 345/87 |

FOREIGN PATENT DOCUMENTS

| | | |
|---|---|---|
| EP | 1 103 946 | 5/2001 |
| JP | 8-078329 | 3/1996 |
| JP | 2001-343933 | 12/2001 |

OTHER PUBLICATIONS

English Abstract re Japanese Patent Application No. 8-078329 published Mar. 22, 1996.
English Abstract re Japanese Patent Application No. 2001-343933 published Dec. 14, 2001.

* cited by examiner

*Primary Examiner*—Richard Hjerpe
*Assistant Examiner*—Jennifer T. Nguyen
(74) *Attorney, Agent, or Firm*—Cook, Alex, McFarron, Manzo, Cummings & Mehler, Ltd.

(57) ABSTRACT

To solve a problem of increased power consumption power due to wiring capacitances, which occurs when connecting onto a display substrate a substrate on which a memory, a memory controller, and the like are formed. The memory, the memory controller, and the like are integrally formed on the display substrate. At this time, these circuits are formed using a dual gate TFT. Thus, a display device in which wiring capacitances of connection portions between driver circuits composing a display and the memory controller and the like are reduced and which has thus low power consumption can be provided.

40 Claims, 23 Drawing Sheets

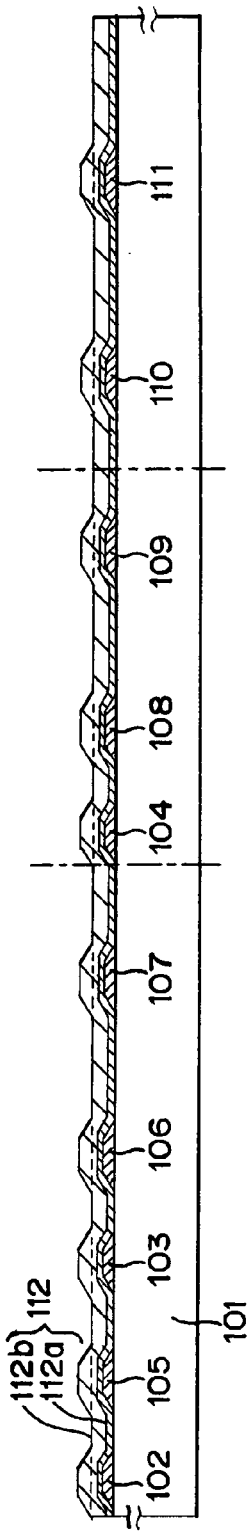
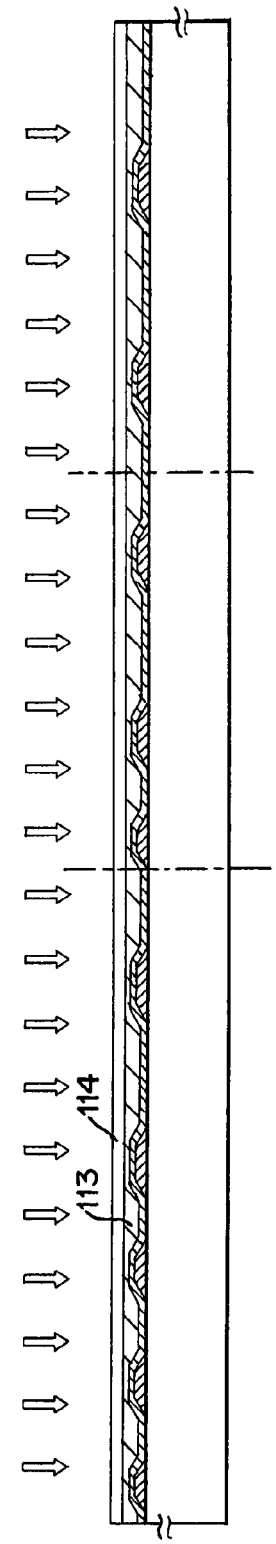
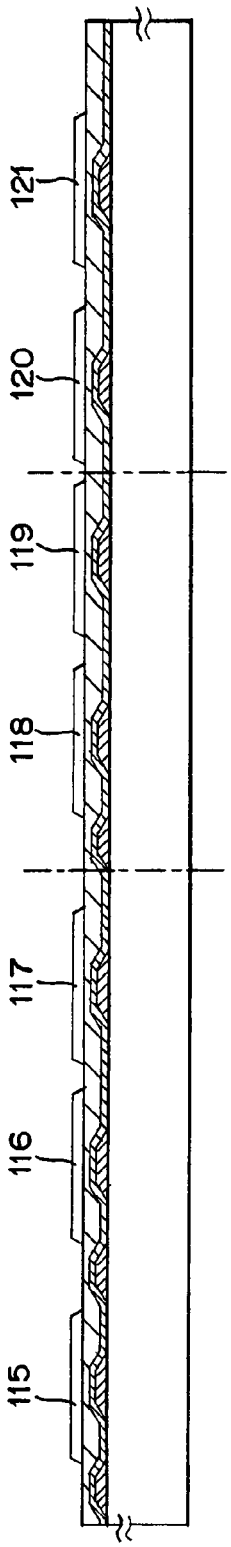

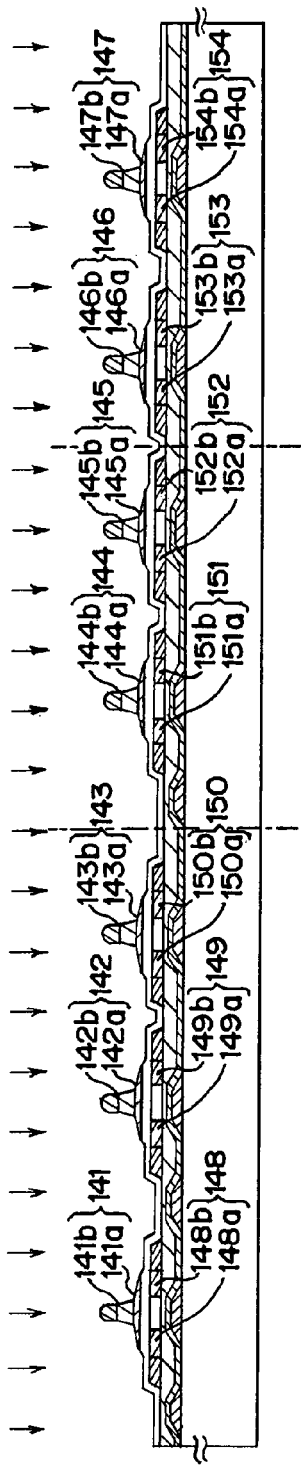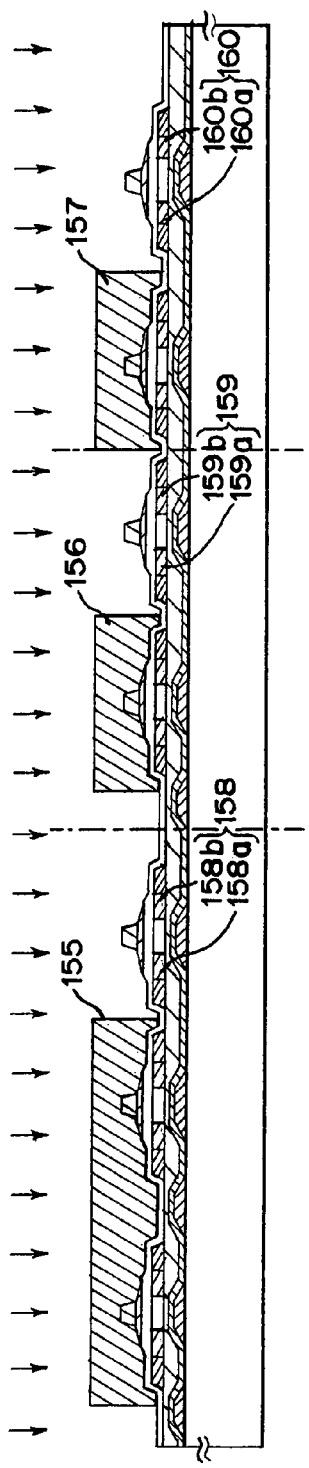

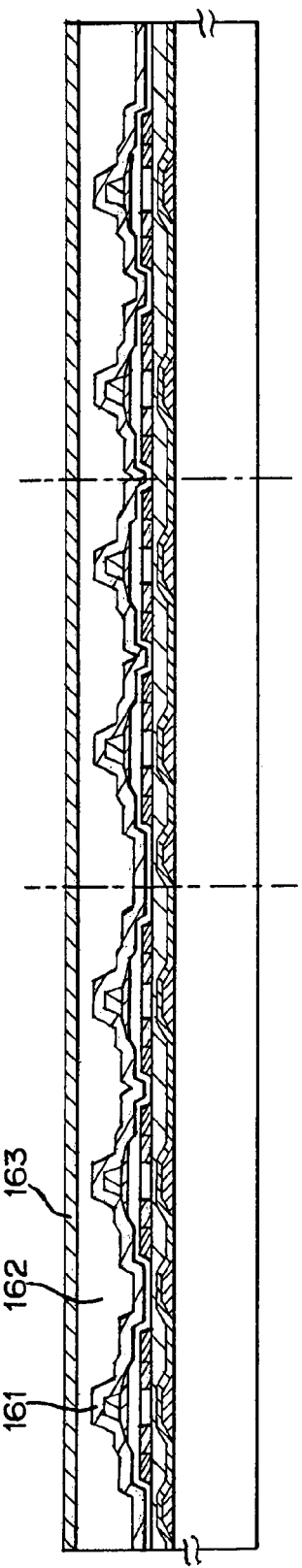
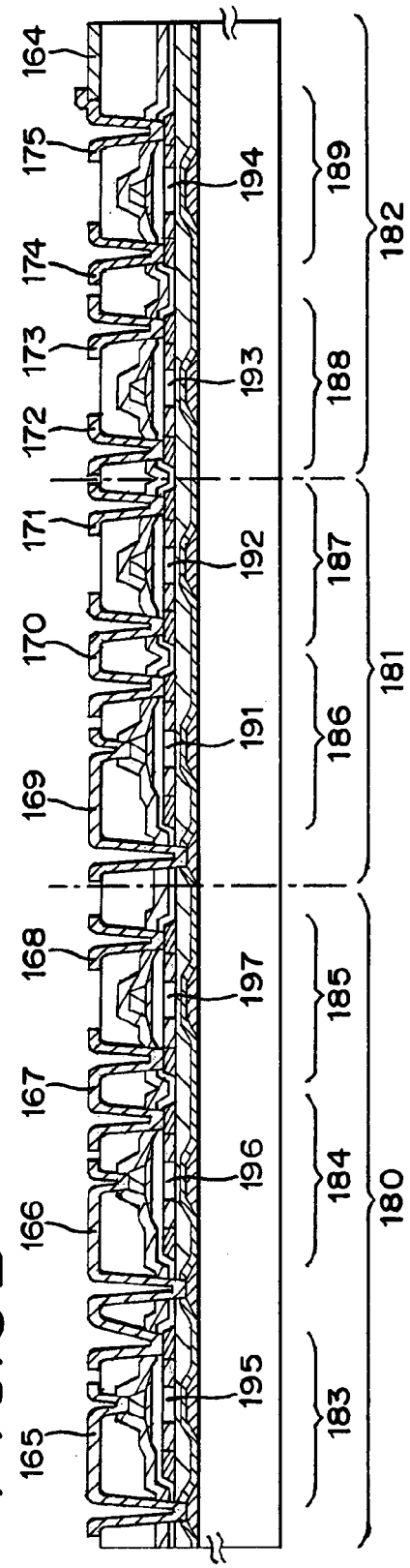

DISPLAY SYSTEM

BACKGROUND OF THE INVENTION

1. Field of the Invention

The present invention relates to a display system for displaying an image by inputting a digital video signal. Also, the present invention relates to an electronic device using the display system.

2. Description of the Related Art

A display system in which light emitting elements are arranged in respective pixels and light emission of the light emitting elements is controlled to display an image will be described below.

Here, an example in the case where a light emitting device is an element (OLED element) having a structure in which an organic compound layer for producing light emission upon generation of an electric field is sandwiched between an anode and a cathode will be described. Also, the light emitting element indicates both an element using light emission produced at transition from a singlet exciton to a ground state (fluorescence) and an element using light emission produced at transition from a triplet exciton state to the ground state (phosphorescence). As the organic compound layers, there are a hole injection layer, a hole transport layer, a light emitting layer, an electron transport layer, an electron injection layer, and the like. Basically, the light emitting element has a structure in which the anode, the light emitting layer, and the cathode are laminated in order. In addition, there are a structure in which the anode, the hole injection layer, the light emitting layer, the electron injection layer, and the cathode are laminated in this order, a structure in which the anode, the hole injection layer, the hole transport layer, the light emitting layer, the electron transport layer, the electron injection layer, and the cathode are laminated in this order, and the like.

A display system includes a display and a peripheral circuit for inputting a signal to the display. The display is composed of a source signal line driver circuit, a gate signal line driver circuit, and a pixel portion. The pixel portion has a structure in which pixels are arranged in matrix.

The display system in which thin film transistors (hereinafter referred to as TFTs) are arranged in the respective pixels and light emission of light emitting elements in the respective pixels is controlled by the TFTs to perform display (active matrix display system) will be described. A method of controlling light emission of the light emitting elements in the respective pixels in the case where two TFTs are arranged in each of the pixels will be described here.

First, a structure of the pixel will be described in detail. FIG. 21A shows a structure of the pixel portion in the display system.

Source signal lines S1 to Su, gate signal lines G1 to Gv, and power supply lines V1 to Vu are located in a pixel portion 700 to arrange pixels with u (u is a natural number) columns and v (v is a natural number) rows. Each of pixels 800 has a switching TFT 801, a driver TFT 802, a storage capacitor 803, and a light emitting element 804.

FIG. 21B is an enlarged view of one pixel in the pixel portion shown in FIG. 21A. The pixel is composed of one line S of the source signal lines S1 to Su, one line G of the gate signal lines G1 to Gv, one line V of the power supply lines V1 to Vu, the switching TFT 801, the driver TFT 802, the storage capacitor 803, and the light emitting element 804.

The gate electrode of the switching TFT 801 is connected with the gate signal line G. With respect to the source region and the drain region of the switching TFT 801, one is connected with the source signal line S and the other is connected with the gate electrode of the driver TFT 802 and one electrode of the storage capacitor 803. With respect to the source region and the drain region of the driver TFT 802, one is connected with the power supply line V and the other is connected with the anode or the cathode of the light emitting element 804. Of two electrodes of the storage capacitor 803, one electrode which is not connected with the driver TFT 802 and the switching TFT 801 is connected with the power supply line V.

Here, when the source region or the drain region of the driver TFT 802 is connected with the anode of the light emitting element 804, the anode of the light emitting element 804 is called a pixel electrode and the cathode thereof is called a counter electrode. On the other hand, when the source region or the drain region of the driver TFT 802 is connected with the cathode of the light emitting element 804, the cathode of the light emitting element 804 is called a pixel electrode and the anode thereof is called a counter electrode. Also, a potential provided for the power supply line V is called a power source potential and a potential provided for the counter electrode is called a counter potential.

Here, the counter potential can be changed by an external power source (not shown) such that this potential becomes a potential of the same order as the potential of the power supply lines V1 to Vu (power source voltage) or has a potential difference between the potential of the power supply lines V1 to Vu, to the extent that the light emitting device 804 can emit light.

The switching TFT 801 and the driver TFT 802 each may be a p-channel TFT or an n-channel TFT. However, when the pixel electrode of the light emitting element 804 is the anode, the driver TFT 802 is desirably a p-channel TFT and the switching TFT 801 is desirably an n-channel TFT. On the other hand, when the pixel electrode is the cathode, the driver TFT 802 is desirably an n-channel TFT and the switching TFT 801 is desirably a p-channel TFT. Because it is desirable that a TFT is operated with a state that a potential of the source region is fixed.

Note that the storage capacitor 803 is not necessarily provided. For example, the case where an n-channel TFT used as the driver TFT 802 has an LDD region provided so as to overlap a gate electrode through a gate insulating film is noted. A parasitic capacitor which is generally called a gate capacitor is produced in the overlapped region. The parasitic capacitor can be actively used as a storage capacitor for keeping a voltage applied to the gate electrode of the driver TFT 802.

Next, a circuit for inputting signals to the source signal line driver circuit and the gate signal line driver circuit in the display will be described. FIG. 17 is used for the description. Note that a signal inputted to the display system is called a digital video signal. An example of a display system for representing a gradation by inputting a digital video signal of n bits will be described here.

A digital video signal is read into a signal control circuit 1101 and a digital image signal (VD) is outputted to a display 1100. Here, a signal to be inputted to the display, which is converted by editing the digital video signal (first image signal) in the signal control circuit is called the digital image signal (second image signal).

Signals for driving a source signal line driver circuit 1107 and a gate signal line driver circuit 1108 in the display 1100 are inputted from a display controller 1102. Also, the source signal line driver circuit 1107 includes a shift register 1110, an LAT(A) 1111, and an LAT(B) 1112. Although not shown, a level shifter, a buffer, and the like may be further provided.

The signal control circuit 1101 and the display controller 1102 will be described.

First, a structure and an operation of the signal control circuit 1101 will be described. The signal control circuit 1101 is composed of a CPU 1104, a memory-A 1105, a memory-B 1116, and a memory controller 1103.

A digital video signal inputted to the signal control circuit 1101 is inputted to the memory-A 1105 through the CPU 1104. Here, the memory-A 1105 and the memory-B 1106 each have a capacity capable of storing a digital video signal of n-bits corresponding to all pixels of a pixel portion 1109 in the display 1100. When a signal corresponding to one frame period is stored in the memory-A 1105, the signals of the respective bits are read out in order by the memory controller 1103 and are inputted as the digital image signals (VD) to the source signal line driver circuit 1107. The digital video signal is sampled alternately using the memory-A 1105 and the memory-B 1106.

Hereinafter, both the memory-A and the memory-B in the above-mentioned signal control circuit are integrally indicated as a memory. The memory is composed of a plurality of memory elements arranged in matrix. The memory elements are selected by an address of (x, y).

The memory controller 1103 for controlling input and output of the digital video signal will be described using FIG. 19. The memory controller 1103 is composed of a memory read/write control (hereinafter referred to as a memory R/W) circuit 1202, a standard oscillating circuit 1203, a variable dividing circuit 1204, an x-counter 1205*a*, a y-counter 1205*b*, an x-decoder 1206*a*, and a y-decoder 1206*b*.

The memory controller 1103 selects an address (x, y) of the memory in accordance with signals from the CPU 1104. Also, a memory R/W signal for selecting an operation for writing a signal into the memory or an operation for reading out a signal from the memory is outputted.

Next, signals such as the start pulses and the clock pulses are outputted to the source signal line driver circuit and the gate signal line driver circuit. The display controller 1102 will be described using FIG. 20. The display controller 1102 is composed of a standard clock generating circuit 1301, a horizontal clock generating circuit 1303, a vertical clock generating circuit 1304, and a power source control circuit 1305 for a light emitting element.

A clock signal 31, a horizontal periodic signal 32, and a vertical periodic signal 33 are inputted from the CPU 1104 to the display controller 1102. Thus, the display controller 1102 outputs a clock pulse S_CLK and a start pulse S_SP for the source signal line driver circuit. Also, the display controller 1102 outputs a clock pulse G_CLK and a start pulse G_SP for the gate signal line driver circuit. The power source control circuit 1305 for the light emitting element controls a potential of a counter electrode (counter potential) of a light emitting element in each pixel of the display.

Turning again to FIG. 17, the start pulse S_SP and the clock pulse S_CLK for the source signal line driver circuit, which are outputted from the display controller 1102, are inputted to the shift register 1110 of the source signal line driver circuit 1107 of the display 1100. The start pulse G_SP and the clock pulse G_CLK for the gate signal line driver circuit, which are outputted from the display controller 1102, are inputted to the gate signal line driver circuit 1108 of the display 1100.

Here, generally, the respective driver circuits (source signal line driver circuit and gate signal line driver circuit) composing the display are formed on another substrate such as a single crystalline IC substrate and the resultant substrate is bonded onto a substrate on which pixels are formed (pixel substrate) to incorporate them into a display system. There is TAB (tape automated bonding) or the like as the bonding method. However, as described above, when the driver circuits are incorporated into the display system, an increase in a wiring resistance of the connection portion, poor connection thereof, an increase of an area of a peripheral portion (frame region) of a pixel portion, and the like become problems.

Thus, a method of forming the driver circuits on the pixel substrate by using TFTs is proposed.

Generally, a TFT using an amorphous semiconductor thin film (hereinafter referred to as an a-TFT) is used as a TFT composing a pixel in an active matrix display system. Here, in the case of the a-TFT, there is a problem such as small field effect mobility. Thus, in the case of driver circuits using the a-TFT, there is a problem that a frequency characteristic cannot be improved. Therefore, a display system having a structure in which a TFT using a polycrystalline semiconductor thin film (hereinafter referred to as a p-TFT) is formed as a TFT composing a pixel portion and driver circuits is proposed. The p-TFT has larger field effect mobility than the a-TFT. Thus, a display system in which the pixel portion and the respective driver circuits are formed on the same substrate (hereinafter referred to as a display substrate) is proposed.

According to a conventional display system, a memory, a memory controller, a display controller, and the like (hereinafter the memory controller, the display controller, and the like are referred to as control circuits) which compose the display system are formed on another substrate such as a single crystalline IC substrate and connected onto a display substrate in which pixels and driver circuits are formed. Thus, when connecting the memory and the control circuits onto the display substrate, a wiring capacitance in the connection portion becomes a problem. Since wiring capacitances in the connection portions between the respective driver circuits and the pixel portion which are formed on the display substrate, and the memory and the control circuits which are externally attached thereto, are increased, the power consumption of the entire display system cannot be reduced.

SUMMARY OF THE INVENTION

In view of the above, an object of the present invention is to solve a problem with respect to a wiring capacitance in a connection portion which occurs when bonding a memory and control circuits, to thereby provide a display system with low power consumption.

A memory and control circuits are formed on the same substrate as a display substrate on which a pixel portion and respective driver circuits are formed. Thus, wiring capacitances between the memory and the control circuits and the respective driver circuits of the display can be reduced. Also, the display system can be miniaturized.

Note that, when the memory and the control circuits are formed on the same substrate as a substrate on which the pixel portion and the respective driver circuits of the display are formed, a TFT having a structure suitable to each of the circuits is used. Thus, the performances of the memory and the control circuits which are formed on a substrate having an insulating surface can be improved.

For example, it is preferable that a TFT provided in each pixel of the pixel portion has a small off current and a small variation in a threshold voltage. On the other hand, it is desirable that each TFT composing the memory has a small TFT size (particularly, a small channel width) to achieve a high packing density. Thus, it is required that the operational capacity of the TFT is improved and the TFT is operated at a low voltage. In other words, a TFT having a characteristic such as a large on current is desired. Further, in order to increase a drive frequency, it is preferable that a TFT having a characteristic such as a large on current is used for the respective driver circuits of the display and the control circuits.

Note that, when each TFT is to be separately manufactured as described above, the number of photo masks used for this manufacturing process is reduced. Thus, a TFT having the following structure is used.

A dual gate TFT is used as the TFT. The dual gate TFT includes a semiconductor film, a first electrode (first gate electrode), and a first insulating film interposed between the semiconductor film and the first electrode, and further includes a second electrode (second gate electrode) and a second insulating film interposed between the semiconductor film and the second electrode. Also, the dual gate TFT has a structure in which the first electrode and the second electrode are overlapped with each other so as to sandwich therebetween a channel-forming region provided in the semiconductor film. When potentials of the two electrodes in the dual gate TFT are suitably set, a TFT characteristic can be changed.

For example, when the first gate electrode and the second gate electrode are kept to be the same potential, the dual gate TFT (TFT having a first configuration) has a characteristic such as a large on current.

Also, when the first electrode is kept to be a constant potential, the dual gate TFT (TFT having a second configuration) has a characteristic such that an off current and a variation in a threshold are reduced. Note that a potential difference between a potential of the source region of the TFT and the constant potential of the first electrode is smaller than a threshold in the case of an n-channel TFT and is larger than the threshold in the case of a p-channel TFT.

The TFT having a first configuration and the TFT having a second configuration have the same basic structure. Thus, an increase in the number of photo masks required when separately forming these TFTs can be suppressed.

According to the present invention, there is provided a display system including a plurality of pixels, a driver circuit for outputting an inputted image signal to the plurality of pixels, and a first means for storing the image signal to be outputted to the driver circuit, characterized in that:

the plurality of pixels, the driver circuit, and the first means each include a plurality of thin film transistors formed on the same substrate having an insulating surface;

the plurality of thin film transistors each have a first electrode and a second electrode which are overlapped with a channel region through an insulating film; and the first electrode and the second electrode are overlapped with each other so as to sandwich the channel region therebetween.

The display system may be also characterized in that:

the plurality of thin film transistors are classified into a thin film transistor having a first configuration in which the first electrode and the second electrode are connected with each other and a thin film transistor having a second configuration in which the first electrode is kept to be a constant potential;

the plurality of pixels each include the thin film transistor having a second configuration; and the driver circuit and the first means each include the thin film transistor having a first configuration.

According to the present invention, there is provided a display system including a plurality of pixels, a driver circuit for outputting an inputted image signal to the plurality of pixels, a first means for storing the image signal to be outputted to the driver circuit, and a second means for determining a drive frequency of the driver circuit, characterized in that:

the plurality of pixels, the driver circuit, the first means, and the second means each include a plurality of thin film transistors formed on the same substrate having an insulating surface;

the plurality of thin film transistors each have a first electrode and a second electrode which are overlapped with a channel region through an insulating film; and the first electrode and the second electrode are overlapped with each other so as to sandwich the channel region therebetween.

The display system may be also characterized in that:

the plurality of thin film transistors are classified into a thin film transistor having a first configuration in which the first electrode and the second electrode are connected with each other and a thin film transistor having a second configuration in which the first electrode is kept to be a constant potential;

the plurality of pixels each include the thin film transistor having a second configuration; and the driver circuit, the first means, and the second means each include the thin film transistor having a first configuration.

The display system may be also characterized in that a potential difference between a potential of a source region and the constant potential of the first electrode is set to be a threshold or lower when the thin film transistor having a second configuration is an n-channel type, and the potential difference between the potential of the source region and the constant potential of the first electrode is set to be a threshold or higher when the thin film transistor having a second configuration is a p-channel type.

According to the present invention, there is provided a display system including a plurality of pixels, a driver circuit for outputting an inputted image signal to the plurality of pixels, and a memory for storing the image signal to be outputted to the driver circuit, characterized in that:

the plurality of pixels, the driver circuit, and the memory each include a plurality of thin film transistors formed on the same substrate having an insulating surface;

the plurality of thin film transistors each have a first electrode and a second electrode which are overlapped with a channel region through an insulating film; and the first electrode and the second electrode are overlapped with each other so as to sandwich the channel region therebetween.

The display system may also be characterized in that:

the plurality of thin film transistors are classified into a thin film transistor having a first configuration in which the first electrode and the second electrode are connected with each other and a thin film transistor having a second configuration in which the first electrode is kept to be a constant potential;

the plurality of pixels each include the thin film transistor having a second configuration; and the driver circuit and the memory each include the thin film transistor having a first configuration.

According to the present invention, there is provided a display system including a plurality of pixels, a driver circuit for outputting an inputted image signal to the plurality of pixels, a memory for storing the image signal to be outputted to the driver circuit, and a memory controller for assigning an address of the memory and outputting a writing signal and a reading signal, characterized in that:

the plurality of pixels, the driver circuit, the memory, and the memory controller each include a plurality of thin film transistors formed on the same substrate having an insulating surface;

the plurality of thin film transistors each have a first electrode and a second electrode which are overlapped with a channel region through an insulating film; and the first electrode and the second electrode are overlapped with each other so as to sandwich the channel region therebetween.

The display system may be also characterized in that:

the plurality of thin film transistors are classified into a thin film transistor having a first configuration in which the first electrode and the second electrode are connected with each other and a thin film transistor having a second configuration in which the first electrode is kept to be a constant potential;

the plurality of pixels each include the thin film transistor having a second configuration; and the driver circuit, the memory, and the memory controller each include the thin film transistor having a first configuration.

According to the present invention, there is provided a display system including a plurality of pixels, a driver circuit for outputting an inputted image signal to the plurality of pixels, a memory for storing the image signal to be outputted to the driver circuit, a memory controller for assigning an address of the memory and outputting a writing signal and a reading signal, and a CPU for outputting a signal to the memory controller, characterized in that:

the plurality of pixels, the driver circuit, the memory, the memory controller, and the CPU each include a plurality of thin film transistors formed on the same substrate having an insulating surface;

the plurality of thin film transistors each have a first electrode and a second electrode which are overlapped with a channel region through an insulating film; and the first electrode and the second electrode are overlapped with each other so as to sandwich the channel region therebetween.

The display system may be also characterized in that:

the plurality of thin film transistors are classified into a thin film transistor having a first configuration in which the first electrode and the second electrode are connected with each other and a thin film transistor having a second configuration in which the first electrode is kept to be a constant potential;

the plurality of pixels each include the thin film transistor having a second configuration; and the driver circuit, the memory, the memory controller, and the CPU each include the thin film transistor having a first configuration.

According to the present invention, there is provided a display system including a plurality of pixels, a driver circuit for outputting an inputted image signal to the plurality of pixels, a memory for storing the image signal to be outputted to the driver circuit, a memory controller for assigning an address of the memory and outputting a writing signal and a reading signal, a display controller for outputting a clock pulse and a start pulse to the driver circuit, and a CPU for outputting a signal to the memory controller and the display controller, characterized in that:

the plurality of pixels, the driver circuit, the memory, the memory controller, the display controller, and the CPU each include a plurality of thin film transistors formed on the same substrate having an insulating surface;

the plurality of thin film transistors each have a first electrode and a second electrode which are overlapped with a channel region through an insulating film; and the first electrode and the second electrode are overlapped with each other to sandwich the channel region.

The display system may be also characterized in that:

the plurality of thin film transistors are classified into a thin film transistor having a first configuration in which the first electrode and the second electrode are connected with each other and a thin film transistor having a second configuration in which the first electrode is kept to be a constant potential;

the plurality of pixels each include the thin film transistor having a second configuration; and the driver circuit, the memory, the memory controller, the display controller, and the CPU each include the thin film transistor having a first configuration.

The display system may be also characterized in that a potential difference between a potential of a source region and the constant potential of the first electrode is set to be a threshold or lower when the thin film transistor having a second configuration is an n-channel type, and the potential difference between the potential of the source region and the constant potential of the first electrode is set to be a threshold or higher when the thin film transistor having a second configuration is a p-channel type.

According to the present invention, there is provided a display system including a plurality of pixels each including a thin film transistor, characterized in that:

the thin film transistor has a semiconductor film, a first electrode, a second electrode, and a third electrode;

the semiconductor film has a first channel region, a second channel region, and an impurity region located between the first channel region and the second channel region;

the first electrode is overlapped with the first channel region, the second channel region, and the impurity region through a first insulating film;

the second electrode is overlapped with the first channel region through a second insulating film;

the third electrode is overlapped with the second channel region through the second insulating film;

the second electrode is overlapped with the first electrode so as to sandwich the first channel region therebetween; and the third electrode is overlapped with the second electrode so as to sandwich the second channel region therebetween.

The display system may also be characterized in that the second electrode and the third electrode are electrically connected with each other in a region in which the second electrode and the third electrode are not overlapped with the semiconductor film.

The display system may also be characterized in that a constant potential is provided for the first electrode.

The display system may also be characterized in that a potential difference between a potential of a source region and the constant potential of the first electrode is set to be a threshold or lower when the thin film transistor is an n-channel type, and the potential difference between the potential of the source region and the constant potential of the first electrode is set to be a threshold or higher when the thin film transistor is a p-channel type.

There may be also provided an electronic device using the display system as described above.

BRIEF DESCRIPTION OF THE DRAWINGS

In the accompanying drawings:

FIGS. 2A to 2C show steps of manufacturing the display system of the present invention;

FIGS. 4A and 4B show steps of manufacturing the display system of the present invention;

FIGS. 5A and 5B show steps of manufacturing the display system of the present invention;

DETAILED DESCRIPTION OF THE PREFERRED EMBODIMENTS

Figure 1A:
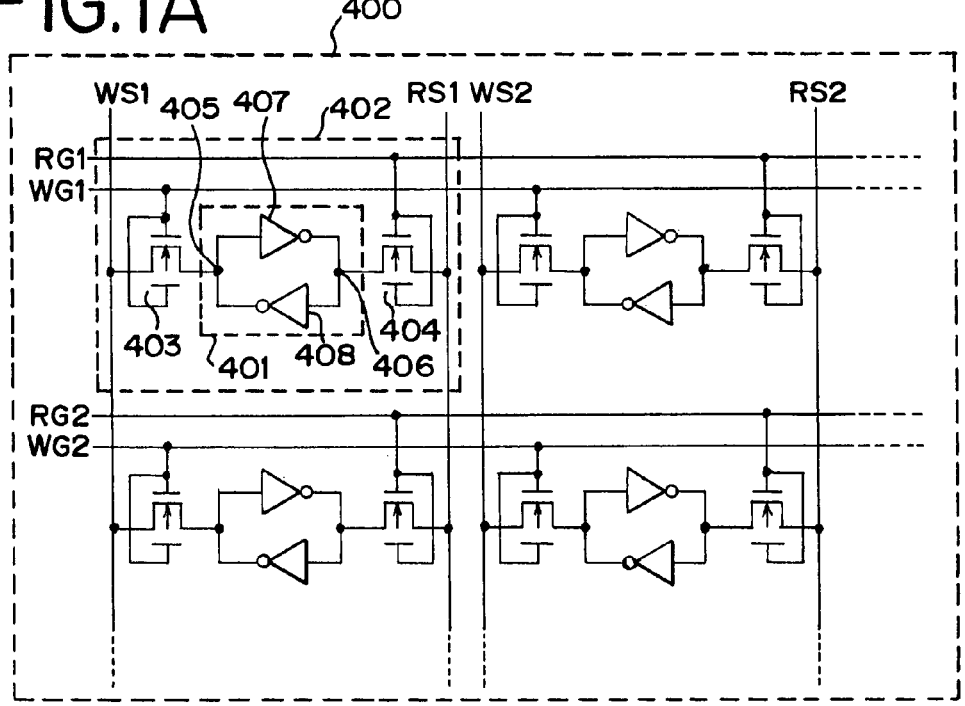
FIGS. 1A and 1B are circuit diagrams indicating a structure of a memory in a display system of the present invention.

An embodiment mode of the present invention will be described.

When a memory and control circuits are formed on the same substrate as a substrate in which a pixel portion is formed, it is necessary to use TFTs. Here, a p-TFT has an electrical characteristic superior to an a-TFT. However, there is a problem that the characteristic of p-TFT is inferior to that of an MOS transistor formed on a single crystalline silicon substrate. For example, the field effect mobility is ½ or lower than in the MOS transistor using single crystalline silicon. Also, in the case of the p-TFT, an off current becomes large due to a defect of a grain boundary.

A low concentration drain (LDD; light doped drain) structure is known as a structure for reducing an off current of a TFT. According to this structure, a region doped with an impurity at a low concentration (LDD region) is provided between a channel forming region and a source region or a drain region which is formed by adding an impurity at a high concentration. Also, a structure in which a portion of the LDD region is overlapped with a gate electrode (hereinafter called a gate-drain overlapped LDD: GOLD) is known as a structure for preventing a reduction in an on current due to a hot carrier.

The above structures are used and each TFT composing a circuit is separately formed corresponding to its operation. Thus, a display system for performing an operation with high reliability is provided. However, in this case, there is a problem in that a process of manufacturing a TFT is complicated and the number of photo masks used in production steps is increased.

Therefore, when respective circuits composing a display system are formed on the same substrate, TFTs having structures suitable for respective drive conditions of the pixel portion, driver circuits, the memory, and the control circuits are manufactured while reducing the number of photo masks used in the manufacturing processes. Such a display system will be described below.

A TFT in the display system of the present invention includes a semiconductor film, a first electrode and a first insulating film interposed between the semiconductor film and the first electrode, and further includes a second electrode and a second insulating film interposed between the semiconductor film and the second electrode. The first electrode and the second electrode are overlapped with each other so as to sandwich therebetween a channel-forming region provided in the semiconductor film.

According to the present invention, in the case of a TFT required to reduce an off current rather than to increase an on current, for example, in the case of a switching TFT formed as a switching element in the pixel portion of the display system, the first electrode is always kept to be a constant potential (common potential). Note that a potential difference between a potential of the source region and the constant potential is smaller than a threshold in the case of an n-channel TFT and is larger than the threshold in the case of a p-channel TFT.

A common voltage is applied to the first electrode. Thus, a variation in a threshold can be suppressed and an off current can be reduced, as compared with the case of using a single electrode.

Also, according to the present invention, in the case of a TFT required to increase an on current rather than to reduce an off current, for example, in the case of a TFT composing a memory portion of the display system or a TFT in buffers of the respective driver circuits and the control circuits, the same voltage is applied to the first electrode and the second electrode.

When the same voltage is applied to the first electrode and the second electrode, since a depletion layer is rapidly expanded substantially in the same manner as in the case where a semiconductor film is thinned, a subthreshold coefficient (S value) can be reduced and field effect mobility can be improved. Thus, an on current can be increased as compared with the case of the single electrode. Therefore, when the TFT having such a structure is used for driver circuits, a drive voltage can be reduced. Also, since an on current can be increased, a TFT size (particularly, a channel width) can be reduced. As a result, a packing density can be increased.

Figure 15A:
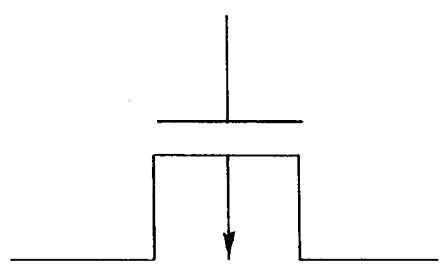
FIGS. 15A to 15C are a circuit diagram of a general TFT and circuit diagrams of TFTs of the present invention.
Figure 15B:
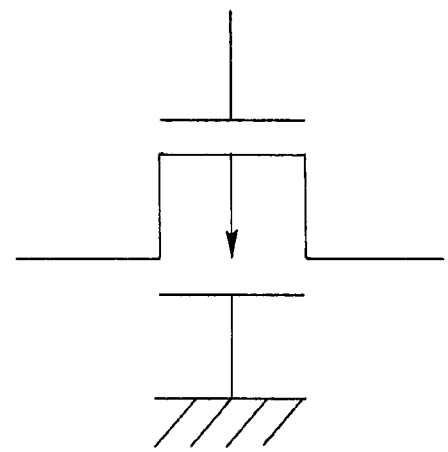
Figure 15C:
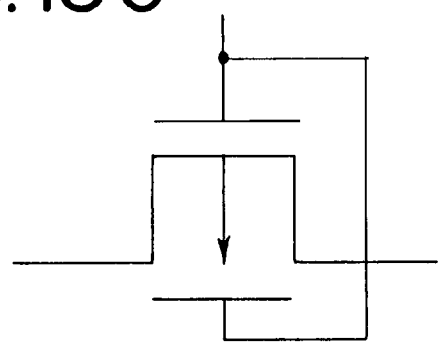

A circuit of a TFT will be described using FIGS. 15A to 15C. Here, only a p-channel TFT will be typically indicated. Note that a direction indicated by an arrow in the case of an n-channel TFT is opposite to that in the case of the p-channel TFT. FIG. 15A is a circuit diagram of a TFT having only a single electrode (gate electrode) 301. FIG. 15B is a circuit diagram of a TFT which has two electrodes (a first electrode 304*a* and a second electrode 304*b*) by which a semiconductor film is sandwiched and in which a constant potential (here, a ground potential) is provided for one of the electrodes (TFT having a first configuration). FIG. 15C is a circuit diagram of a TFT which has two electrodes (the first electrode 304*a* and the second electrode 304*b*) by which a semiconductor film is sandwiched and in which the two electrode are electrically connected with each other (TFT having a first configuration). Hereinafter, the circuits shown in FIGS. 15A to 15C are used for the description of the present invention.

According to the display system of the present invention, the pixel portion composing the display is made from a TFT having the structure shown in FIG. 15B, and the respective driver circuits, the memory, a memory controller, and a display controller are each made from a TFT having the structure shown in FIG. 15C.

An example that the TFTs having these structures are actually manufactured will be described with reference to FIGS. 16A to 16C.

Figure 16A:
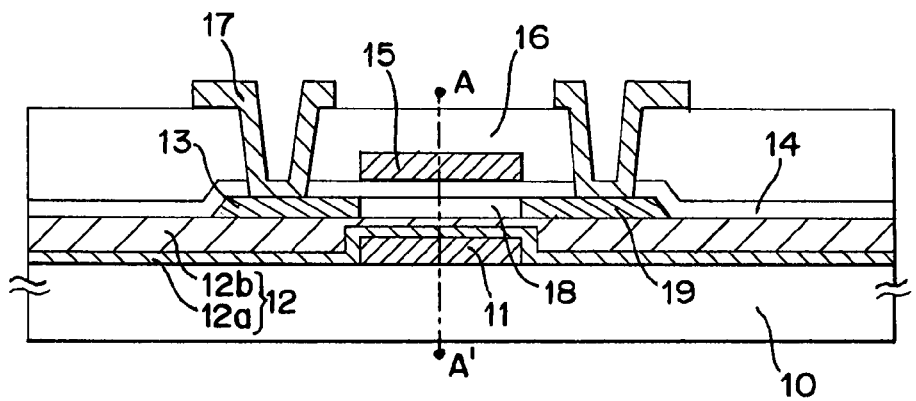
FIGS. 16A to 16C show structures of TFTs in the display system of the present invention.

In FIG. 16A, a first electrode 11 is formed on a substrate 10 having an insulating surface. It is sufficient that the first electrode 11 is at least made of a conductive material. Typically, the first electrode can be made of an alloy or a compound including one kind or plural kinds of elements selected from the group consisting of aluminum (Al), tungsten (W), molybdenum (Mo), tantalum (Ta), and titanium (Ti). A laminate of plural layers of conductive films may be used as the first electrode. The first electrode 11 has a thickness of 150 nm to 400 nm.

A first insulating film 12 is formed to cover the first electrode 11. Note that a laminate of two layers of insulating films (a first insulating film-A 12*a* and a first insulating film-B 12*b*) is used as the first insulating film 12 in this embodiment mode. In FIGS. 16A to 16C, a silicon oxynitride film or a silicon nitride film is formed as the first insulating film-A 12*a* at a thickness of 10 nm to 50 nm. Also, a silicon oxynitride film or a silicon oxide film is formed as the first insulating film-B 12*b* at a thickness of 0.5 μm to 1 μm. When a silicon oxynitride film is used, a film which is manufactured from a mixture gas of $SiH_4$, $NH_3$, and $N_2O$ by a plasma CVD method and in which nitrogen is included at 20 atomic % to 40 atomic %, is applied. When an insulating film containing nitrogen such as the silicon oxynitride film or the silicon nitride film is used, the diffusion of an impurity such as alkali metal from the substrate 10 side can be prevented.

There is the case where the surface of the first insulating film 12 is made to be uneven due to the first electrode 11 formed earlier. The uneven portion is planarized by polishing the surface. There is chemical mechanical polishing (hereinafter referred to as CMP) as a planarizing method. As an abrasive (slurry) of CMP for the first insulating film 12A, for example, a KOH additional aqueous solution into which a fumed silica grain obtained by thermally decomposing a silicon chloride gas is diffused may be used. The first insulating film is reduced at about 0.1 μm to 0.5 μm by CMP to planarize the surface. Note that the surface of the first insulating film is not necessarily polished. With respect to the planarized first insulating film, a height difference of unevenness in the surface is preferably 5 nm or less, more desirably, 1 nm or less. Since flatness is improved, the first insulating film used as a gate insulating film can be thinned and mobility of a TFT can be improved. Also, since the flatness is improved, when a TFT is manufactured, an off current can be reduced.

A semiconductor film 13 is formed on the first insulating film 12, whose surface is planarized. The semiconductor film 13 has a channel-forming region 18 and impurity regions 19 by which the channel-forming region 18 is sandwiched. A second insulating film 14 is formed on the semiconductor film 13 and a second electrode 15 is formed over the semiconductor film 13 so as to sandwich the second insulating film 14 therebetween.

The first electrode 11 and the second electrode 15 are overlapped with each other so as to sandwich the channel-forming region 18 therebetween. Thus, a TFT having a structure in which the first electrode 11 and the second electrode 15 are overlapped with each other so as to sandwich the channel-forming region 18 therebetween is called a dual gate TFT.

In addition, a third insulating film 16 and a wiring 17 are provided if necessary.

The first electrode 11 and the second electrode 15 may be electrically connected with each other or a common voltage may be applied to either of the electrodes.

Figure 16B:
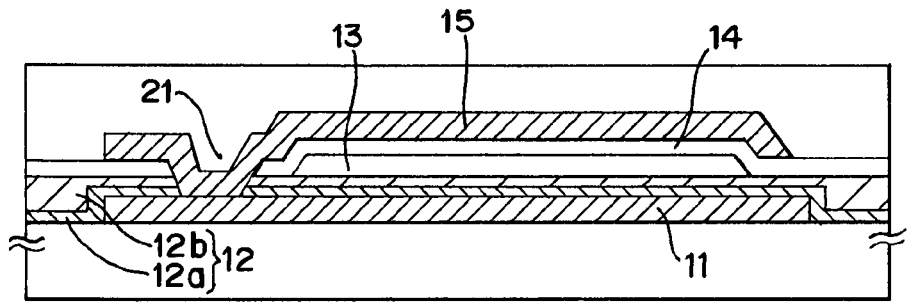

FIG. 16B is a cross sectional view along a line A–A' in FIG. 16A in the case where the first electrode 11 and the second electrode 15 are directly connected with each other. As shown in FIG. 16B, the first electrode 11 and the second electrode 15 are contacted with each other in a contact hole 21 which is located outside the semiconductor film 13 and formed in the first insulating film 12 and the second insulating film 14.

Figure 16C:
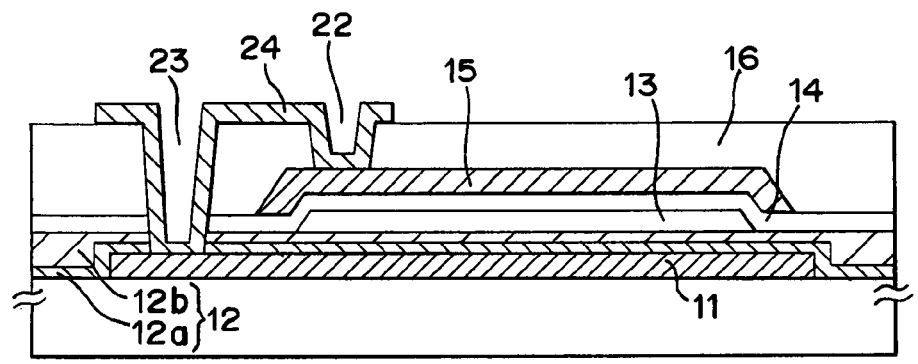
Figure 17:
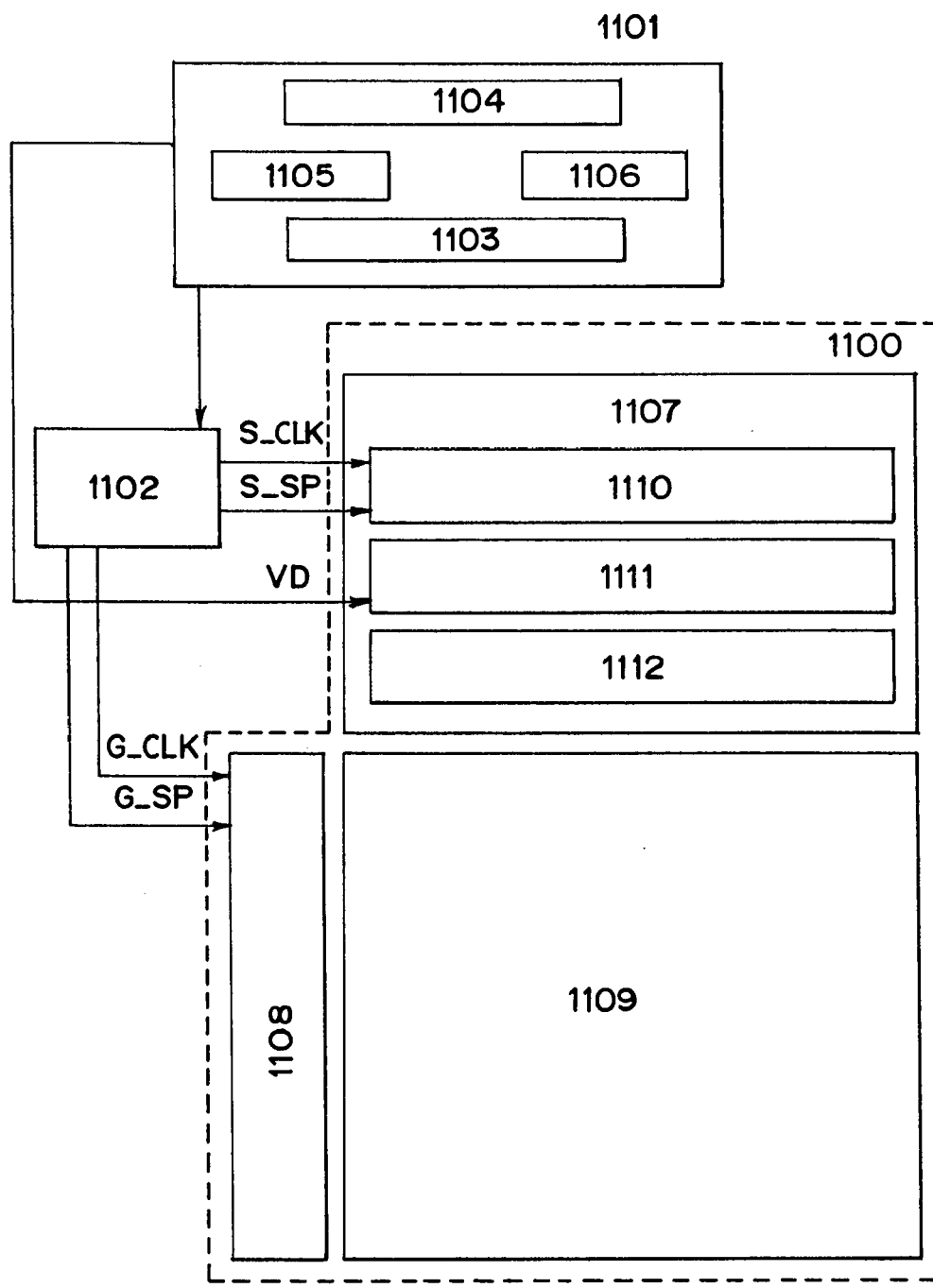
FIG. 17 is a block diagram indicating a structure of the display system.

FIG. 16C is a cross sectional view along a line A–A' in FIG. 16A in the case where the first electrode 11 and the second electrode 15 are connected with each other through a wiring 24 made from the same conductive film as the wiring 17. As shown in FIG. 16C, the first electrode 11 and the wiring 24 are contacted with each other in a contact hole 23 formed in the first insulating film 12, the second insulating film 14, and the third insulating film 16. Also, the second electrode 15 and the wiring 24 are connected with each other in a contact hole 22 formed in the third insulating film 16.

Note that electrical connection between the first electrode 11 and the second electrode 15 is not limited to the structures shown in FIGS. 16B and 16C.

A film thickness reduced by CMP is determined in consideration of the thickness of the first insulating film 12, the dielectric constant thereof, and the thickness of the second insulating film 14. A film remaining here substantially functions as a gate insulating film. Thus, when the first insulating film is made from a laminate of plural insulating films, only the uppermost layer insulating film may be polished on the first electrode 11 and polishing may be performed so as to expose the lower layer insulating film.

For example, when the first insulating film-A 12*a* and the first insulating film-B 12*b* each are made from silicon oxynitride film, the dielectric constant is 7.5. Also, when the second insulating film 14 is made from a silicon oxide film, the dielectric constant is 3.9. Thus, a difference is caused in both films. In such a case, with respect to a finished size after CMP, it is preferable that the film thickness of the first insulating film 12 is set to be 150 nm and the film thickness of the second insulating film 14 is set to be 110 nm.

When the common potential is provided for the first electrode, a variation in a threshold can be suppressed and an off current can be reduced, as compared with the case of using the single electrode.

TFTs are classified into a top gate type (planer type), a bottom gate type (inverse staggered type), and the like in accordance with an arrangement among a semiconductor film, a gate insulating film, and a gate electrode. In any case, in order to reduce a subthreshold coefficient, it is necessary to thin the semiconductor film. When a semiconductor film obtained by crystallizing an amorphous semiconductor film is applied, the crystallinity is deteriorated as the semiconductor film becomes thinner. Thus, an effect to be obtained by solely reducing the film thickness cannot be obtained. However, when the first electrode and the second electrode are electrically connected with each other and the two electrodes are located over and under the semiconductor film so as to overlap these electrodes with each other as shown in FIGS. 16A to 16C, substantially the same effect as in the case where the semiconductor film is thinned can be obtained. In other words, rapid depletion is produced with the application of a voltage, field effect mobility is increased, and a subthreshold coefficient is reduced. Therefore, an on current can be increased.

Note that, in the case where the first electrode 11 and the second electrode 15 are electrically connected with each other, as a difference between the dielectric constant of the first insulating film 12 and that of the second insulating film 14 is decreased, the field effect mobility is increased and the subthreshold coefficient is reduced. Therefore, the on current can be increased.

Also, as a difference between the film thickness when the first insulating film 12 has a uniform thickness in the region in which the first electrode 11 and the channel-forming region are overlapped with each other and the film thickness when the second insulating film 14 has a uniform thickness in the region in which the second electrode 15 and the channel-forming region are overlapped with each other is decreased, the field effect mobility is increased and the subthreshold coefficient is reduced. Therefore, the on current can be increased. When a film thickness of the first insulating film in a region in which it is overlapped with the first electrode 11 is given as d1 and a film thickness of the second insulating film in a region in which it is overlapped with the second electrode 15 is given as d2, it is desirable that $|d1-d2|/d1 \leq 0.1$ and $|d1-d2|/d2 \leq 0.1$ are satisfied. It is more preferable that $|d1-d2|/d1 \leq 0.05$ and $|d1-d2|/d2 \leq 0.05$ are satisfied.

In the most preferable case, with a state that the first electrode 11 and the second electrode 15 are not electrically connected with each other, it is made such that a threshold when a ground voltage is applied to the first electrode 11 is nearly equal to a threshold when the ground voltage is applied to the second electrode 15. After that, the first electrode 11 and the second electrode 15 are electrically connected with each other. Thus, the field effect mobility is increased and the subthreshold coefficient is reduced. Therefore, the on current can be further increased.

According to such a structure, channels (dual channels) can be formed over and under the semiconductor film and a characteristic of a TFT can be improved.

Also, various signal lines and a power source line can be formed simultaneously with the first electrode 11. When it is combined with planarization processing using CMP, there is no case where an influence on the semiconductor film and the like which are formed in the upper layers of those lines is caused. A high density of wiring can be realized by multilayer interconnection.

The above description relates to the structure of the TFT.

Figure 1B:
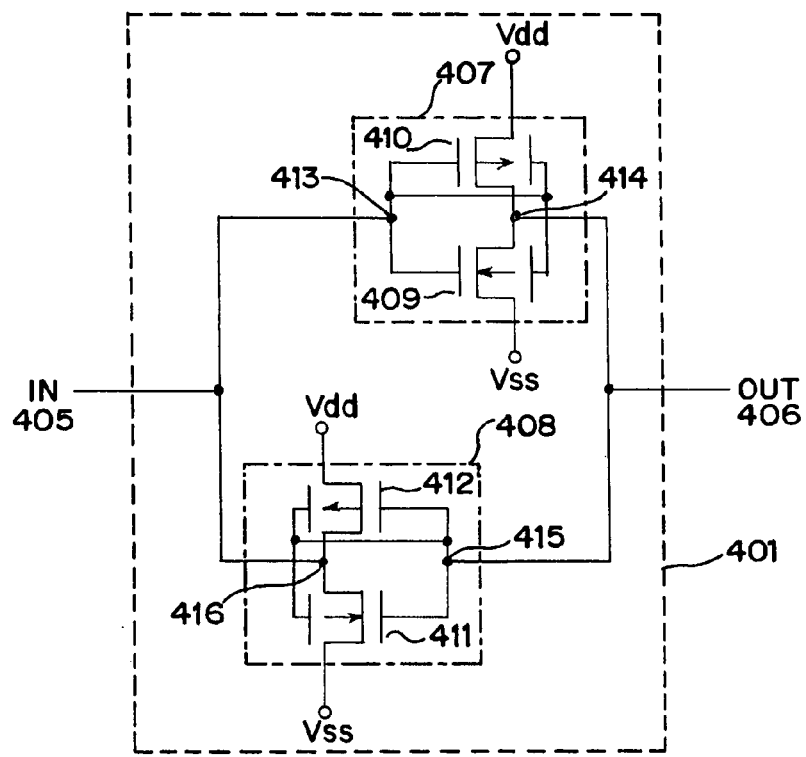

Next, an example in which a memory made from a TFT is formed on a display substrate will be described. Here, circuits as shown in FIGS. 1A and 1B are used for the description. In FIGS. 1A and 1B, an example in which the memory is made from an SRAM (static RAM) using a flip-flop circuit.

First, a structure of the memory will be described.

In FIG. 1A, a memory 400 has a structure in which respective memory elements 401 capable of storing one bit signal are located one by one in cells 402 (hereinafter referred to as memory cells) arranged in a matrix with s rows and t columns. The memory cells 402 each include a writing TFT 403 and a reading TFT 404 as switching elements.

The first electrode and the second electrode of the writing TFT 403 are connected with each other. Also, these electrodes are connected with one of writing selection lines WG1 to WGs. With respect to the source region and the drain region of the writing TFT 403, one is connected with one of writing signal lines WS1 to WSt and the other is connected with an input terminal 405 of the memory element 401. The first electrode and the second electrode of the reading TFT 404 are connected with each other. Also, these electrodes are connected with one of reading selection lines RG1 to RGs. With respect to the source region and the drain region of the reading TFT 404, one is connected with an output terminal 406 of the memory element 401 and the other is connected with one of reading signal lines RS1 to RSt.

FIG. 1B shows a detailed structure of the memory cell 401. The memory cell 401 includes a first inverter 407 and a second inverter 408. The first inverter 407 is composed of an n-channel TFT 409 and a p-channel TFT 410. The second inverter 408 is composed of an n-channel TFT 411 and a p-channel TFT 412.

In the first inverter 407, the first electrode and the second electrode of the n-channel TFT 409 are connected with each other. Also, the first electrode and the second electrode of the p-channel TFT 410 are connected with each other. The gate electrodes (the first electrode and the second electrode) of the n-channel TFT 409 and the gate electrodes (the first electrode and the second electrode) of the p-channel TFT 410 are connected with each other and the connection becomes an input terminal 413 of the first inverter 407. On the other hand, a first voltage Vdd is inputted to the source region of the p-channel TFT 410 and the drain region thereof is connected with the drain region of the n-channel TFT 409. A second voltage Vss is inputted to the source region of the n-channel TFT 409. The drain region of the n-channel TFT 409 and that of the p-channel TFT 410 each becomes an output terminal 414 of the first inverter 407.

Similarly, in the second inverter 408, the first electrode and the second electrode of the n-channel TFT 411 are connected with each other. Also, the first electrode and the second electrode of the p-channel TFT 412 are connected with each other. The gate electrodes (the first electrode and the second electrode) of the n-channel TFT 411 and the gate electrodes (the first electrode and the second electrode) of the p-channel TFT 412 are connected with each other and the connection becomes an input terminal 415 of the second inverter 408. On the other hand, a first voltage Vdd is inputted to the source region of the p-channel TFT 412 and the drain region thereof is connected with the drain region of the n-channel TFT 411. A second voltage Vss is inputted to the source region of the n-channel TFT 411. The drain region of the n-channel TFT 411 and that of the p-channel TFT 412 each becomes an output terminal 416 of the second inverter 408.

Here, it is assumed that the first voltage Vdd is higher than the second voltage Vss.

The input terminal 413 of the first inverter and the output terminal 416 of the second inverter are connected with each other and the connection becomes the input terminal 405 of the memory element. Also, the output terminal 414 of the first inverter and the input terminal 415 of the second inverter are connected with each other and the connection becomes the output terminal 406 of the memory element.

The above description relates to the structure of the memory. Next, an operation of the memory will be described.

By the memory controller, one of the writing selection lines WG1 to WGs is selected and signals are inputted from the writing signal lines WS1 to WSt. Thus, the writing TFT 403 is turned on in the memory cell 402 determined by a row and a column which are specified (referred to as (x, y) in the conventional example) and then the signal is written into the memory element 401. Similarly, one of the reading selection lines RG1 to RGs is selected and signals are inputted from the reading signal lines RS1 to RSt. Thus, the reading TFT 404 is turned on in the memory cell 402 determined by a row and a column which are specified (referred to as (x, y) in the conventional example) and then the signal is read out from the memory element 401.

The above description relates to the operation of the memory.

The above-structured memory can be formed on the display substrate by manufacturing TFTs composing the inverters using the above-mentioned method.

Note that the control circuits such as the memory controller and the display controller can be also formed as in the case of the memory. It is desirable that a TFT which has a characteristic such that an on current is large and in which the first electrode and the second electrode are connected with each other is used as the TFT composing the memory controller and the display controller to reduce a drive voltage of these circuits.

Here, the example using the SRAM having the above structure is indicated as the structure of the memory. However, the memory in the display system of the present invention is not limited to such a structure and can be embodied using a memory element having a known structure.

Note that a circuit having a known structure can be freely used for the display controller, the memory controller, the source signal line driver circuit, and the gate signal line driver circuit in the display system of the present invention.

Figure 21A:
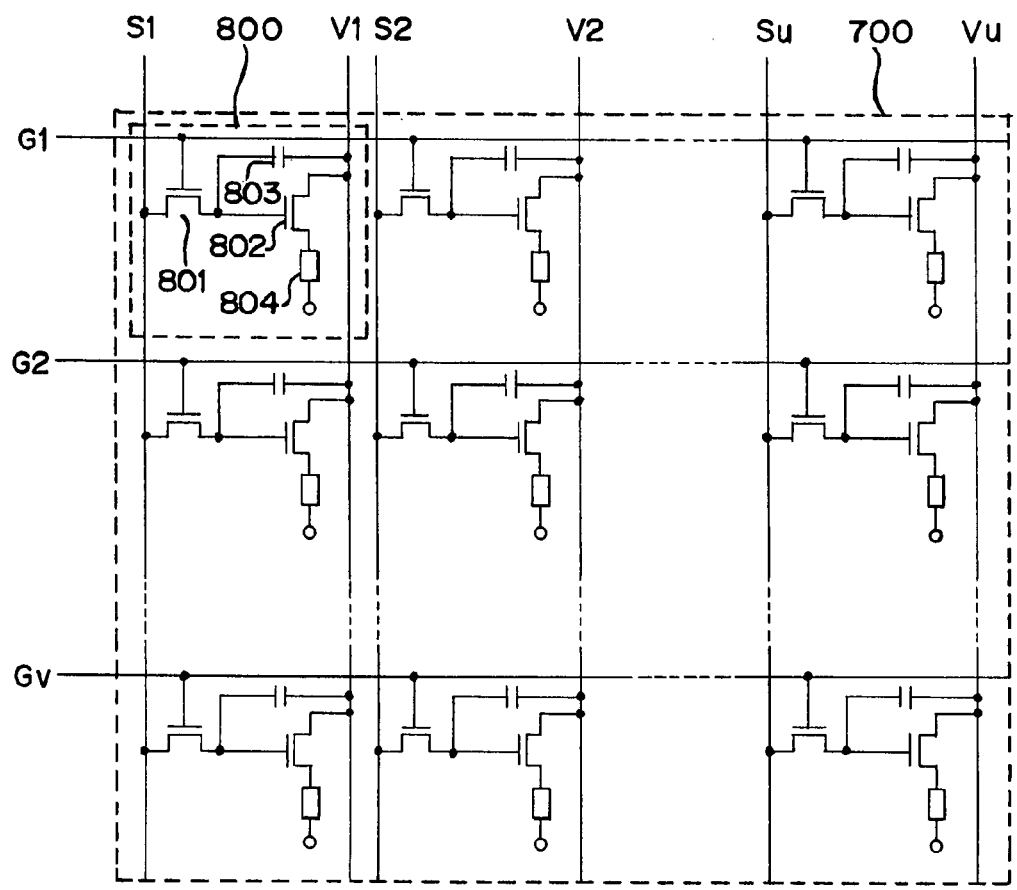
FIGS. 21A and 21B are circuit diagrams indicating a structure of a pixel portion in a conventional display system.
Figure 21B:
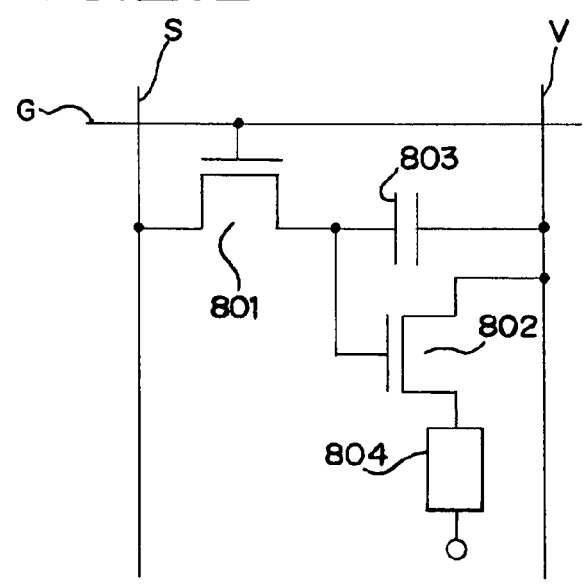

Therefore, the display system in which the pixel portion, the respective driver circuits, the memory, and the control circuits are formed on the same substrate is provided, Here, the pixel having the structure shown in FIG. 21B in the conventional example can be used for the structure of the pixel portion in the display of the display system of the present invention. In addition, a pixel having a known structure can be freely used.

Also, the present invention can be applied to not only a display system using an OLED element as a light emitting element but also a liquid crystal display system in which a liquid crystal element is located in each pixel and which displays an image by controlling the transmittance of the liquid crystal element.

Embodiments

Hereinafter, embodiments of the present invention will be described.

[Embodiment 1]

Manufacturing steps of manufacturing a displaying system according to the present invention will be described. In this embodiment, a method of simultaneously manufacturing TFTs (typically shown a switching TFT and a driving TFT in the figure) for a pixel portion, TFTs (an n-channel type TFTs and an p-channel type TFTs) for each driver circuit (a source signal line driver circuit and a gate signal line driver circuit) and TFTs (an writing TFT and an n-channel type TFT and a p-channel type TFT constituting the first inverter which are shown typically) on the same substrate will be described in detail.

In this embodiment, an example in which a common voltage is applied to the first electrodes of all the TFTs formed on the pixel portion and the first electrode is connected to the second electrode of each TFT formed on the driver circuit is shown. FIGS. 2A to 6 are cross-sectional views for explaining manufacturing steps.

In FIG. 2A, a substrate made of an arbitrary material can be used as a substrate 101 as long as the substrate has an insulating film and resists treatment temperature in later steps. Typically, a glass substrate, a quartz substrate, a ceramic substrate or the like can be used. Alternatively, a substrate such as a silicon substrate, a metal substrate or a stainless substrate having an insulating film formed on the surface thereof may be used. It is also possible to use a plastic substrate having heat resistance against the treatment temperature in this embodiment.

A first wiring 102, a second wiring 103, a third wiring 104 and first electrodes 105 to 111 are formed on the insulating surface of the substrate 101. Each of the first to third wirings and the first electrode are formed out of a conductive material made of one or a plurality of types of elements selected from among Al, W, Mo, Ti and Ta. In this embodiment, tungsten (W) is used as the material of first to third wirings and first electrode. Alternatively, a conductive material having tungsten (W) layered on TaN may be used as each of first to third wirings and first electrode.

The first electrodes 110 and 111 form a part of a common wiring.

After forming the first wiring 102, a second wiring 103, a third wiring 104 and first electrodes 105 to 111, a first insulating film 112 is formed. In this embodiment, the first insulating film 112 is formed by layering two insulating films (a first insulating film A 112a and a first insulating film B 112b). The first insulating film A 112a is formed out of a silicon oxynitride film to have a thickness of 10 to 50 nm. The first insulating film B 112b is formed out of a silicon oxide film or a silicon oxynitride film to have a thickness of 0.5 to 1 µm.

The surface of the first insulating film 112 has often irregularities resulting from the first to third wirings and the first electrode formed prior to the first insulating film 112. It is preferable to flatten these irregularities. As a planarization method, the CMP method is used. As an abrasive material (slurry) for the CMP applied to the first insulating film 112, a KOH-added aqueous solution into which foamed silica particles obtained by thermally decomposing silicon chloride gas are dispersed, for example, may be used. By the CMP, the first insulating film 112 is removed by a thickness of about 0.1 to 0.5 μm to thereby flatten the surface thereof.

As a result, as shown in FIG. 2B, the flattened first insulating film 113 is formed. A semiconductor layer is formed on the first insulating film 113. The semiconductor layer 114 is formed out of semiconductor of a crystal structure. The semiconductor layer 114 can be obtained by crystallizing an amorphous semiconductor layer formed on the first insulating film 113. After being deposited, the amorphous semiconductor layer is crystallized by a heat treatment or laser irradiation. Although the material of the amorphous semiconductor layer is not limited to a specific one, the amorphous semiconductor layer is preferably formed out of silicon, silicon germanium ($Si_xGe_{1-x}$, where 0<x<1, typically x=0.001 to 0.05) alloy or the like.

Thereafter, the semiconductor layer 114 is etched to be divided into islands to thereby form semiconductor films 115 to 121 as shown in FIG. 2C.

The first electrode 105 is overlapped with the semiconductor film 115 with the first insulating film 113 interposed therebetween. The first electrode 106 is overlapped with the semiconductor film 116 with the first insulating film 113 interposed therebetween. The first electrode 107 is overlapped with the semiconductor film 117 with the first insulating film 113 interposed therebetween. The first electrode 108 is overlapped with the semiconductor film 118 with the first insulating film 113 interposed therebetween. The first electrode 109 is overlapped with the semiconductor film 119 with the first insulating film 113. The first electrode 110 is overlapped with the semiconductor film 120 with the first insulating film 113 interposed therebetween. The first electrode 111 is overlapped with the semiconductor film 121 with the first insulating film 113 interposed therebetween.

Figure 3A:
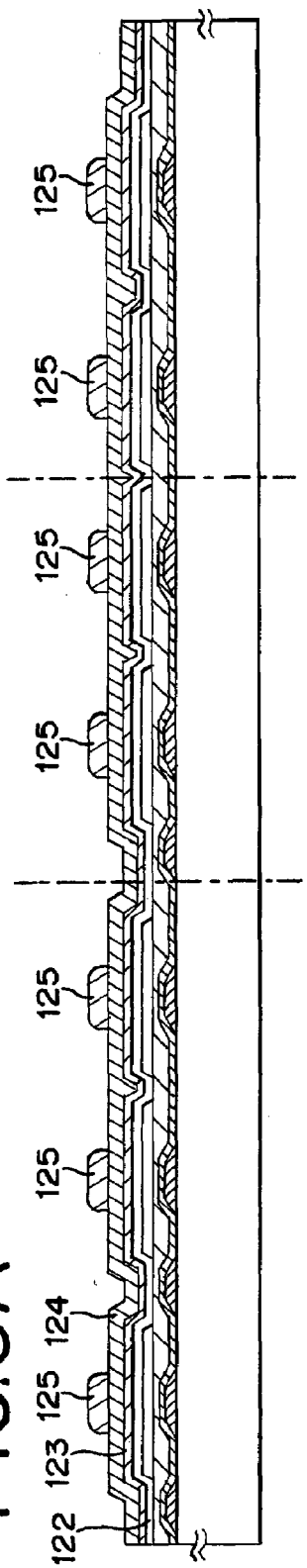
FIGS. 3A and 3B show steps of manufacturing the display system of the present invention.

Next, as shown in FIG. 3A, a second insulating film 122 which covers the semiconductor films 115 to 121, is formed. The second insulating film 122 is formed out of silicon containing insulator by a plasma CVD method or a sputtering method. The thickness of the second insulating film 122 is 40 to 150 nm.

Conductive films for forming a second electrode and a second wiring, are formed on the second insulating film 122. According to the present invention, the second electrode is formed by layering two or more conductive films. A first conductive film 123 provided on the second insulating film 122 is formed out of a nitride of high melting point metal such as molybdenum or tungsten. A second conductive film 124 provided on the first conductive film 123 is formed out of high melting point metal, low resistance metal such as copper or aluminum or polysilicon. More specifically, as the first conductive film 123, a metal nitride of one or a plurality of elements selected from among W, Mo, Ta and Ti is used. As the second conductive film 124, alloy of one or a plurality of elements selected from W, Mo, Ta, Ti, Al and Cu or n-type polycrystalline silicon is used. For example, the first conductive film 123 may be formed out of TaN and the second conductive film 124 may be formed out of tungsten (W). If the second electrode or the second wiring is formed out of three layers of conductive films, the first layer may be an Mo film, the second layer may be an Al film and the third layer may be a TiN film. Alternatively, the first layer may be a W film, the second layer may be an Al film and the third layer may be a TiN film. By providing a multi-layer wiring, the thickness of the wiring itself increases to make it possible to suppress wiring resistance.

Next, the first conductive film 123 and the second conductive film 124 are etched using a mask 125 to thereby form the second wiring and the second electrode.

Figure 3B:
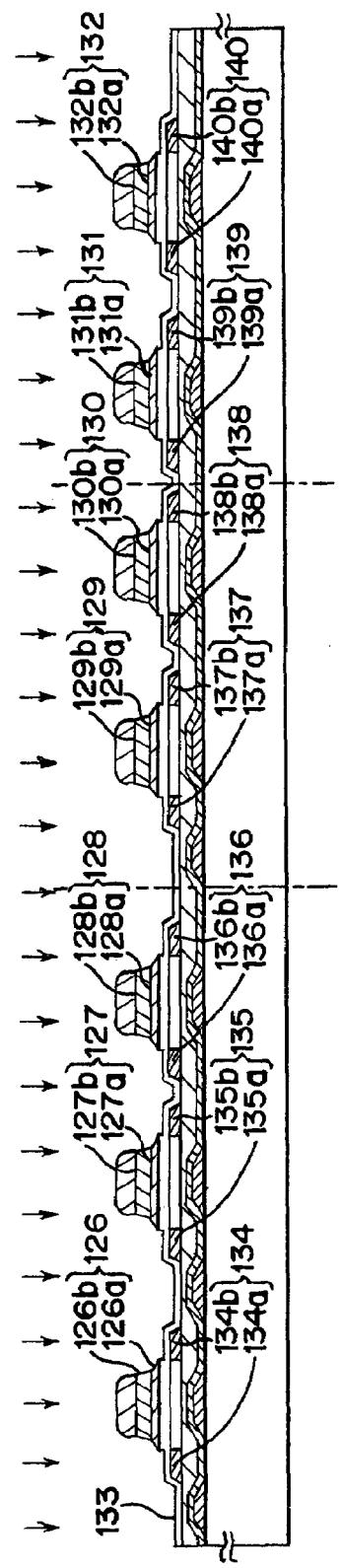

As shown in FIG. 3B, first shape type electrodes 126 to 132 each having tapered end sections (which electrodes consist of the first conductive films 126a to 132a and the second conductive films 126b to 132b, respectively) are formed by the first etching treatment. The surface of the second insulating film 133 is etched and thinned by a thickness of about 20 to 50 nm in the sections in which the second insulating film 133 is not covered with the first shape type electrodes 126 to 132.

The first doping treatment is carried out by an ion injection method or an ion doping method for injecting ions without causing mass separation. In the doping, using the first shape type electrodes 126 to 132 as masks, first concentration impurity regions 134 to 140 are formed in the semiconductor films 115 to 121, respectively. The first concentration is set at $1\times10^{20}$ to $1.5\times10^{21}/cm^3$.

Next, the second etching treatment is carried out as shown in FIG. 4A without removing a mask made of resist. In the second etching treatment, second shape type electrodes 141 to 147 (which consist of first conductive films 141a to 147a and second conductive films 141b to 147b, respectively) are formed by subjecting the second conductive film to anisotropic etching. The second shape type electrodes 141 to 147 are formed so that the widths thereof are reduced by the second etching treatment and the end sections thereof are located inward of the first concentration impurity regions 134 to 140. As shown in the next step, the length of an LDD is determined according to each reduced width. The second shape type electrodes 141 to 147 function as second electrodes, respectively.

The second shape type electrode 146 forms a part of a gate wiring. The second shape type electrode 141 is overlapped with the first electrode 105 with the semiconductor film 115 and the first insulating film 113 interposed therebetween. The second shape type electrode 142 is overlapped with the first electrode 106 with the semiconductor film 116 and the first insulating film 113 interposed therebetween. The second shape type electrode 143 is overlapped with the first electrode 107 with the semiconductor film 117 and the first insulating film 113 interposed therebetween. The second shape type electrode 144 is overlapped with the first electrode 108 with the semiconductor film 118 and the first insulating film 113 interposed therebetween. The second shape type electrode 145 is overlapped with the first electrode 109 with the semiconductor film 119 and the first insulating film 113 interposed therebetween. The second shape type electrode 146 is overlapped with the first electrode 110 with the semiconductor film 120 and the first insulating film 113 interposed therebetween. In addition, the second shape type electrode 147 is overlapped with the first electrode 111 with the semiconductor film 121 and the first insulating film 113 interposed therebetween.

In this state, the second doping treatment is carried out to thereby inject one conductive type impurities into the semiconductor films 115 to 121. Second concentration impurity regions (first impurity regions 148 (148a and 148b) to 154 (154a and 154b)) by the second doping treatment are formed to be overlapped with the first conductive films 141a to 147a which constitute the second shape type electrodes 141 to 147 in a self-aligned fashion, respectively. Since the impurities doped by the ion doping method are passed through the first conductive films 141a to 147a and then added to the semiconductor films, the number of ions which reach the semiconductor films decreases and the ion concentration of each semiconductor film, quite naturally, becomes low. The concentration is $1\times10^{17}$ to $1\times10^{19}/cm^3$. After that, the mask formed out of resist, is removed.

Next, as shown in FIG. 4B, masks 155 to 157 made of resist are formed. Using the masks 155 to 157, the third doping treatment is carried out. In this third doping treatment, third concentration impurity regions 158 (158a and 158b) to 160 (160a and 160b) of a conductive type opposite to one conductive type are formed in the semiconductor films 117, 119 and 121, respectively. The third concentration type impurity regions 158 to 160 of the conductive type opposite to one conductive type are formed in regions overlapped with the second shape type electrodes 143, 145 and 147 respectively. Impurity elements are added to the semiconductor films in a concentration range of $1.5 \times 10^{20}$ to $1.5 \times 10^{21}/cm^3$.

Because of the above steps, the impurity doped regions intended for valence electron control are formed in the respective semiconductor films. The first electrodes 105 to 111 and the second shape type electrodes 141 to 147 function as gate electrodes at positions at which the electrodes cross the semiconductor films, respectively.

Thereafter, a step of activating the impurity elements doped into the respective semiconductor films is executed. In this activation treatment, gas heating type instantaneous heat annealing is employed. The heat treatment is carried out at a temperature of 400 to 700° C. in a nitrogen atmosphere, typically at a temperature of 450 to 500° C. In addition to the heat annealing, laser annealing using the second higher harmonic wave (532 nm) of a YAG laser is available. If the impurities are activated by the irradiation of a laser beam, the laser beam is applied to the semiconductor films using the second higher harmonic wave (532 nm) of the YAG laser. Needless to say, the RTA method, which uses a lamp light source instead of laser light, is also applicable. In the RTA method, the lamp light source is radiated from the both sides or one side of a substrate to thereby heat the semiconductor films.

Thereafter, as shown in FIG. 5A, a passivation film 161 made of silicon nitride is formed to have a thickness of 50 to 100 nm by the plasma CVD method, a heat treatment is carried out at a temperature of 410° C. using a clean oven and the semiconductor films are hydrogenated with hydrogen emitted from the silicon nitride film.

Next, a third insulating film 162 made of an organic insulating material is formed on the passivation film 161. The reason for using the organic insulating material is to flatten the surface of the third insulating film 162. To obtain a more completely flattened surface, the surface of the third insulating film 162 is preferably subjected to a planarization treatment by the CMP method. If the CMP is used in combination with the planarization, a silicon oxide film formed by the plasma CVD method can be used. In addition, an SOG (Spin on Glass) film or a PSG film formed by a coating method, or the like can be used as the third insulating film 162. The passivation film 161 may be regarded as a part of the third insulating film 162.

A transparent conductive film 163 that mainly contains indium tin oxide (ITO) having a thickness of 60 to 120 nm is formed on the surface of the third insulating film 162 thus flattened. Since the surface of the transparent conductive film 163 has microscopic irregularities, it is preferable that the surface thereof is polished and flattened by the CMP method with aluminum oxide used as an abrasive material.

Thereafter, the transparent conductive film 163 is etched to thereby form a pixel electrode (third electrode) 164. Contact holes are formed in the second insulating film 122, the passivation film 161 and the third insulating film 162, and wirings 165 to 175 are formed. For example, the wirings can be formed by layering a titanium film and an aluminum film.

The wiring 165 is connected to the first wiring 102 and the second shape type electrode 141. In addition, the first wiring 102 is electrically connected to the first electrode 105. The wiring 166 is connected to the second wiring 103, the second shape electrode 142 and the impurity region 134b. The wiring 167 is connected to the impurity region 135b and the impurity region 158a. The wiring 168 is connected to the impurity region 158b. Further, not shown in the figure, the second shape electrode 142 is electrically connected to the second shape electrode 143.

The wiring 169 is connected to the third wiring 104 and the second shape type electrode 144. The wiring 170 is connected to the impurity region 137b and the impurity region 159a. The wiring 171 is connected to the impurity region 159b.

The wiring 172 is connected to the impurity region 139a and functions as a source wiring. The wiring 173 is connected to the impurity region 139b. The wiring 174 is connected to the impurity region 160a. The wiring 175 is connected to the impurity region 160b and the pixel electrode 164. The wiring 174 functions as a power supply line. Further, wirings 173 and 174 are respectively connected to two electrodes of the storage capacitor (not shown).

In the steps described so far, if the one conductive type impurity region is an n-type region and the impurity region of the conductive type opposite to one conductive type is a p-type region, an n-channel type TFT 183 whish functions as a writing TFT, an n-channel type TFT 184 which constitutes the first inverter, a memory 180 which includes a p-channel type TFT 185, an n-channel type TFT 186, a driver circuit 181 which includes a p-channel type TFT 187, an n-channel type TFT 188 which functions as switching elements, and pixel portion 182 which includes p-channel type TFT 189 functioning as a driving TFT, are formed on the same substrate.

As for the memory 180, on the writing TFT 183, a pair of gate electrodes 141 and 105 are overlapped with each other with the channel-forming region 195 interposed therebetween. The second concentration impurity region 148 functions as an LDD region and the first concentration impurity region 134 functions as a source or a drain region. On the n-channel type TFT 184, a pair of gate electrodes 142 and 106 are overlapped with each other with the channel-forming region 196 interposed therebetween. The second concentration impurity region 149 functions as an LDD region and the first concentration impurity region 135 functions as a source or a drain region. On the p-channel type TFT 185, a pair of gate electrodes 143 and 107 are overlapped with each other with the channel-forming region 197 interposed therebetween. The third concentration type impurity region 158 of the opposite conductive type to one conductive type functions as a source or drain region.

As for the driver circuit 181, on the n-channel TFT 186, a pair of gate electrodes 144 and 108 are overlapped with each other with the channel-forming region 191 interposed therebetween. The second concentration impurity region 151 functions as an LDD region, and the first concentration impurity region 137 functions as a source of a drain region. On the p-channel type TFT 187, a pair of gate electrodes 145 and 109 are overlapped with each other with the channel-forming region 192 with interposed therebetween. The third concentration type impurity region 159 of the opposite conductive type to one conductive type functions as a source or drain region.

The LDD is formed to have a length of 0.5 to 2.5 μm, preferably 1.5 μm in a channel length direction. The configuration of such an LDD is intended to prevent the deterioration of the TFT mainly due to the hot carrier effect. A shift register circuit, a buffer circuit, a level shifter circuit, a latch circuit and the like can be formed out of these n-channel type TFTs and p-channel type TFTs. The configuration of such TFT including an LDD is suited particularly for the buffer circuit requiring high driving voltage so as to prevent the deterioration of the TFT due to the hot carrier effect.

As for the pixel portion 182, a pair of gate electrodes 146 and 110 are overlapped with each other with the channel-forming region 193 put therebetween. The second concentration impurity region 153 functions as an LDD region and the first concentration impurity region 139 functions as a source or drain region. On the driving TFT 189, a pair of gate electrodes 147 and 111 are overlapped with each other with the channel-forming region 194 put therebetween. The third concentration type impurity region 160 of the opposite conductive type to one conductive type functions as a source or drain region.

In this embodiment, by always applying a constant voltage (common potential) to the common wiring, the common potential is applied to the first electrode. The potential difference of this constant voltage to the source region potential is set to be lower than a threshold voltage in case of the n-channel type TFT and higher than the threshold voltage in case of the p-channel type TFT. By applying the common potential to the first electrode, the threshold irregularity of the TFT can be suppressed compared with the TFT which includes only one electrode. It is also possible to suppress OFF current. The decrease of OFF current rather than the increase of ON current influences the TFT (switching TFT) which is formed as a switching element in the pixel portion. The above-stated configuration is, therefore, advantageous to this TFT.

Further, in this embodiment, a pair of gate electrodes are formed, which are electrically connected to each other through the semiconductor film on the TFT included in the driver circuit. Thus, the thickness of the semiconductor film is substantially halved, the formation of a depleted region is accelerated following the application of a gate voltage, so as to improve the field effect mobility and to lower the sub-threshold coefficient. As a result, by using the TFT of such a structure in the driver circuit, it is possible to decrease driving voltage. In addition, current driving capability is improved and the TFT can be thereby made smaller in size (channel width thereof can be particularly made smaller). It is thus possible to improve the integration density.

Figure 6:
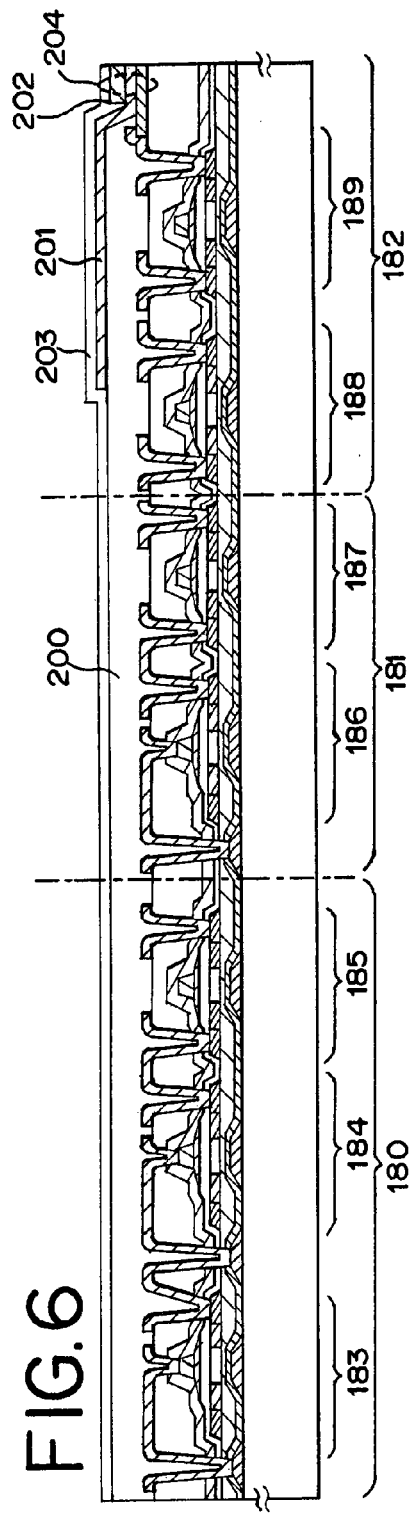
FIG. 6 shows a step of manufacturing the display system of the present invention.

FIG. 6 shows a state in which a light emitting element is formed on the third insulating film 162. A partition layer 200 which covers the TFTs 183 to 189, is formed on the third insulating film 162. Since an organic compound layer or a cathode cannot be subjected to a wet treatment (such as etching with chemicals or washing), the partition layer 200 formed out of a photosensitive resin material is provided on a fourth insulating film for the pixel electrode 164. The partition layer 200 is formed out of an organic resin material such as polyimide, polyamide, polyimide amide or acryl. This partition layer 200 is formed to cover the end sections of the pixel electrode. In addition, each of the end sections of the partition layer 200 is formed to have a taper angle of 45 to 60 degrees.

The organic light emitting element 204 consists of an anode, a cathode and an organic compound layer formed between the anode and the cathode. The organic compound layer is formed out of a combination of a hole transport material having relatively high hole mobility, an electron transport material opposite to the hole transport material, a light emitting material and the like. These materials may be formed into respective layers or mixed with one another.

The organic compound layer 201 is formed on the pixel electrode 164. Then, the opposite electrode 202 is formed.

The organic compound material is formed as thin film layers having a total thickness of about 100 nm. To this end, the surface of the ITO conductive thin film formed as the anode should have improved flatness. If flatness is low, the anode or the ITO film is short-circuited with the cathode formed on the organic compound layer at the worst. As a method for preventing short-circuit, a method of forming an insulating film having a thickness of 1 to 5 nm may be adopted. As the insulating film, a film made of polyimide, polyamide amide, polyamide, acryl or the like can be used. If an opposed electrode (fourth electrode) 202 is formed out of alkali metal such as MgAg or LiF or alkaline-earth metal, the opposed electrode 202 can function as the cathode.

The opposed electrode 202 is formed out of a material containing magnesium (Mg), lithium (Li) or calcium (Ca) having a low work function. Preferably, the opposed electrode 202 containing MgAg (a material of mixture of Ag and Mg with a mixture ratio of Mg:Ag=10:1) is used. In addition to the MgAg electrode, an MgAgAl electrode, an LiAl electrode or an LiFAl electrode is available. An insulating film 203 made of silicon nitride or a DLC film is formed on the opposed electrode 202 to have a thickness of 2 to 30 nm, preferably 5 to 10 nm. The DLC film can be formed by the plasma CVD method. Even at a temperature of not higher than 100° C., the DLC film can be formed to cover the end sections of the partition layer 200 with good covering property. The internal stress of the DLC film can be lessened by mixing argon in small quantities into the DLC film. The DLC film can be, therefore, used as a protection film. In addition, the DLC film has high gas barrier property against CO, $CO_2$, $H_2O$ and the like as well as oxygen, so that the DLC film is suited as the insulating film 203 which functions as a barrier film.

In this embodiment, the first electrode is connected to the second electrode by the wiring which is formed simultaneously with the source wiring. Alternatively, the first electrode and the second electrode may be directly connected to each other. It is noted, however, that if the first electrode is connected to the second electrode by the wiring which is formed simultaneously with the source wiring as described in this embodiment, it is unnecessary to increase the number of steps and it is possible to suppress the number of masks.

After airtightness is improved by a processing such as packaging, connectors (flexible print circuits: FPCs) are attached to connect terminals pulled out from the elements or circuits formed on the substrate to external signal terminals to complete as a product.

[Embodiment 2]

In this embodiment, the different configuration of the display system from Embodiment 1 will be described.

Figure 7:
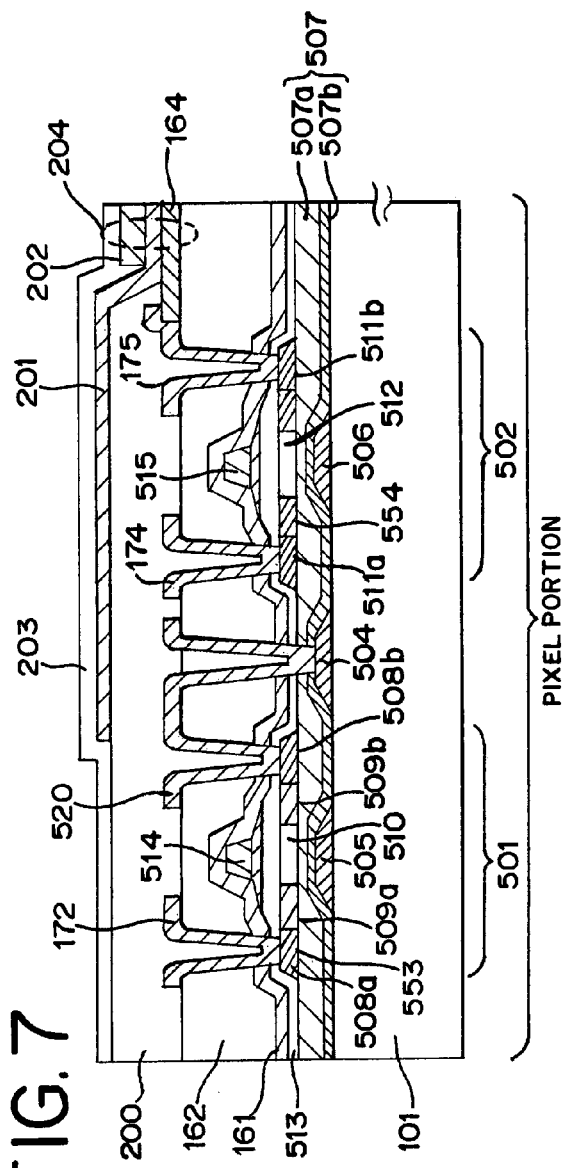
FIG. 7 is a cross sectional view indicating a structure of the display system.

FIG. 7 is a cross-sectional view of pixels of the display system in this embodiment.

Reference symbol 501 denotes an n-channel type TFT, which functions as a switching TFT, and 502 denotes a p-channel type TFT, which functions as a driving TFT. The switching TFT 501 includes a semiconductor film 553, a first insulating film 507 (507a and 507b), first electrode 505, a second insulating film 513, and second electrode 514. The semiconductor film 553 includes a first concentration impurity region 508 (508a and 508b), a second concentration impurity region 509 (509a and 509b) and channel-forming region 510.

The first electrode 505 is overlapped with the channel-forming region 510 with the fist insulating film 507 put therebetween. In addition, the second electrode 514 is overlapped with the channel-forming region 510 with the second insulating film 513 put therebetween.

The p-channel type TFT 502 includes a semiconductor film 554, a first insulating film 507, a first electrode 506, a second insulating film 513, and a second electrode 515. The semiconductor film 554 includes a third concentration impurity region 511 (511a and 511b) and a channel-forming region 512.

The first electrode 506 is overlapped with the channel-forming region 512 with the fist insulating film 507 put therebetween. The second electrode 515 is overlapped with the channel-forming region 512 with the second insulating film 513 put therebetween.

The first electrode 506 is electrically connected to the second electrode 515 through a wiring 504. Further, the wiring 504 is electrically connected to the first concentration impurity region 508b through a wiring 520.

In this embodiment, a common voltage is applied to the first electrode 505 of the switching TFT 501 (which corresponds to the n-channel type TFT in this embodiment) which is used as a switching element among the TFTs in the same pixels. By applying the common voltage to the first electrode 505, it is possible to suppress threshold irregularity and to suppress OFF current compared with the TFT which includes only one electrode.

Further, on the driving TFT 502 (which corresponds to the p-channel type TFT in this embodiment) to which high current is carried than that of the TFT used as a switching element, the first electrode is electrically connected to the second electrode. By applying the same voltage to the first and second electrodes, the spread of a depletion layer is accelerated substantially as in the case of making the thickness of the semiconductor film thin. It is, therefore, possible to lower the sub-threshold coefficient and to improve the field effect mobility. It is thus possible to increase ON current compared with the TFT which includes one electrode. As a result, by using the TFT having this structure in the driver circuit, it is possible to decrease driving voltage. In addition, since ON current can be increased, it is possible to make the TFT smaller in size (channel width thereof can be particularly made smaller). It is thus possible to improve the integration density.

This embodiment can be implemented by freely combining with Embodiment 1.

[Embodiment 3]

In this embodiment, a flip-flop circuit used for the shift register of a driver circuit will be described while taking a case of forming a TFT having a first electrode and a second electrode electrically connected to each other, as an example.

Figure 8A:
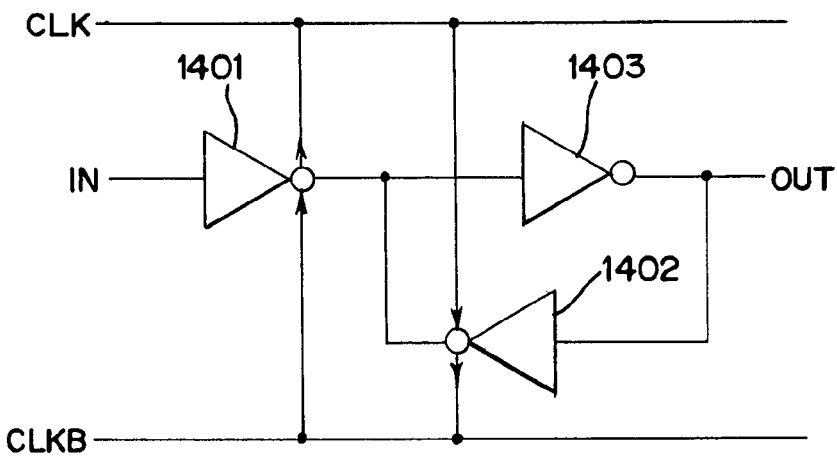
FIGS. 8A and 8B show structures of a flip-flop circuit.
Figure 8B:
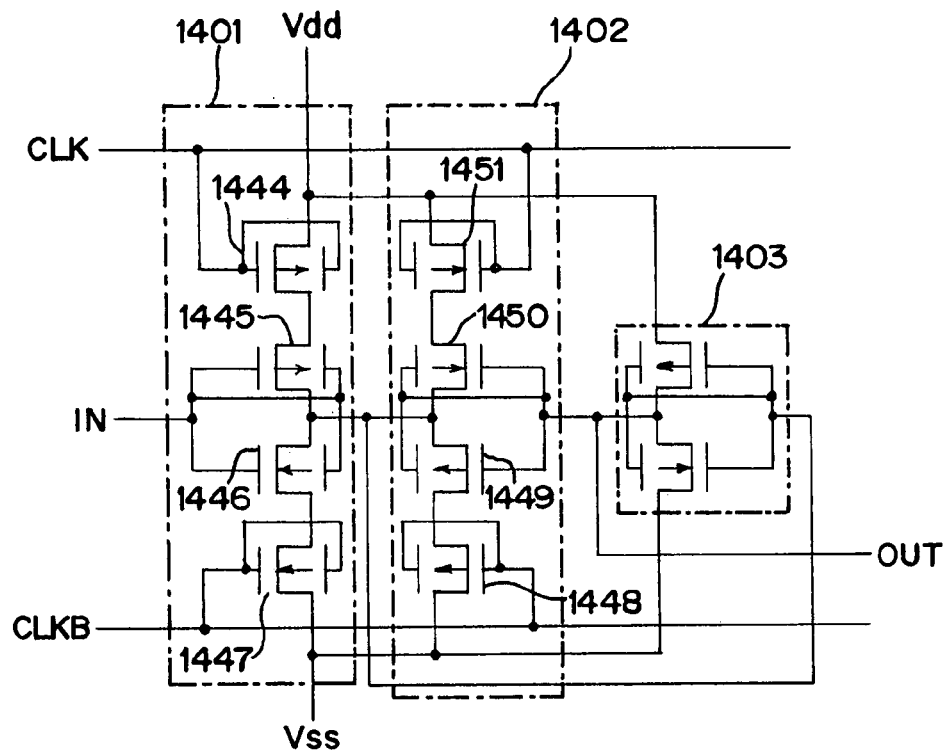

FIGS. 8A and 8B are circuit diagrams of a flip-flop circuit in this embodiment. The configuration of the flip-flop circuit included in the display system of the present invention is not limited to that shown in FIGS. 8A and 8B. In addition, the flip-flop circuit is only one example of the circuits included in the driver circuit. It does not necessarily mean that the display system of the present invention includes a flip-flop circuit.

The flip-flop circuit shown in FIG. 8A includes clocked inverters 1401 and 1402 and an inverter 1403. FIG. 8B is a circuit diagram which shows the respective circuit elements of the flip-flop circuit shown in FIG. 8A more concretely.

Each of the clocked inverters (1401 and 1402) in this embodiment includes two p-channel type TFTs and two n-channel type TFTs.

A first voltage (Vdd) is applied to the source region of the first p-channel type TFT 1444 and the drain region of the first p-channel type TFT 1444 is connected to the source of the second p-channel type TFT 1445. The drain of the second p-channel type TFT 1445 is connected to the drain region of the second n-channel type TFT 1446. The source region of the second n-channel type TFT 1446 is connected to the drain of the first n-channel type TFT 1447. A second voltage (Vss) is applied to the source region of the first n-channel type TFT 1447. The first voltage (Vdd) is higher than the second voltage (Vss).

A clock signal (CLK) is inputted into the gate electrode of the first p-channel type TFT 1444, and an inverted clock signal (CLKB) which is a signal having an inverted polarity from that of the clock signal (CLK), is inputted into the gate electrode of the first n-channel type TFT 1447.

The clocked inverter 1401 outputs an output signal (OUT) having an inverted polarity from that of a signal (IN) inputted into the gate electrodes of the second n-channel type TFT 1446 and the second p-channel type TFT 1445, synchronously with the clock signal (CLK) and the inverted clock signal (CLKB).

Similarly, the first p-channel type TFT 1448, the second p-channel TFT 1449, the first n-channel TFT 1451 and the second n-channel TFT 1450 are included in the clocked inverter 1402.

In this embodiment, all of the TFTs included in the clocked inverter shown in FIG. 8B have first and second electrodes which are electrically connected to each other, respectively.

Next, an example of comprising actually the flip-flop circuit, which is shown in FIG. 8A, is described with reference to FIG. 9.

Figure 9:
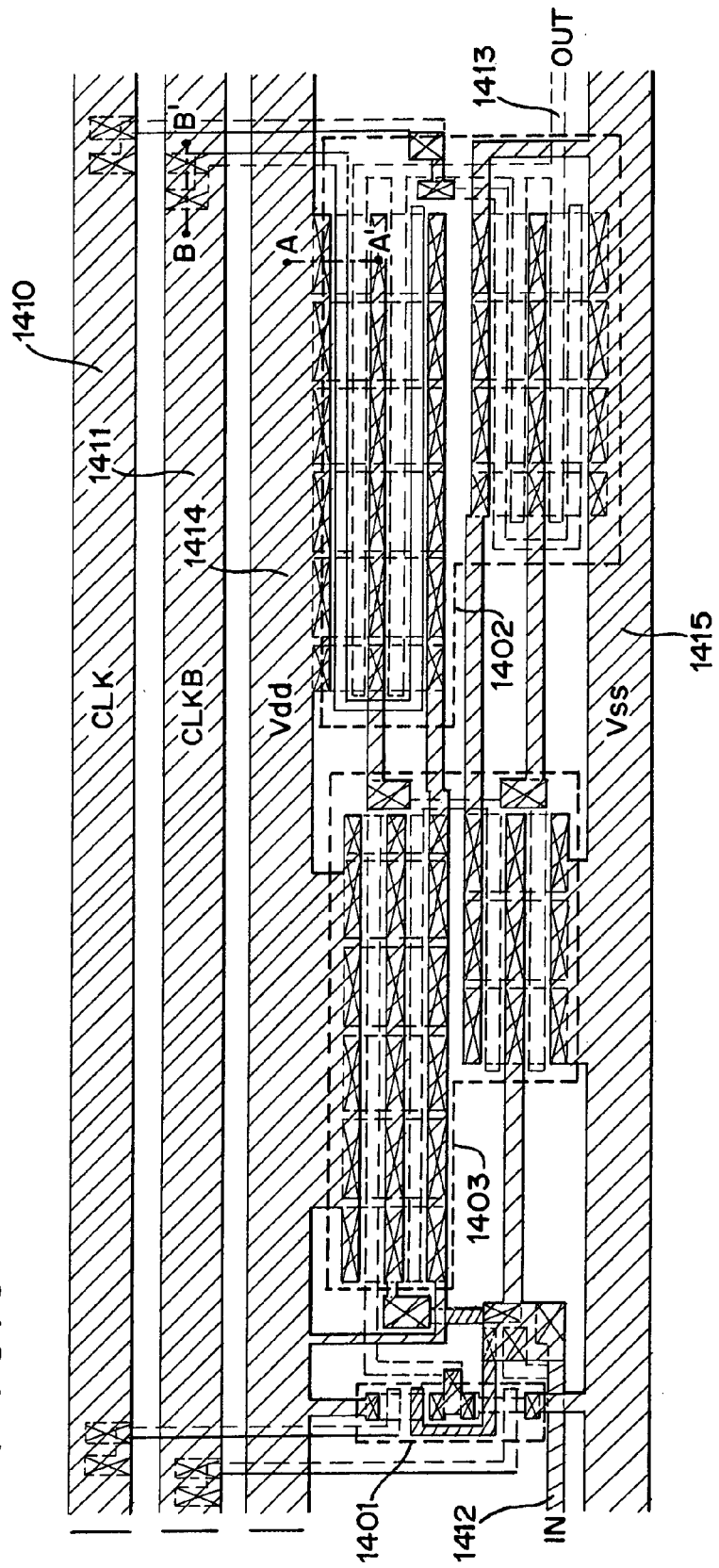
FIG. 9 is a top view indicating a structure of the flip-flop circuit.

FIG. 9 is a top view of the flip-flop circuit shown in FIG. 8A. Reference symbols 1401 and 1402 denote the clocked inverters and 1403 denotes the inverter. The clock signal (CLK), the inverted clock signal (CLKB) and the input signal (IN) are inputted into wirings 1410, 1411 and 1412, respectively. The output signal (OUT) is outputted from a wiring 1413. The first voltage (Vdd) and the second voltage (Vss) are applied to wirings 1414 and 1415, respectively.

Figure 10A:
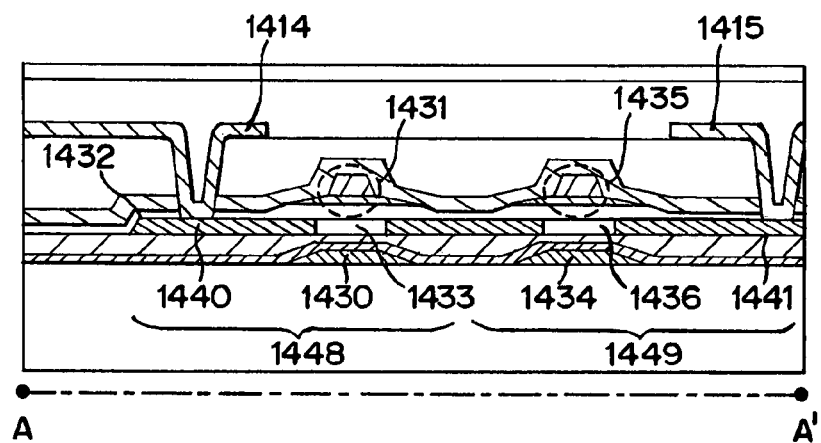
FIGS. 10A and 10B are cross sectional views indicating the flip-flop circuit.
Figure 10B:
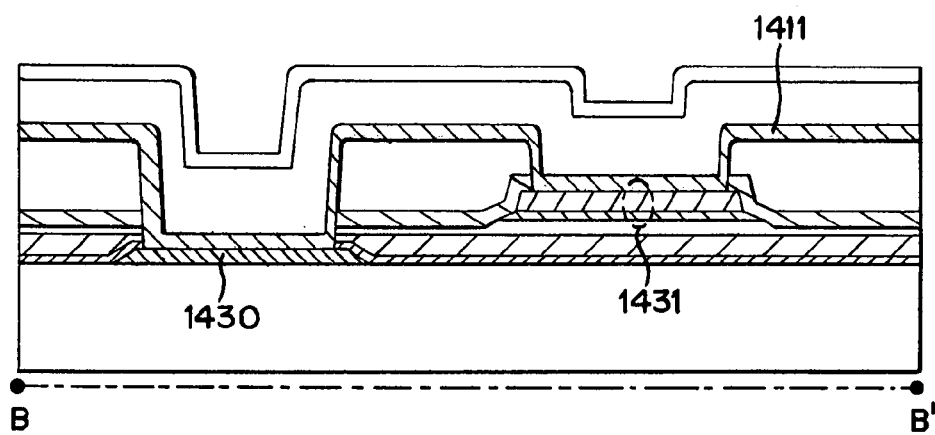

FIG. 10A is a cross-sectional view taken along line A–A' of FIG. 9 and FIG. 10B is a cross-sectional view taken along line B–B' of FIG. 9.

In FIG. 10A, a cross-sectional view of the first p-channel type TFT 1448 included in the clocked inverter 1402 and the second p-channel type TFT 1449 included in the clocked inverter 1402 is illustrated.

The first p-channel type TFT 1448 includes a first electrode 1430 and a second electrode 1431. The first electrode 1430 is overlapped with the second electrode 1431 while a channel-forming region 1433 included in a semiconductor film 1432 is put between them.

The second p-channel type TFT 1449 includes a first electrode 1434 and a second electrode 1435. The first electrode 1434 is overlapped with the second electrode 1435 while a channel-forming region 1436 included in the semiconductor film 1432 is put therebetween.

A source region 1440 included in the semiconductor film 1432 of the first p-channel type TFT 1448 is connected to the wiring 1414. In addition, a drain region 1441 included in the semiconductor film 1432 of the second p-channel type TFT 1449 is connected to the wiring 1415.

As for the first p-channel TFT 1448, the first electrode 1430 and the second electrode 1431 are connected to the wiring 1411 into which the inverted clock signal (CLKB) is inputted. (see FIG. 10B) The first electrode 1430 and the second electrode 1431 are, therefore, electrically connected to each other. In addition, although not shown in the figure, the first electrode 1434 is electrically connected to the second electrode 1435.

In this embodiment, the first electrode is electrically connected to the second electrode by a wiring. Alternatively, the first electrode and the second electrode may be directly connected to each other. It is noted, however, that if the first electrode is electrically connected to the second electrode by the wiring, it is possible to form the wiring simultaneously with other wirings and it is, therefore, possible to suppress the number of masks.

The wirings 1410, 1411, 1414 and 1415 can be formed by layering a plurality of conductive films. By providing a multi-layer wiring and thereby shortening the length of the wiring, it is possible to decrease wiring resistance and to further improve the integration of the driver circuit.

In addition, as shown in this embodiment, it is not necessary to connect the first and second electrodes of the TFT for each TFT. If the first electrodes or the second electrodes of a plurality of TFTs included in the circuit are connected to one another, it suffices that the first electrode is connected to the second electrode in one of the plurality of TFTs.

This embodiment can be carried out in free combination with Embodiment 1 or 2.

[Embodiment 4]

In this embodiment, a case of manufacturing a semiconductor film will be described.

Figure 11A:
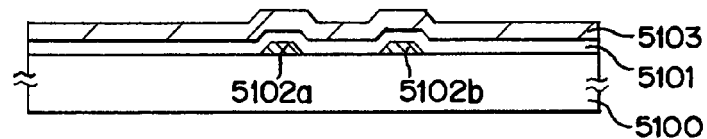
FIGS. 11A to 11G show steps of crystallizing a semiconductor layer in the display system of the present invention.

In FIG. 11A, reference symbol 5100 denotes a substrate which includes an insulating surface. In FIG. 11A, a glass substrate, a quartz substrate, a ceramic substrate or the like can be used as the substrate 5100. Alternatively, a substrate such as a silicon substrate, a metal substrate or a stainless substrate having an insulating film formed on the surface thereof may be used. It is also possible to use a plastic substrate having heat resistance against the treatment temperature in the steps of this embodiment.

As shown in FIG. 11A, first electrode 5102a and 5102b are formed on the substrate 5100. The first electrodes 5102a and 5102b may be formed out of a conductive substance. Typically, the first electrodes 5102a and 5102b can be formed out of alloy or a compound consisting of one or a plurality of elements selected from among aluminum (Al), tungsten (W), molybdenum (Mo), tantalum (Ta) and titanium (Ti). Alternatively, layered conductive films may be used as the first electrodes.

A first insulating film 5101 is formed on the insulating surface of the substrate 5100 to cover the first electrodes 5102a and 5102b. The first insulating film 5101 is formed out of a silicon oxide film, a silicon nitride film, a silicon oxynitride film ($SiO_xN_y$) or the like. As a typical example, a film having a two-layer structure in which a first silicon oxynitride film formed using $SiH_4$, $NH_3$ and $N_2O$ as reaction gas and having a thickness of 50 to 100 nm and a second silicon oxynitride film formed using $SiH_4$ and $N_2O$ as reaction gas and having a thickness of 100 to 150 nm are layered, is used as the first insulating film 5101. It is also preferable that a silicon nitride film (SiN film) having a thickness of not less than 10 nm or the second silicon oxynitride film ($SiN_xO_y$ film, where X>>Y) is used as one layer of the first insulating film. During gettering, nickel tends to move toward a region having a high oxygen concentration. It is, therefore, quite effective to use the silicon nitride film as the first insulating film which contacts with the semiconductor film. Alternatively, a film having a three-layer structure in which a first silicon oxynitride film, a second silicon oxynitride film and a silicon nitride film are sequentially layered may be used as the first insulating film 5101.

Next, a first semiconductor layer 5103 having an amorphous structure is formed on the first insulating film 5101. A semiconductor material mainly containing silicon is used to form the first semiconductor layer 5103. Typically, an amorphous silicon film or an amorphous silicon germanium film is used as the first semiconductor layer 5103. The first semiconductor layer 5103 is formed to have a thickness of 10 to 100 nm by the plasma CVD method, a low pressure CVD method or a sputtering method. It is preferable that the concentration of impurities such as oxygen and nitrogen contained in the film of the first semiconductor layer 5103 having an amorphous structure, is decreased to not higher than $5 \times 10^{18}/cm^3$ (atom concentration measured by secondary ion mass spectroscopy (SIMS)). These impurities prevent later crystallization and, even after the crystallization, increase the density of a trapping center or recombination center. For these reasons, it is preferable to use not only high impurity material gas but also use an extreme high vacuum CVD system which includes a mirror treatment (field polishing) reaction chamber or an oil-free evacuation system.

Figure 11B:
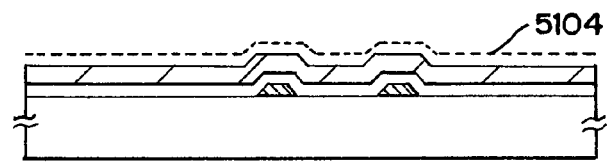

Next, the first semiconductor layer 5103 having an amorphous structure is crystallized. The crystallization technique described in Japanese Patent Application Publication No. 8-78329 is employed in this embodiment. The technique described therein is for selectively adding a metal element which accelerates crystallizing an amorphous silicon film, carrying out a heat treatment and thereby forming a semiconductor layer having a crystal structure spreading from the metal element added regions. A nickel acetate solution which contains a metal element (nickel in this embodiment) of 1 to 100 ppm in weight terms, which has a catalytic action for accelerating crystallization, is coated on the surface of the first semiconductor layer 5103 having an amorphous structure by a spinner to thereby form a nickel containing layer 5104 (FIG. 11B). Instead of the coating means, a means for forming a very thin film by sputtering, deposition or plasma treatment may be used to form the nickel containing layer 5104. While an example of coating the nickel acetate solution on the entire surface of the first semiconductor layer 5103 is shown in this embodiment, it is also possible to form a mask and to selectively form a nickel containing layer using the mask.

Figure 11C:
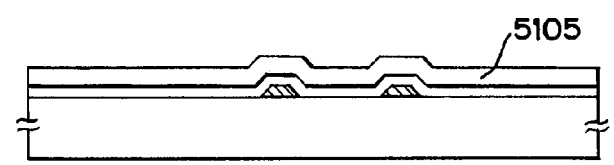

Next, a heat treatment is carried out for crystallization. In this case, silicide is formed in the sections of the semiconductor layer contacted by the metal element which accelerates the crystallization of the semiconductor and crystallization progresses while centering around the silicide. As a result, the first semiconductor layer 5105 having an amorphous structure shown in FIG. 11C is formed. It is preferable that the concentration of oxygen contained in the first semiconductor layer 5105 thus crystallized is set at not higher than $5 \times 10^{18}/cm^3$. In this embodiment, after a heat treatment (at 450° C. for 1 hour) for dehydrogenation, the heat treatment (at 550 to 650° C. for 4 to 24 hours) for crystallization is carried out. If crystallization is conducted by the irradiation of strong light, one of infrared light, visible light and ultraviolet light or a combination thereof can be used. Typically, light radiated from a halogen lamp, a metal halide lamp, a xenon arc lamp, a carbon arc lamp, a high pressure sodium lamp or a high pressure mercury lamp is used. The lamp light source is turned on for 1 to 60 seconds, preferably 30 to 60 seconds one to ten times so as to instantaneously heat the semiconductor layer up to about 600 to 1000° C. If necessary, a heat treatment for discharging hydrogen contained in the first semiconductor layer 5105 of the amorphous structure before the strong light is applied to the first semiconductor layer 5105 may be carried out. Alternatively, the heat treatment and the strong light irradiation may be conducted simultaneously. In light of productivity, it is preferable to crystallize the semiconductor by the irradiation of strong light.

The metal element (nickel in this embodiment) remains in the first semiconductor layer 5105 thus obtained. The metal element remains at a mean concentration higher than $1 \times 10^{19}/cm^3$ even if they are not uniformly distributed in the film. Although it is possible to form various semiconductor elements including TFTs even in such a state, the element is removed by the following method in this embodiment.

Figure 11D:
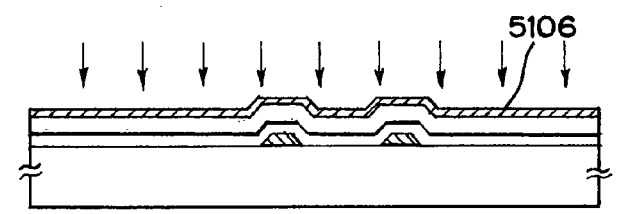

To enhance a crystallization rate (the rate of crystal components in the entire product of the film) and to repair defects left in crystal grains, a laser beam (first laser beam) is applied to the first semiconductor layer 5105 having an amorphous structure in the atmosphere or in an oxygen atmosphere. If the laser beam (first laser beam) is applied to the first semiconductor layer 5105, irregularities are formed on the surface thereof and a thin oxide film 5016 is formed (FIG. 11D). This laser beam (first laser beam) may be an excimer laser beam having a wavelength of not less than 400 nm or the second and third higher harmonic waves of the YAG laser. Alternatively, a beam emitted from an ultraviolet lamp may be used in place of the excimer laser beam.

Figure 11E:
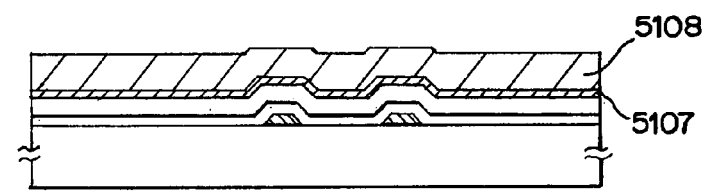

Furthermore, an oxide film (referred to as "chemical oxide") is formed using an ozone containing aqueous solution (typically ozone water) to thereby form a barrier layer 5107 which consists of the oxide film and has a total thickness of 1 to 10 nm. A second semiconductor layer 5108 containing a rare gas element is formed on this barrier layer 5107 (FIG. 11E). In this embodiment, the oxide film 5106 formed as a result of the application of the laser beam is regarded as a part of the barrier layer. This barrier layer 5107 functions as an etching stopper when only the second semiconductor layer 5108 is selectively removed in a later step. Even if an aqueous solution in which sulfuric acid, hydrochloric acid, nitric acid or the like is mixed with oxygenated water, in place of the ozone containing aqueous solution is used, the chemical oxide can be formed. Alternatively, as another method of forming the barrier layer 5107, ultraviolet rays may be irradiated to the first semiconductor layer 5105 in an oxygen atmosphere to thereby generate ozone and to oxidize the surface of the semiconductor layer 5105 having a crystallization structure. As yet another formation method, the barrier layer 5107 may be formed by depositing an oxide film having a thickness of about 1 to 10 nm by the plasma CVD method, the sputtering method, the deposition method or the like.

Further, as still another method, a thin oxide film may be formed as the barrier layer 5107 by heating the first semiconductor layer 5105 up to about 200 to 350° C. in a clean oven. Although the barrier layer 5107 is not limited to any specific layer as long as the barrier layer 5107 is formed by any one of the above-stated methods or a combination thereof, it is necessary that the barrier layer 5107 has a sufficient film property or thickness to enable nickel contained in the first semiconductor layer 5105 to move to the second semiconductor layer 5108 in a later gettering step.

In this embodiment, the second semiconductor layer 5108 containing a rare gas element is formed by the sputtering method and a gettering site is formed (FIG. 11E). It is preferable that sputter conditions are appropriately adjusted so as not to add the rare gas element to the first semiconductor layer 5105. As the rare gas element, one or a plurality of elements selected from among helium (He), neon (Ne), argon (Ar), krypton (Kr) and xenon (Xe) are employed. Among them, argon (Ar) which is inexpensive gas, is preferable. In this embodiment, a target which consists of silicon is used in a rare gas element containing atmosphere to form the second semiconductor layer 5108. There are two meanings to contain rare gas element ions as inert gas ions in the film. One is to form dangling bonds so as to distort the semiconductor layer. The other is to generate distortions between the lattices of the semiconductor layer. The distortions between the lattices of the semiconductor layer are generated conspicuously when an element, such as argon (Ar), krypton (Kr) or xenon (Xe), larger than silicon in atomic diameter is used. Further, by containing the rare gas element in the film, not only lattice distortions but also unpaired bonds are formed, contributing to the gettering action.

Furthermore, if the second semiconductor layer 5108 is formed using a target containing phosphorus which is a one conductive type impurity element, not only gettering by the rare gas element but also gettering using the Coulomb force of phosphorus can be conducted.

In addition, since nickel tends to move to a region having a high oxygen concentration during the gettering, it is preferable that the concentration of oxygen contained in the second semiconductor layer 5108 is set higher than that of oxygen contained in the first semiconductor layer 5105, e.g., not lower than $5 \times 10^{18}/cm^3$.

Figure 11F:
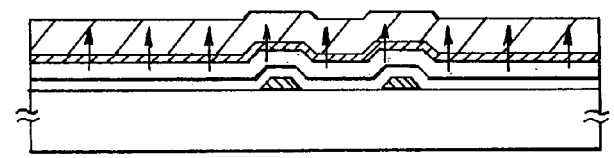

Thereafter, a heat treatment is carried out to conduct gettering for decreasing the concentration of the metal element (nickel) in the first semiconductor layer 5105 or removing the metal element (nickel) (FIG. 11F). As the heat treatment for the gettering, a treatment for applying strong light or an ordinary heat treatment may be conducted. As a result of this gettering, the metal element moves in an arrow direction shown in FIG. 11F (i.e., a direction from the substrate side to the surface of the second semiconductor layer 5108), thereby removing the metal element contained in the first semiconductor layer 5105 or decreasing the concentration of the metal element. The moving distance of the metal element during the gettering may be at least the same as the thickness of the first semiconductor layer 5105. With such a distance, it is possible to complete the gettering in relatively short time. In this embodiment, nickel is entirely moved to the second semiconductor layer 5108 so as not to segregate nickel in the first semiconductor layer 5105. As a result, nickel is hardly contained in the first semiconductor layer 5105. Namely, gettering is sufficiently conducted so that the nickel concentration of the film becomes not higher than $1 \times 10^{18}/cm^3$ or preferably not higher than $1 \times 10^{17}/cm^3$.

Furthermore, depending on the conditions of this gettering heat treatment, it is possible to enhance the crystallization rate of the first semiconductor layer 5105 and to repair the defects left in crystal grains, i.e., to improve crystallinity simultaneously with the gettering.

In this specification, gettering means that a metal element in a gettering target region (corresponding to the first semiconductor layer 5105 in this embodiment) is discharged by heat energy and diffused, and thereby moved to a gettering site. Accordingly, the gettering depends on treatment temperature, which follows that the gettering can be conducted in shorter time as the treatment temperature is higher.

In addition, if a strong light irradiation treatment is used as the heat treatment for this gettering, a lamp light source for heating is turned on for 1 to 60 seconds, preferably 30 to 60 seconds repeatedly one to ten times, preferably two to six times. The luminous intensity of the lamp light source may be arbitrarily set. However, it is necessary to set the luminous intensity thereof so that the semiconductor layer is instantaneously heated up to about 600 to 1000° C., preferably about 700 to 750° C.

Additionally, if the gettering is conducted by a heat treatment, the heat treatment may be carried out at a temperature of 450 to 800° C. for 1 to 24 hours, e.g., at 550° C. for 14 hours in a nitrogen atmosphere. Alternatively, strong light may be irradiated to the semiconductor layer in addition to the heat treatment.

Next, using the barrier layer 5107 as an etching stopper, only the second semiconductor layer denoted by the reference symbol 5106 is removed and then the barrier layer 5107 consisting of the oxide film is removed. As a method of selectively etching only the second semiconductor layer, dry etching using $ClF_3$ without using plasma or wet etching using an alkali solution such as an aqueous solution containing hydrazine or tetraethyl ammonium hydroxide (expressed by a chemical formula $(CH_3)_4NOH$) can be conducted. In addition, if the nickel concentration of the surface of the barrier layer is measured by TXRF after removing the second semiconductor layer, the nickel concentration is detected to be high. It is, therefore, preferable to remove the barrier layer using fluorine containing etchant.

Figure 11G:
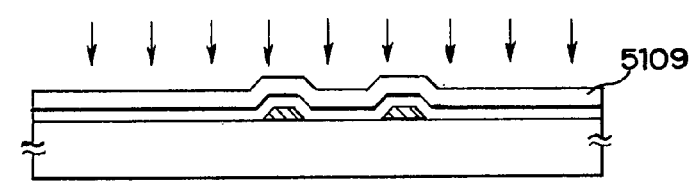

Next, a laser beam (second laser beam) is applied to the first semiconductor layer 5105 having a crystal structure either in a nitrogen atmosphere or in vacuum. If the laser beam (second laser beam) is irradiated, the difference in level (P-V value: Peak to Valley value; difference in height between maximum and minimum) among the irregularities formed by the irradiation of the first laser beam is decreased, i.e., the surface is flattened (FIG. 11G). The P-V value of the irregularities may be observed with an AFM (atomic force microscope). Specifically, the P-V value of the irregularities formed by the irradiation of the first laser beam of about 10 nm to 30 nm can be decreased to not lower than 5 nm by the irradiation of the second laser beam. Depending on the conditions, the P-V value can be decreased to not lower than 1.5 nm. As this laser beam (second laser beam), an excimer laser beam having a wavelength of not more than 400 nm or the second and third higher harmonic waves of the YAG laser can be employed. Alternatively, a light beam emitted from a ultraviolet lamp may be used in place of the excimer laser beam.

The energy density of the second laser beam is set higher than that of the first laser beam, preferably higher than that of the first laser beam by 30 to 60 mJ/cm². It is noted, however, if the energy density of the second laser beam is higher than that of the first laser beam by 90 mJ/cm² or more, surface roughness tends to increase and crystallinity tends to deteriorates or crystal grains tend to be transformed to crystallites, thereby deteriorating the characteristics of the first semiconductor layer.

Although the energy density of the second laser beam is higher than that of the first laser beam, the crystallinity of the semiconductor layer hardly changes before and after the irradiation. In addition, crystal states such as grain diameters hardly change. In other words, it is considered that the irradiation of the second laser beam is intended only to flatten the surface of the semiconductor layer.

The flattening of the semiconductor layer having a crystal structure by the irradiation of the second laser beam possesses high merit. For example, by improving the flatness of the semiconductor layer, it is possible to make the second insulating film to be formed in a later step as a gate insulating film thinner and to thereby improve the mobility of the TFT. In addition, by improving the flatness, it is possible to decrease OFF current in the manufacturing of the TFT.

Furthermore, the irradiation of the second laser beam has an advantage in that if the rare gas element is inadvertently added to the first semiconductor layer when the gettering site is formed, the rare gas element in the semiconductor layer having a crystal structure can be removed or decreased.

Next, using a well-known patterning technique, the first semiconductor layer 5109 thus flattened is patterned to thereby form a semiconductor film having a desired shape.

In this manner, the semiconductor film can be formed.

This embodiment can be carried out in free combination with Embodiments 1 to 3.

[Embodiment 5]

In this embodiment, one example of a TFT included in the display device according to the present invention will be described with reference to FIG. 14.

Figure 14:
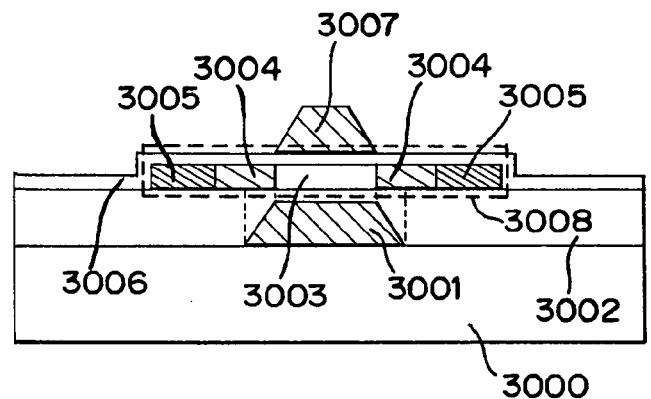
FIG. 14 shows a structure of a TFT in the display system of the present invention.

FIG. 14 is a cross-sectional view of a TFT in this embodiment. On an insulating surface substrate 3000, the thin film transistor shown in FIG. 14 includes a first electrode 3001, a first insulating film 3002 which contacts with the first electrode 3001, a semiconductor film 3008 which contacts with the first insulating film 3002, a second insulating film 3006 which contacts with the semiconductor film 3008, and a second electrode 3007 which contacts with the second insulating film 3006. The semiconductor film 3008 includes a channel-forming region 3003, a first impurity region 3004 which contacts with the channel-forming region 3003, and a second impurity region 3005 which contacts with the first impurity region 3004.

One conductive type impurities doped into the first impurity region 3004 are lower in concentration than one conductive type impurities doped into the second impurity region 3005.

The first electrode 3001 is overlapped with the second electrode 3007 with the channel-forming region 3003 put therebetween. In addition, the same voltage is applied to the first electrode 3001 and the second electrode 3007.

On the TFT in this embodiment, the tapered sections of the first electrode 3001 are overlapped with the first impurity region 3004. The first electrode 3001 is almost flat in the section in which the first electrode 3001 is overlapped with the channel-forming region 3003. According to the above-stated configuration, the first electrode 3001 and the channel-forming region 3003 are overlapped with each other with almost a certain distance kept therebetween. In this state, if the thickness of the first insulating film in the section in which the first electrode 3001 is overlapped with the channel-forming region 3003 is made almost equal to that of the second insulating film in the section in which the second electrode 3007 is overlapped with the channel-forming region 3003, it is possible to further lower the S value.

Above-mentioned is one example of TFT included in the display system of the present invention.

This embodiment can be carried out in free combination with Embodiments 1 to 4.

[Embodiment 6]

In this embodiment, an example of a structure of a source signal line driver circuit in a display system of the present invention will be described.

Figure 22:
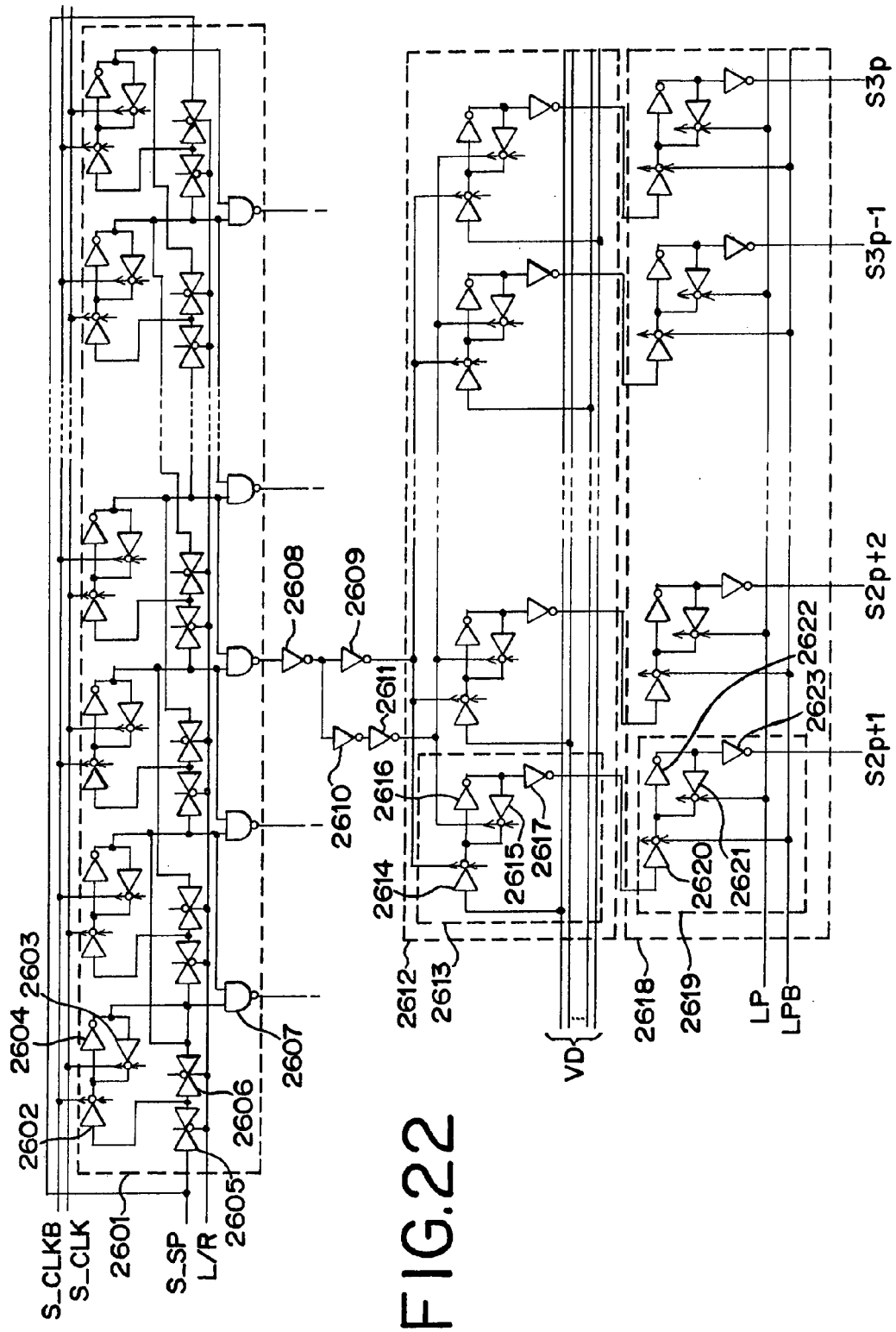
FIG. 22 is a circuit diagram indicating a structure of a source signal line driver circuit in the display system.

FIG. 22 shows an example of a structure of the source signal line driver circuit.

The source signal line driver circuit includes a shift register, a scan direction switching circuit, an LAT(A), and an LAT(B). Note that a portion of LAT(A) 2612 and a portion of LAT(B) 2618, which correspond to only one of outputs from the shift register are shown in FIG. 22. However, an LAT(A) and an LAT(B), which each have the same structure as in FIG. 22, correspond to each of all outputs from the shift register.

A shift register 2601 is composed of clocked inverters 2602 and 2603, an inverter 2604, and a NAND circuit 2607. A start pulse S_SP for the source signal line driver circuit is inputted to the shift register 2601. The clocked inverters 2602 and 2603 are changed between an on state and an off state by a clock pulse S_CLK for the source signal line driver circuit and an inverted clock pulse S_CLKB for the source signal line driver circuit which is a signal having an inverted polarity. Thus, sampling pulses are outputted in order from the NAND 2607 to the LAT(A) 2612.

The scan direction switching circuit is composed of switches 2605 and 2606, which act so as to switch a scan direction of the shift register from side to side in the drawing. In FIG. 22, when a scan direction switching signal L/R corresponds to a signal of Lo, the shift register outputs sampling pulses in order from the left to the right in the drawing. On the other hand, when the scan direction switching signal L/R corresponds to a signal of Hi, the shift register outputs the sampling pulses in order from the right to the left in the drawing.

An LAT(A) 2613 in each stage is composed of clocked inverters 2614 and 2615, and inverters 2616 and 2617.

Here, it is assumed that the LAT(A) in each stage indicates an LAT(A) for latching an image signal inputted to one source signal line.

A digital image signal VD read out from a memory formed on the same substrate as a display substrate in which the source signal line driver circuit is formed is divided into p signals (p is a natural number) and then inputted. That is, signals corresponding to outputs to p source signal lines are inputted in parallel. When the sampling pulses are simultaneously inputted to clocked inverters 2614 and 2615 of the LAT(A) 2612 in each of p stages through buffers 2608 to 2611, input signals divided by p are simultaneously sampled in the LAT(A) 2612 in each of p stages.

Here, an example of a source signal line driver circuit 2600 for outputting signal currents to u (u is a natural number) source signal lines will be described. Thus, u/p sampling pulses are outputted in order from the shift register during one horizontal period. The LAT(A) 2613 in each of p stages simultaneously samples the digital image signals corresponding to outputs to p source signal lines in accordance with the respective sampling pulses.

In this specification, a method of dividing the digital image signal inputted to the source signal line driver circuit into parallel signals of p phases and simultaneously latching p digital image signals by one sampling pulse, as described above, is called p-dividing drive.

By the above dividing drive, a margin can be provided for the operation of the shift register in the source signal line driver circuit. Thus, the reliability of the display system can be improved.

When all signals for one horizontal period are inputted to the LAT(A)s, a latch pulse LS and an inverted latch pulse LSB having an inverted polarity are inputted thereto. Thus, the signals inputted to the LAT(A)s 2613 in respective stages are outputted to LAT(B)s 2619 in respective stages in unison.

Here, it is assumed that the LAT(B)s in respective stages indicate LAT(B) circuits to which the signals from the LAT(A)s in respective stages are inputted.

The LAT(B) 2619 in each stage is composed of clocked inverters 2620 and 2621 and inverters 2622 and 2623. The signal outputted from the LAT(A) 2613 in each stage is outputted to respective source signal lines S1 to Su simultaneously with holding it in the LAT(B).

Note that, although not shown here, a level shifter, a buffer, and the like may be provided as appropriate.

The start pulse S_SP, the clock pulse S_CLK, and the like which are inputted to the shift register, the LAT(A), and the LAT(B) are inputted from the display controller formed on the same substrate as a substrate in which the source signal line driver circuit having the above structure is formed.

Note that the display system of the present invention is not limited to the structure of the source signal line driver circuit of this embodiment and a source signal line driver circuit having a known structure can be freely used.

This embodiment can be embodied by being freely combined with Embodiments 1 to 5.

[Embodiment 7]

In this embodiment, an example of a structure of a gate signal line driver circuit in a display system of the present invention will be described.

The gate signal line driver circuit includes a shift register and a scan direction switching circuit. Note that, although not shown here, a level shifter, a buffer, and the like may be provided as appropriate.

A start pulse G_SP, a clock pulse G_CLK, and the like are inputted to the shift register to output a gate signal line selection signal.

Figure 23:
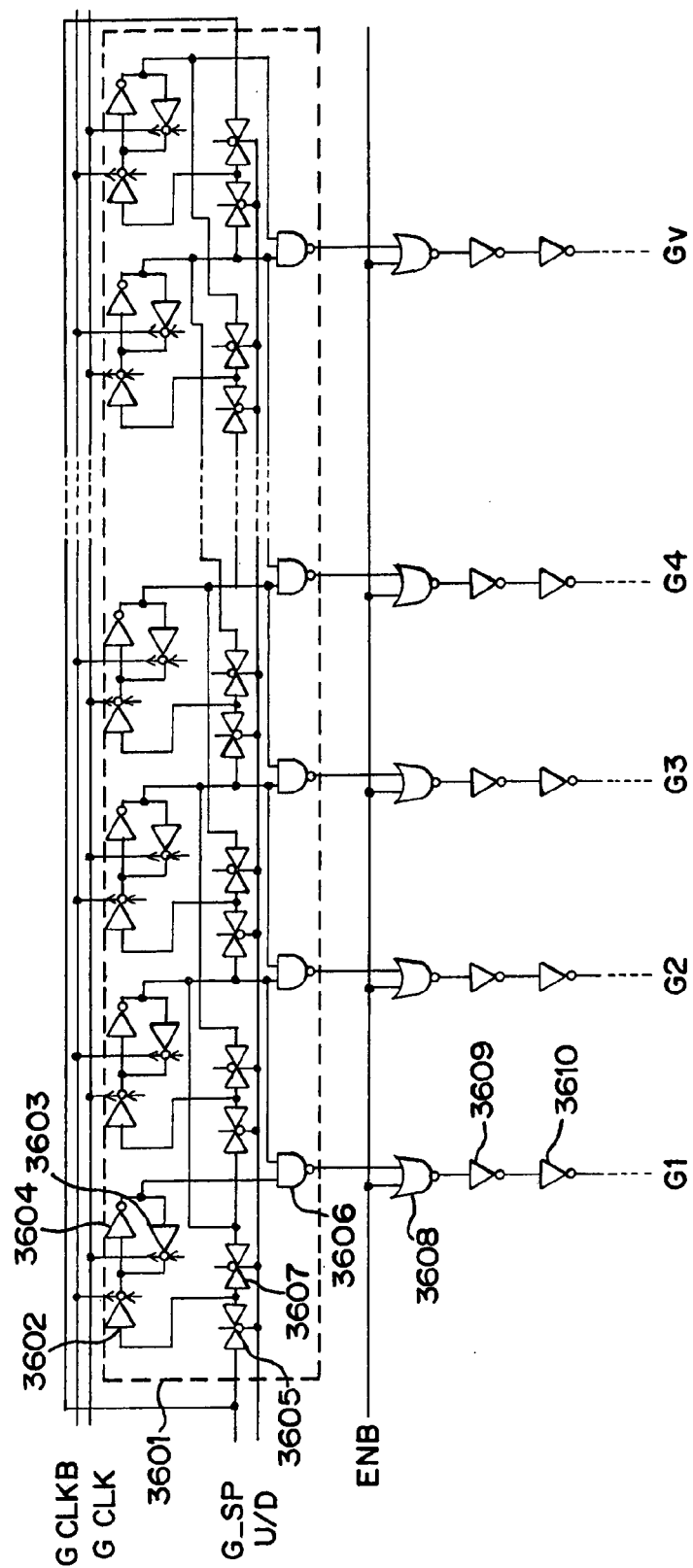
FIG. 23 is a circuit diagram indicating a structure of a gate signal line driver circuit in the display system.

A structure of the gate signal line driver circuit will be described using FIG. 23.

A shift register 3601 is composed of clocked inverters 3602 and 3603, an inverter 3604, and a NAND circuit 3607. A start pulse G_SP is inputted to the shift register 3601. The clocked inverters 3602 and 3603 are changed between an on state and an off state by a clock pulse G_CLK and an inverted clock pulse G_CLKB which is a signal having an inverted polarity. Thus, sampling pulses are outputted in order from the NAND 3607.

The scan direction switching circuit is composed of switches 3605 and 3606, which act so as to switch a scan direction of the shift register from side to side in the drawing. In FIG. 23, when a scan direction switching signal U/D corresponds to a signal of Lo, the shift register outputs sampling pulses in order from the left to the right in the drawing. On the other hand, when the scan direction switching signal U/D corresponds to a signal of Hi, the shift register outputs the sampling pulses in order from the right to the left in the drawing.

The sampling pulses outputted from the shift register are inputted to NORs 3608 and operated with an enable signal ENB. The operation is performed to prevent a state in which adjacent gate signal lines are simultaneously selected, due to rounding of the sampling pulses. The signals outputted from the NORs 3608 are outputted to gate signal lines G1 to Gv through buffers 3609 and 3610.

Note that, although not shown here, a level shifter, a buffer, and the like may be provided as appropriate.

The start pulse G_SP, the clock pulse G_CLK, and the like which are inputted to the shift register are inputted from the display controller formed on the same substrate as a substrate in which the gate signal line driver circuit is formed.

Note that the display system of the present invention is not limited to the structure of the gate signal line driver circuit of this embodiment and a gate signal line driver circuit having a known structure an be freely used.

This embodiment can be embodied by being freely combined with Embodiments 1 to 6.

[Embodiment 8]

In this embodiment, an example in which a switching TFT in a pixel of a display system is manufactured will be described.

Figure 26A:
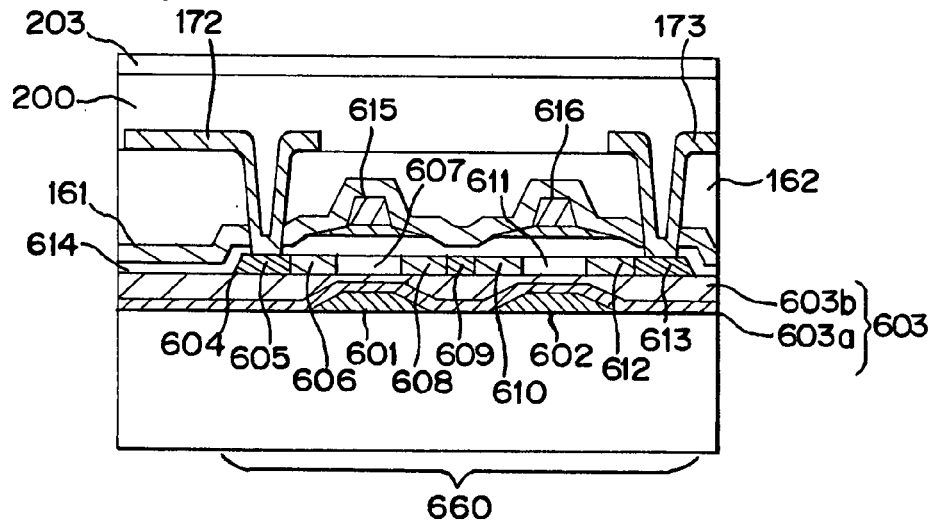
FIGS. 26A to 26C show structures of switching TFTs in the display system of the present invention.
Figure 26B:
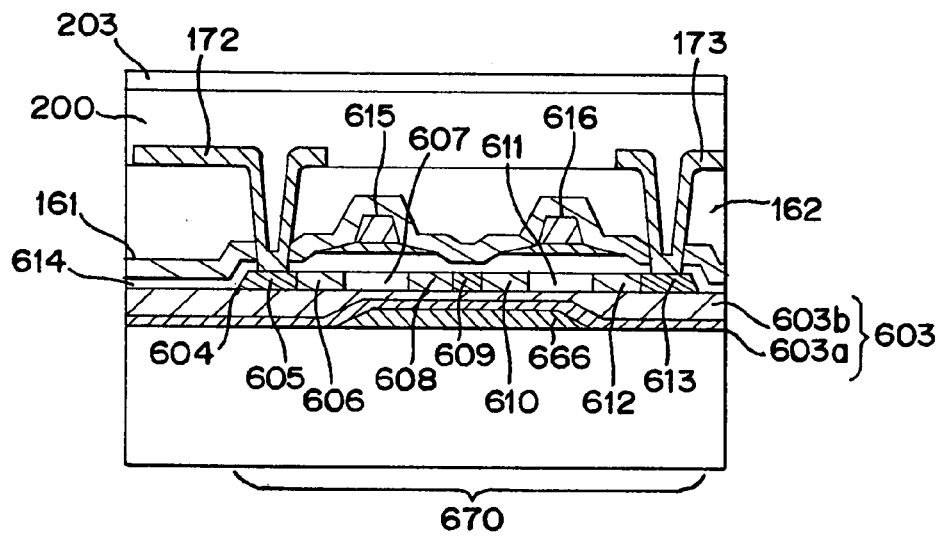
Figure 26C:
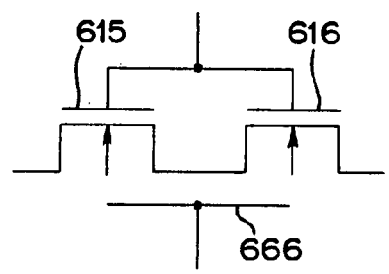

FIGS. 26A to 26C are cross sectional views of a switching TFT in a pixel of the display system of this embodiment.

In FIG. 26A, reference numeral 660 denotes an n-channel TFT which serves as the switching TFT. The switching TFT 660 is a double gate TFT indicated by a TFT1 and a TFT2 which are connected in series with each other. The TFT1 includes a semiconductor film 604, a first insulating film 603 (603a and 603b), a first electrode 601, a second insulating film 614, and a second electrode 615. The TFT2 includes the semiconductor film 604, the first insulating film 603 (603a and 603b), a first electrode 602, the second insulating film 614, and a second electrode 616. The semiconductor film 604 includes one-conductivity type impurity regions 605, 609, and 613 having a first concentration, one-conductivity type impurity regions 606, 608, 610, and 612 having a second concentration, and channel-forming regions 607 and 611.

The first electrode 601 and the channel-forming region 607 are overlapped with each other so as to sandwich the first insulating film 603 therebetween. The second electrode 615 and the channel-forming region 607 are overlapped with each other so as to sandwich the second insulating film 614 therebetween. The first electrode 602 and the channel-forming region 611 are overlapped with each other so as to sandwich the first insulating film 603 therebetween. The second electrode 616 and the channel-forming region 611 are overlapped with each other so as to sandwich the second insulating film 614 therebetween.

The first electrode 601 and the first electrode 602 are electrically connected with each other.

The second electrode 615 and the second electrode 616 are electrically connected with each other outside the semiconductor 604.

In the switching TFT 660 (n-channel TFT in the case of this embodiment), a common potential is provided for the first electrodes 601 and 602. When the first electrodes 601 and 602 are kept at the common potential, a variation in a threshold can be suppressed and an off current can be reduced, as compared with the case of using only the second electrodes without using the first electrodes.

Note that a potential difference between a potential of the source region of the TFT and the common potential of the first electrode is set to be smaller than a threshold in the case of an n-channel TFT and it is set to be larger than the threshold in the case a p-channel TFT.

Here, FIG. 26B shows a structure of a TFT in which an off current is further reduced. Instead of the first electrodes 601 and 602 in FIG. 26A, a first electrode 666 is used in FIG. 26B. Also, the second electrode 615 and a third electrode 616 are provided. Note that FIG. 26C is a schematic view of the TFT having the structure shown in FIG. 26B.

In FIG. 26B, the first electrode 666 are overlapped with each of the channel-forming region 607, the one-conductivity type impurity region 609 having the first concentration, the one-conductivity type impurity regions 608 and 610 having the second concentration, and the channel-forming region 611 so as to sandwich the first insulating film 603 therebetween. The second electrode 615 is overlapped with the channel-forming region 607 so as to sandwich the second insulating film 614 therebetween. The third electrode 616 is overlapped with the channel-forming region 611 so as to sandwich the second insulating film 614 therebetween. Here, it is made such that the first electrode 666 is not overlapped with the one-conductivity type impurity regions 605 and 613 having the first concentration and the one-conductivity type impurity regions 606 and 612 having the second concentration so as to sandwich the first insulating film 603 therebetween. The second electrode 615 is electrically connected with the third electrode 616 outside the semiconductor film. Here, the third electrode 616 can be manufactured simultaneously with the second electrode 615.

In a switching TFT 670 (n-channel TFT in the case of this embodiment), a common potential is provided for the first electrode 666. When the common potential is provided for the first electrode 666, a variation in a threshold can be suppressed and an off current can be reduced, as compared with the case of using only the second electrodes without using the first electrodes.

Note that a potential difference between a potential of the source region of the TFT and the common potential of the first electrode is set to be smaller than a threshold in the case of an n-channel TFT and it is set to be larger than the threshold in the case a p-channel TFT. Although the example using the n-channel TFT is indicated here, this embodiment can be applied to the case of a p-channel TFT.

This embodiment can be embodied by being freely combined with Embodiments 1 to 7.

[Embodiment 9]

Figure 27A:
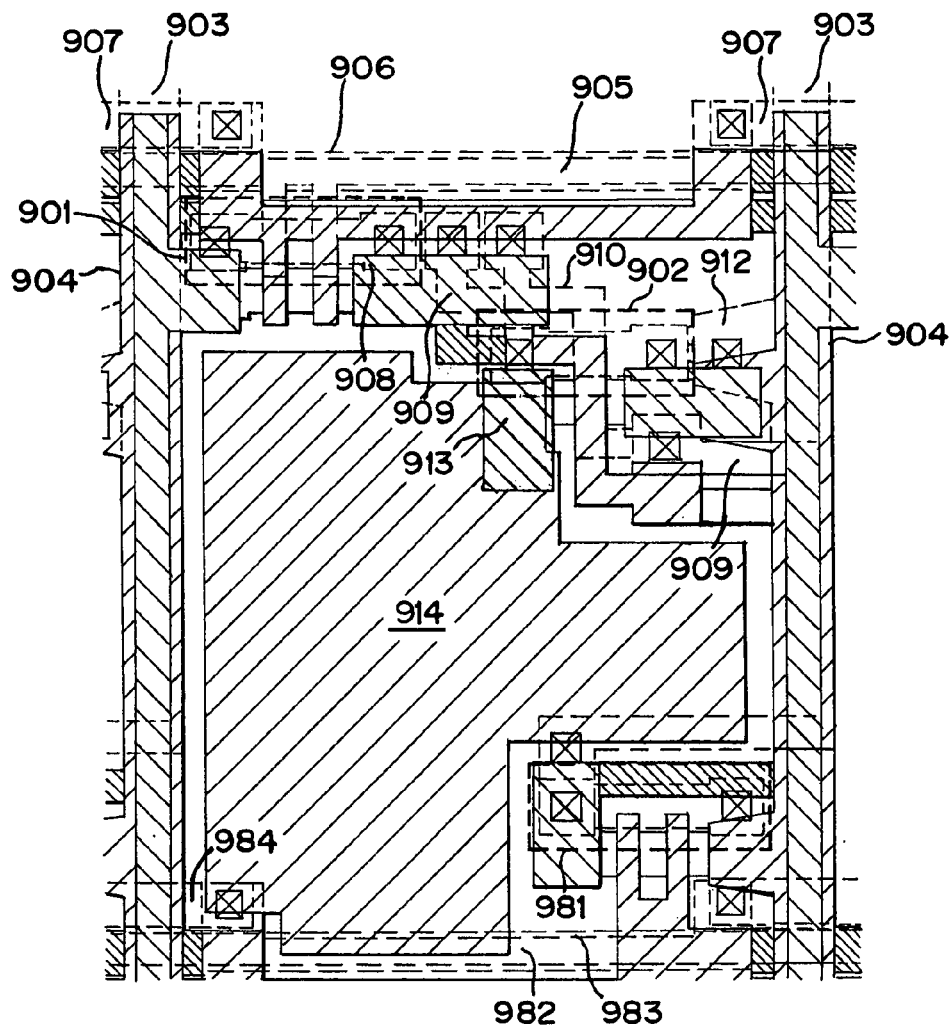
FIGS. 27A and 27B show structures of a pixel in the display system of the present invention.
Figure 27B:
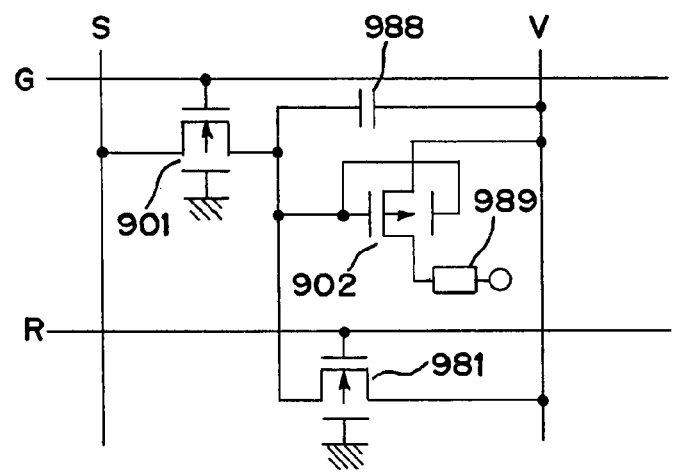

In this embodiment, an example in the case where a pixel in which three TFTs are located is used for a display system of the present invention, as disclosed in Japanese Patent Application Laid-open No. 2001-343933 will be described. FIGS. 27A and 27B are used for description.

As shown in FIG. 27B, three TFTs, that is, a switching TFT 901, a driver TFT 902, and a reset TFT 981 are located in one pixel. The gate electrode of the switching TFT 901 is connected with a gate signal line G. With respect to the source region and the drain region of the switching TFT 901, one is connected with a source signal line S. The other is connected with the gate electrode of the driver TFT 902, a first electrode of a storage capacitor 988, and the source region or the drain region of the reset TFT 981. The side in the source region or the drain region of the reset TFT 981, which is not connected with the switching TFT 901, is connected with a power supply line V. The gate electrode of the reset TFT 981 is connected with a reset signal line R. With respect to the source region and the drain region of the driver TFT 902, one is connected with the power supply line V and the other is connected with a light emitting element 989.

A drive operation of the pixel having such a structure will be described. When the gate signal line G is selected and a signal is inputted to the gate electrode of the switching TFT 901 so that it becomes an on state, a signal is inputted from the source signal line S to a pixel with such a state. A gate voltage of the driver TFT 902 is changed by the input signal. Thus, a current flows from the power supply line V through the driver TFT 902 so that the light emitting element 989 emits light. At this time, the gate voltage of the driver TFT 902 is kept by the storage capacitor 988. Here, the reset TFT 981 is provided to emit electric charge stored in the storage capacitor 988. When the reset TFT 981 is made to be in an on state by the signal inputted to the reset signal line R, the electrical charge stored in the storage capacitor 988 can be emitted.

FIG. 27A is a top view of an example in which the pixel having the structure shown in FIG. 27B is actually manufactured. Reference numerals 901 and 981 each denote an n-channel TFT and reference numeral 902 denotes a p-channel TFT. Also, reference numeral 903 denotes source wirings, 904 denotes power source lines, 982 and 905 each denote a gate wiring, and 906 and 983 each denote a common wiring.

In this embodiment, the power source lines 904 and the gate wirings 905 and 982, which are made from the same conductive film, are simultaneously formed. In other words, the power source lines 904 and the gate wiring 905 are formed in the same layer. In addition, respective gate wirings 905 in adjacent pixels are connected with each other through a connection wiring 907 formed in the same layer as the common wiring 906. Respective gate wirings 982 in adjacent pixels are connected with each other through a connection wiring 984 formed in the same layer as the common wiring 983. A portion of the gate wiring 905 serves as a second electrode of the n-channel TFT 901. A portion of the common wiring 906 serves as a first electrode of the n-channel TFT 901. With respect to the source region and the drain region of the n-channel TFT 901, one is connected with the source wiring 903 and the other is connected with a first electrode 909 and a second electrode 910 of the p-channel TFT 902 through a connection wiring 908 formed in the same layer as the source wiring 903. With respect to the source region and the drain region of the p-channel TFT 902, one is connected with the power source line 904 through a connection wiring 912 formed in the same layer as the source wiring 903 and the other is connected with a pixel electrode 914 through a connection wiring 913 formed in the same layer as the source wiring 903. A portion of the gate wiring 982 serves as a second electrode of the n-channel TFT 981. A portion of the common wiring 983 serves as a first electrode of the n-channel TFT 981.

In this embodiment, since the source wiring and the power source wiring are formed in different layers, these wirings can be overlapped with each other. As a result, an opening rate can be increased. Note that the present invention is not limited to such a structure. The power source line may be formed in an upper layer than the source wiring. Also, either the source wiring or the power source wiring may be formed in the same layer as the common wiring.

In this embodiment, of TFTs in the same pixel, TFTs used as the switching elements (n-channel TFTs 901 and 981 in the case of this embodiment) provide the first electrodes with the common potential. When the common potential is provided for the first electrodes, a variation in a threshold can be suppressed and an off current can be reduced, as compared with the case of using the single electrode.

With respect to a TFT flowing a larger current than that in a TFT used as a switching element (p-channel TFT 902 in the case of this embodiment), the first electrode and the second electrode are electrically connected with each other. When the same voltage is applied to the first electrode and the second electrode, since a depletion layer is rapidly expanded substantially in the same manner as in the case where a semiconductor film is thinned, a subthreshold coefficient can be reduced and field effect mobility can be improved. Thus, an on current can be increased as compared with the case of the single electrode. Therefore, when the TFT having such a structure is used for driver circuits, a drive voltage can be reduced. Also, since an on current can be increased, a TFT size (particularly, a channel width) can be reduced. As a result, a packing density can be increased.

This embodiment can be embodied by being freely combined with Embodiments 1 to 8.

[Embodiment 10]

In this embodiment, an example of sealing method of the display system in the case of using OLED element as a light emitting element will be described with reference to FIG. 24.

Figure 24A:
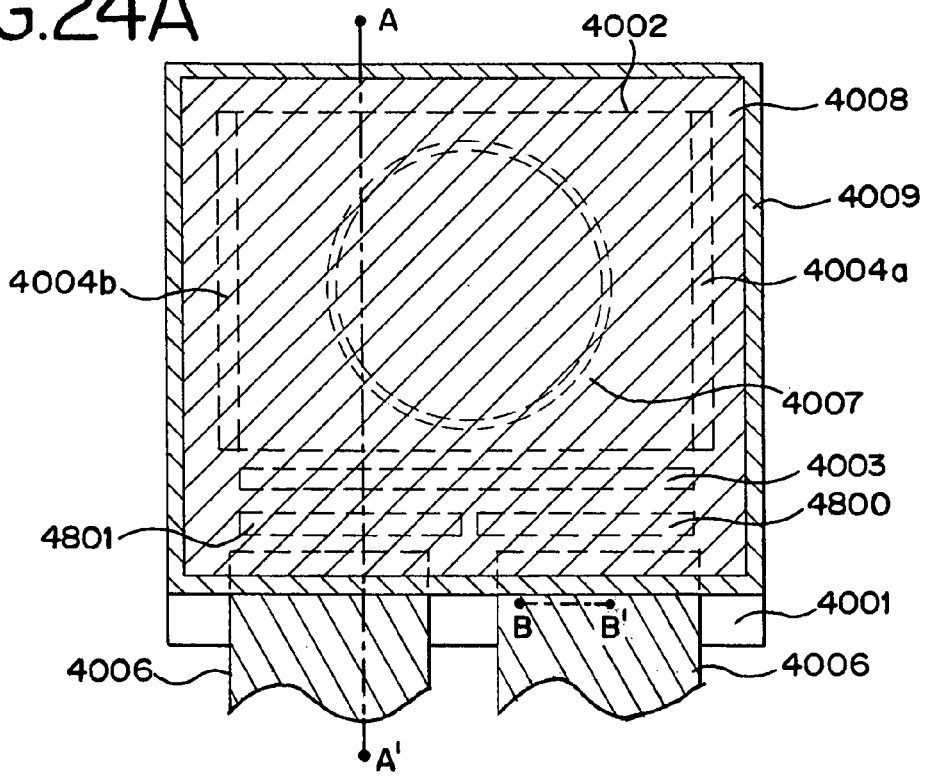
FIGS. 24A to 24C show appearances of the display system of the present invention.
Figure 24B:
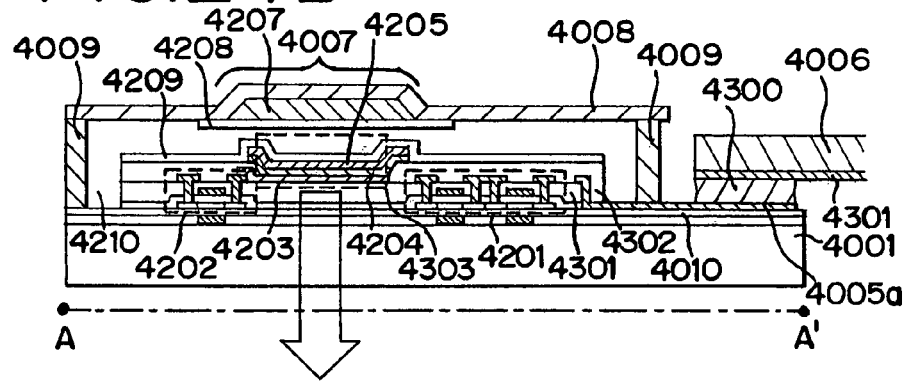
Figure 24C:
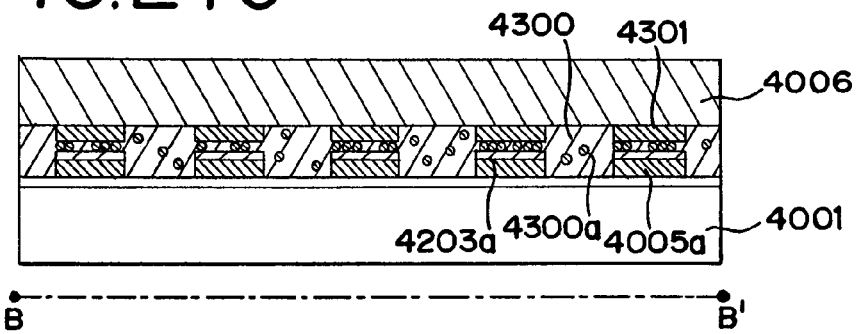

FIG. 24A is a top view of a display system, FIG. 24B is a sectional view taken along a line A–A' of FIG. 24A, and FIG. 24C is a sectional view taken along a line B–B' of FIG. 24A. A seal member 4009 is provided so as to surround a combination of a pixel portion 4002, a source signal line driver circuit 4003, the first and the second gate signal line driver circuits 4004a and 4004b, a memory 4800 and a memory controller 4801 which are provided on a substrate 4001. Further, a sealing member 4008 is provided over the combination of a pixel portion 4002, a source signal line driver circuit 4003, the first and the second gate signal line driver circuits 4004a and 4004b, a memory 4800 and a memory controller 4801. Thus, the combination of a pixel portion 4002, a source signal line driver circuit 4003, the first and the second gate signal line driver circuits 4004a and 4004b, a memory 4800 and a memory controller 4801 are sealed with a filler 4210 (vide FIG. 24B) and by the substrate 4001, the seal member 4009, and the sealing member 4008.

Further a pixel portion 4002, a source signal line driver circuit 4003, the first and the second gate signal line driver circuits 4004a and 4004b, a memory 4800 and a memory controller 4801 provided on the substrate 4001 include a plurality of TFTs. FIG. 24B typically shows a driving TFT (n-channel type TFT and p-channel type TFT are shown in this embodiment) 4201 and TFT 4202 for a driving included in the pixel portion 4002, which are formed on an under film 4010.

In this embodiment, the p-channel type TFT and the n-channel type TFT fabricated by a well-known method are used as the driving TFT 4201, and a p-channel TFT fabricated by a well-known method is used as TFT 4202 for the driving. Further, the retention volume (not shown in the figure) connected to the gate of TFT 4202 for the driving is provided at the pixel portion 4002.

A first interlayer insulating film (flattening film) 4301 is formed on the driving TFTs 4201 and TFT 4202 for the driving. Then, a pixel electrode (anode) 4203 electrically connected to a drain of TFT 4202 for the driving is formed thereon. A transparent conductive film having a high work function is used as the pixel electrode 4203. A compound of indium oxide and tin oxide, a compound of indium oxide and zinc oxide, zinc oxide, tin oxide, or indium oxide can be used for the transparent conductive film. Further, the transparent conductive film added with gallium may be used.

An insulating film 4302 is formed on the pixel electrode 4203. An opening portion is formed in the insulating film 4302 over the pixel electrode 4203. In this opening portion, an organic compound layer 4204 is formed on the pixel electrode 4203. A well-known organic material or inorganic material can be used for the organic compound layer 4204.

Although the organic material includes a low molecular system (monomer system) and a high molecular system (polymer system), either may be used.

As a formation method of the organic compound layer 4204, a well-known evaporation technique or coating technique may be used. The structure of the organic compound layer may be a laminate structure obtained by freely combining a hole injection layer, a hole transporting layer, a light emitting layer, an electron transporting layer, or an electron injection layer, or a single layer structure.

A cathode 4205 made of a conductive film (typically, a conductive film containing aluminum, copper or silver as its main ingredient, or a laminate film of those and another conductive films) having a light shielding property is formed on the organic compound layer 4204. It is desirable that moisture and oxygen existing on the interface between the cathode 4205 and the organic compound layer 4204 are removed to the utmost. Accordingly, it is necessary to make such contrivance that the organic compound layer 4204 is formed in a nitrogen or rare gas atmosphere, and the cathode 4205 is formed while the organic compound layer is not exposed to oxygen or moisture. In this embodiment, a multi-chamber system (cluster tool system) film forming apparatus is used, so that the film formation as described above is enabled. A predetermined voltage is applied to the cathode 4205.

In the manner as described above, a light-emitting element 4303 constituted by the pixel electrode (anode) 4203, the organic compound layer 4204, and the cathode 4205 are formed. Then, a protection film 4209 is formed on the insulating film 4302 so as to cover the light-emitting element 4303. The protection film 4209 is effective to prevent oxygen, moisture and the like from penetrating into the light-emitting element 4303.

Reference numeral 4005a designates a drawing wiring line connected to a power supply line and is electrically connected to a source region of TFT 4202 for the driving. The drawing wiring line 4005a passes between the seal member 4009 and the substrate 4001, and is electrically connected to an FPC wiring line 4301 included in an FPC 4006 through an anisotropic conductive film 4300.

As the sealing member 4008, a glass member, a metal member (typically, a stainless member), a ceramic member, or a plastic member (including a plastic film) can be used. As the plastic member, an FRP (Fiberglass-Reinforced Plastics) plate, a PVF (polyvinyl fluoride) film, a Mylar film, a polyester film or an acryl resin film can be used. Further, a sheet having such a structure that an aluminum foil is interposed between PVF films or Mylar films can also be used.

However, in the case when the radiation direction of light from the light-emitting element is directed toward the side of a cover member, the cover member must be transparent. In this case, a transparent material such as a glass plate, a plastic plate, a polyester film, or an acryl film is used.

As the filler 4210, in addition to an inert gas such as nitrogen or argon, ultraviolet ray curing resin or thermosetting resin can be used, and PVC (polyvinyl chloride), acryl, polyimide, epoxy resin, silicone resin, PVB (polyvinyl butyral), or EVA (ethylene-vinyl acetate) can be used. In this embodiment, nitrogen was used as the filler.

Further, in order to expose the filler 4210 to a hygroscopic material (preferably, barium oxide) or a material capable of adsorbing oxygen, a recess portion 4007 is provided on the surface of the sealing member 4008 on the side of the substrate 4001 and the hygroscopic material or the material 4207 capable of adsorbing oxygen is disposed. Then, in order to prevent the hygroscopic material or the material 4207 capable of adsorbing oxygen from scattering, the hygroscopic material or the material capable of adsorbing oxygen are held in the recess portion 4007 by a recess cover member 4208. Note that, the recess cover member 4208 is formed into a fine mesh, and has such a structure that air or moisture is permeated and the hygroscopic material or the material 4207 capable of adsorbing oxygen is not permeated. The deterioration of the light-emitting element 4303 can be suppressed by providing therewith the hygroscopic material or the material 4207 capable of adsorbing oxygen.

As shown in FIG. 24C, at the same time as the formation of the pixel electrode 4203, a conductive film 4203a is formed to be in contact with the drawing wiring line 4005a.

The anisotropic conductive film 4300 includes a conductive filler 4300a. The substrate 4001 and the FPC 4006 are thermally compressed, so that the conductive film 4203a on the substrate 4001 and the FPC wiring line 4301 on the FPC 4006 are electrically connected through the conductive filler 4300a.

Further, this embodiment can be implemented by freely combined with Embodiments 1 to 9.

[Embodiment 11]

In this embodiment, one example of a structure of a pixel in a liquid crystal display system will be described.

Figure 18:
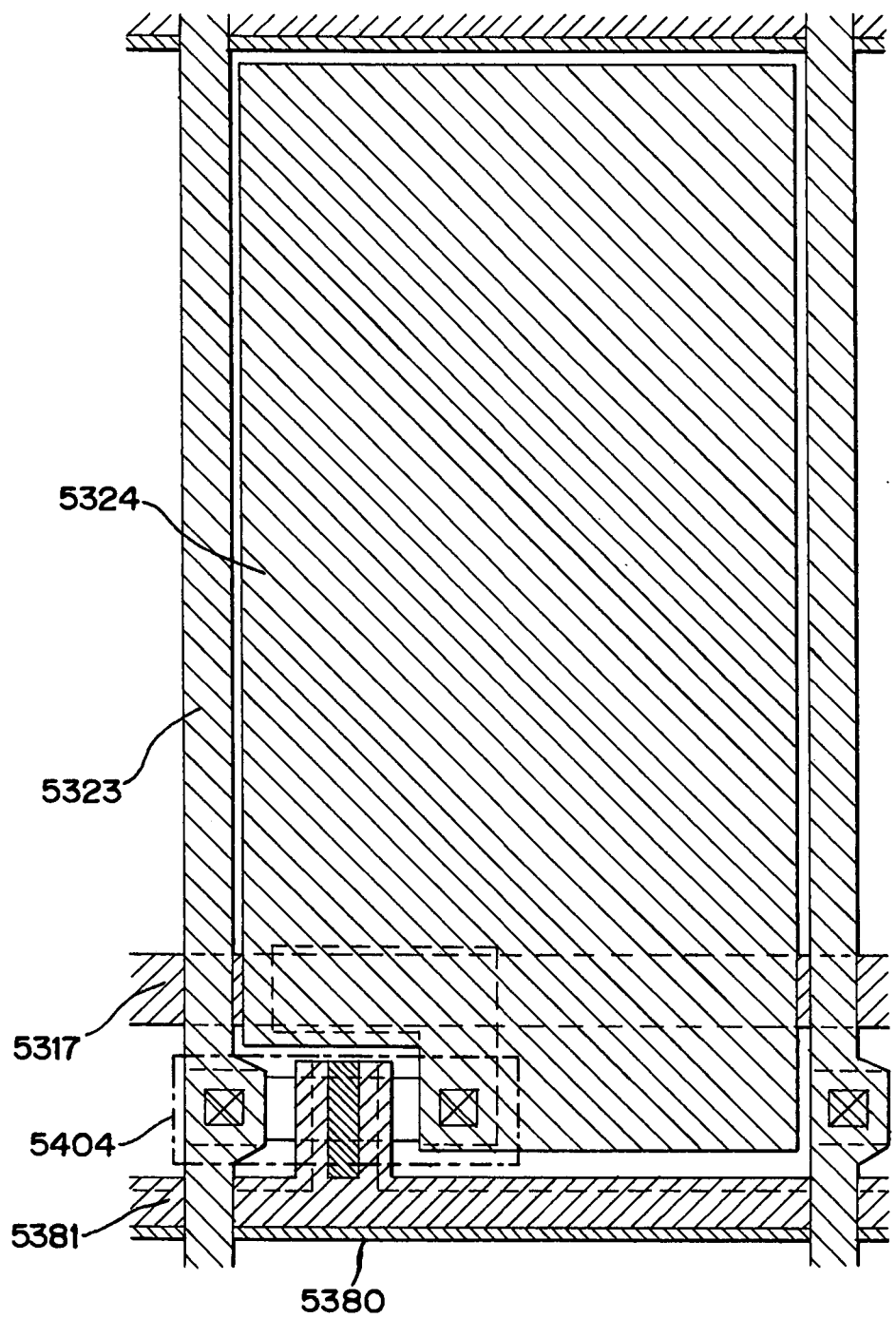
FIG. 18 shows a structure indicating a pixel in the display system of the present invention.
Figure 19:
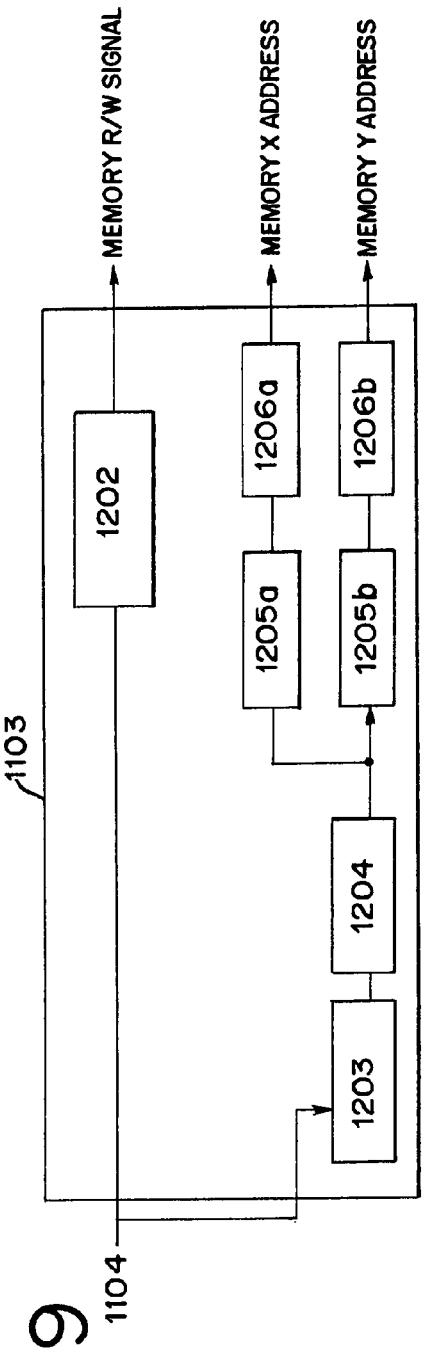
FIG. 19 is a block diagram indicating a structure of a memory controller.
Figure 20:
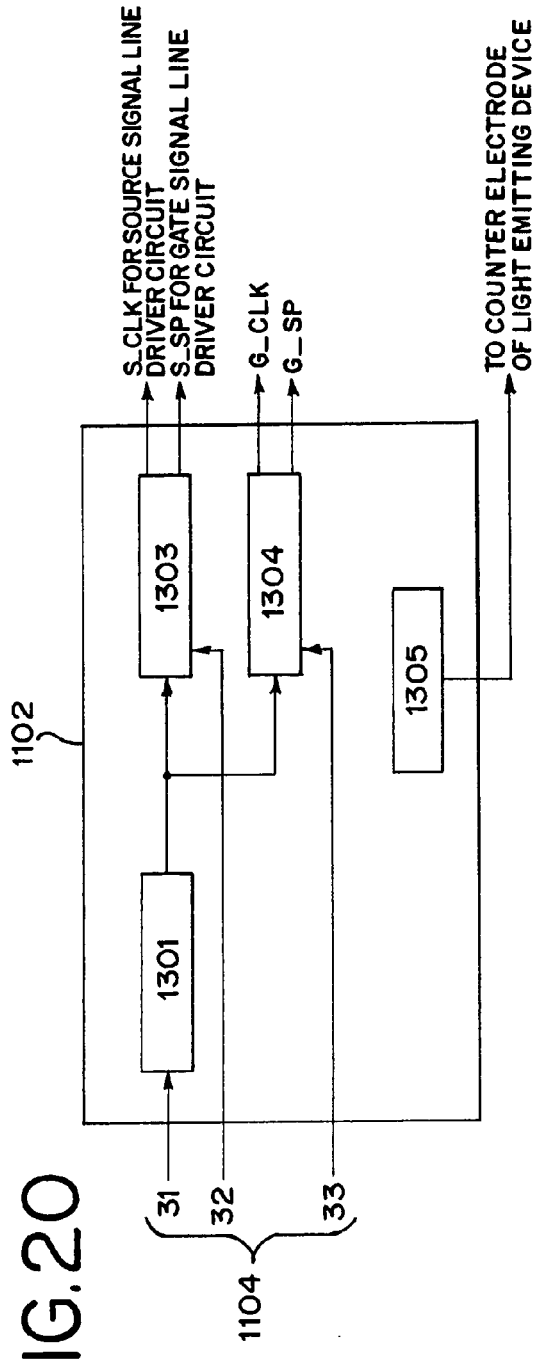
FIG. 20 is a block diagram indicating a structure of a display controller.

FIG. 18 is a top view of a pixel. In FIG. 18, reference numerals 5317 and 5381 each denote a gate wiring. A portion of the gate wiring 5381 constitutes a second gate electrode of an n-channel TFT 5404. Reference numeral 5380 denotes a common wiring. A portion of the common wiring 5380 constitutes a first gate electrode of the n-channel TFT 5404. Reference numeral 5323 denotes a source wiring. The source wiring 5323 is connected with the source region or the drain region of the n-channel TFT 5404. Reference numeral 5324 denotes a pixel electrode.

In this embodiment, with respect to the TFT used as a switching element (n-channel TFT 5404 in the case of this embodiment), a common voltage is applied to the first electrode. When the common voltage is applied to the first electrode, a variation in a threshold can be suppressed and an off current can be reduced, as compared with the case of using the single electrode. Here, the TFT used as a switching element (n-channel TFT 5404 in the case of this embodiment) is made from a double gate TFT. The TFT having the structure shown in FIG. 26B in Embodiment 8 is used as the double gate TFT.

In this embodiment, the n-channel TFT is indicated as the switching element for controlling a voltage applied to the pixel electrode of a liquid crystal element. However, a p-channel TFT may also be used.

[Embodiment 12]

In this embodiment, a characteristic of a TFT in the case where a first electrode and a second electrode are electrically connected with each other will be described.

Figure 13:
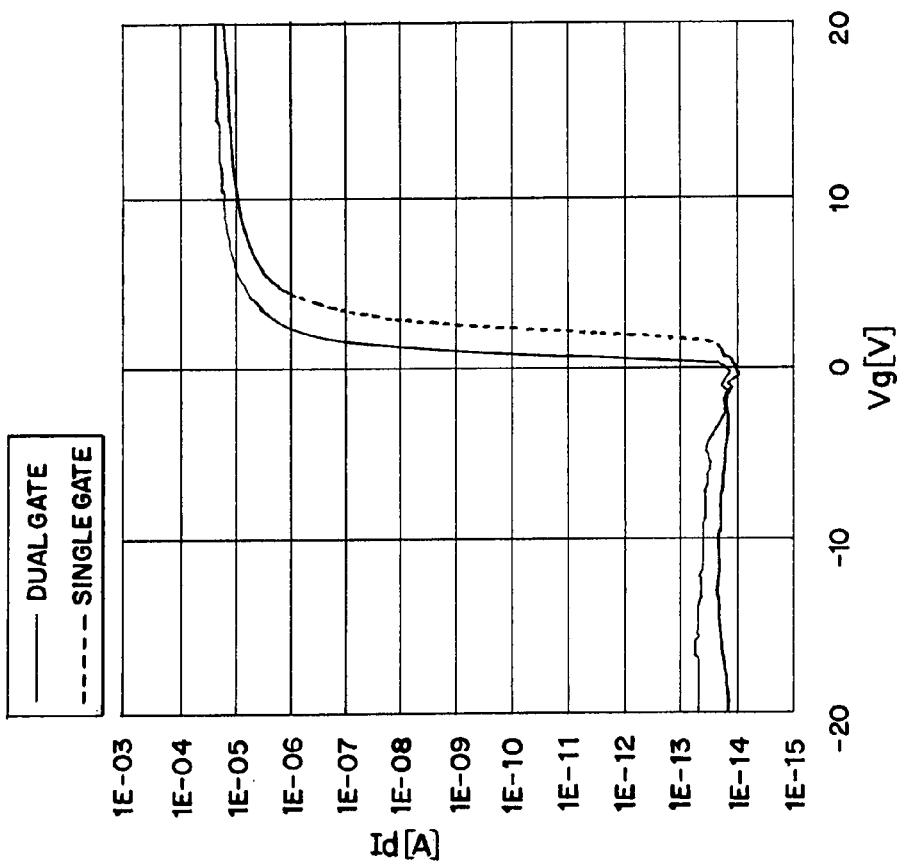
FIG. 13 shows TFT characteristics obtained by the simulation.
Figure 12A:
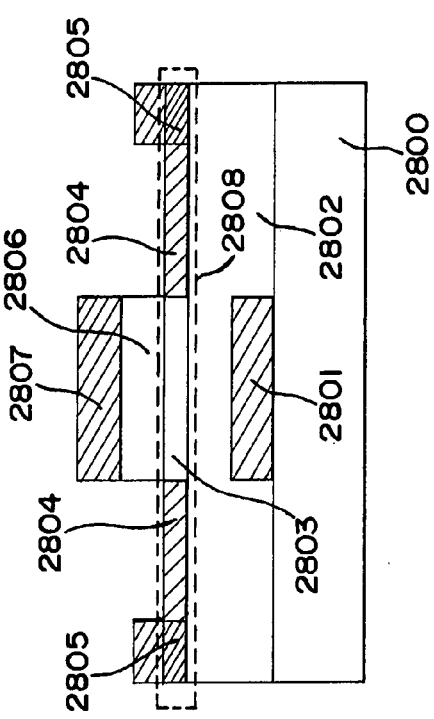
FIGS. 12A and 12B show structures of TFTs used in simulation.
Figure 12B:
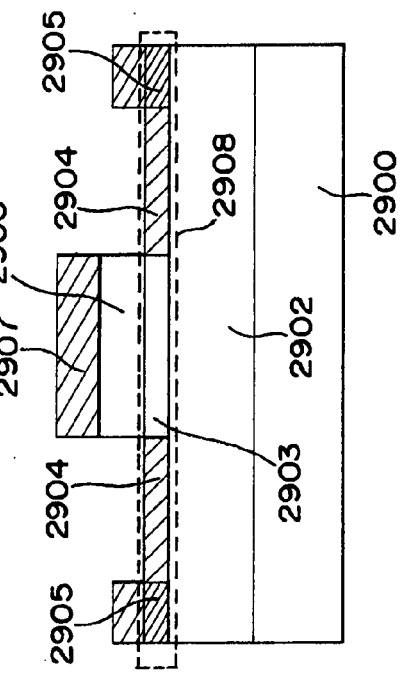

FIG. 12A is a cross sectional view of a TFT according to the present invention, in which the first electrode and the second electrode are electrically connected with each other. Also, for comparison, FIG. 12B is a cross sectional view of a TFT having only a single electrode. FIG. 13 shows a relationship between a gate voltage and a drain current in the respective TFTs shown in FIGS. 12A and 12B, which is obtained by simulation.

The TFT shown in FIG. 12A includes a first electrode 2801, a first insulating film 2802 which is in contact with the first electrode 2801, a semiconductor film 2808 which is in contact with the first insulating film 2802, a second insulating film 2806 which is in contact with the semiconductor film 2808, and a second electrode 2807 which is in contact with the second insulating film 2806, on a substrate 2800 having an insulating surface. The semiconductor film 2808 has a channel-forming region 2803, first impurity regions 2804 which are in contact with the channel-forming region 2803, and second impurity regions 2805 which are in contact with the first impurity regions 2804.

The first electrode 2801 and the second electrode 2807 are overlapped with each other so as to sandwich the channel-forming region 2803 therebetween. The same voltage is applied to the first electrode 2801 and the second electrode 2807.

The first insulating film 2802 and the second insulating film 2806 are made of silicon oxide. Also, the first electrode and the second electrode are made of Al. The channel length is 7 μm. The channel width is 4 μm. The thickness of the first insulating film in a region in which the first (gate) electrode is overlapped with the channel-forming region is 110 μm. The thickness of the second insulating film in a region in which the second (gate) electrode is overlapped with the channel-forming region is 110 μm. The thickness of the channel-forming region is 50 nm. The length of the first impurity region in a channel length direction is 1.5 μm.

The channel-forming region 2803 is doped with an impurity for providing a p-type at $1\times10^{17}/cm^3$. The first impurity regions are doped with an impurity for providing an n-type at $3\times10^{17}/cm^3$. The second impurity regions are doped with an impurity for providing an n-type at $5\times10^{19}/cm^3$.

The TFT shown in FIG. 12B includes a first insulating film 2902, a semiconductor film 2908 which is in contact with the first insulating film 2902, a second insulating film 2906 which is in contact with the semiconductor film 2908, and a second electrode 2907 which is in contact with the second insulating film 2906, on a substrate 2900 having an insulating surface. The semiconductor film 2908 has a channel-forming region 2903, first impurity regions 2904 which are in contact with the channel-forming region 2903, and second impurity regions 2905 which are in contact with the first impurity regions 2904. The second electrode 2907 is overlapped with the channel-forming region 2903. The first insulating film 2902 and the second insulating film 2906 are made of silicon oxide. Also, the second electrode is made of Al. The channel length is 7 μm. The channel width is 4 μm. The thickness of the second insulating film in a region in which the second (gate) electrode is overlapped with the channel-forming region is 110 μm. The thickness of the channel-forming region is 50 nm. The length of the first impurity region in a channel length direction is 1.5 μm.

The channel-forming region 2903 is doped with an impurity for providing a p-type at $1\times10^{17}/cm^3$. The first impurity regions are doped with an impurity for providing an n-type at $3\times10^{17}/cm^3$. The second impurity regions are doped with an impurity for providing an n-type at $5\times10^{19}/cm^3$.

In FIG. 13, the abscissa indicates a gate voltage and the ordinate indicates a drain current. A value of the drain current with respect to the gate voltage in the TFT shown in FIG. 12A indicates a solid line and a value of the drain current with respect to the gate voltage in the TFT shown in FIG. 12B indicates a broken line.

From FIG. 13, the mobility of 139 $cm^2/Vs$ and the S value of 0.118 V/dec is obtained in the TFT shown in FIG. 12A. Also, the mobility of 86.3 $cm^2/Vs$ and the S value of 0.160 V/dec is obtained in the TFT shown in FIG. 12B. Thus, when the first electrode and the second electrode are provided and electrically connected with each other, the mobility becomes larger and the S value becomes small as compared with the case where only the single electrode is provided.

[Embodiment 13]

In this embodiment, electronic devices using the display system of the present invention will be described using FIGS. 25A to 25F.

Figure 25A:
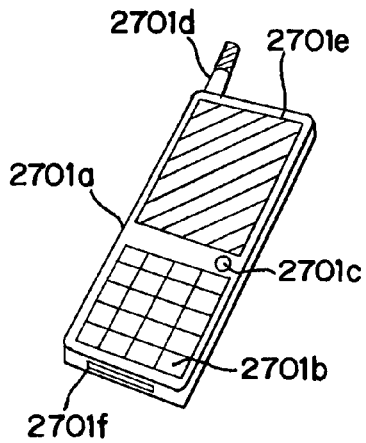
FIGS. 25A to 25F show electronic devices using the display system of the present invention.

FIG. 25A is a schematic view of a personal digital assistant using the display system of the present invention. The personal digital assistant is composed of a main body 2701a, an operational switch 2701b, a power source switch 2701c, an antenna 2701d, a display unit 2701e, and an external input port 2701f. The display system of the present invention can be used for the display unit 2701e.

Figure 25B:
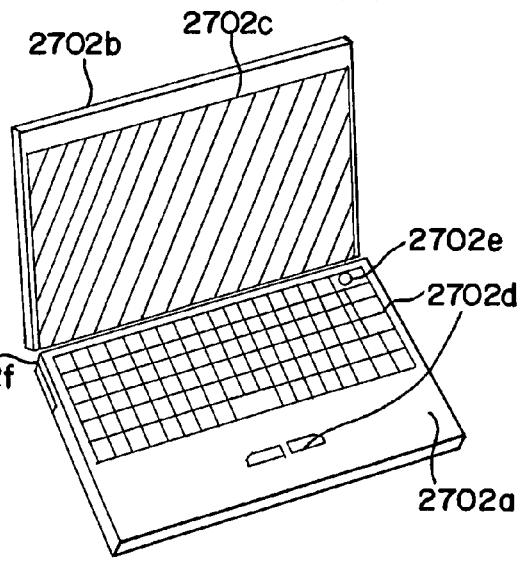

FIG. 25B is a schematic view of a personal computer using the display system of the present invention. The personal computer is composed of a main body 2702a, a cabinet 2702b, a display unit 2702c, an operational switch 2702d, a power source switch 2702e, and an external input port 2702f. The display system of the present invention can be used for the display unit 2702c.

Figure 25C:
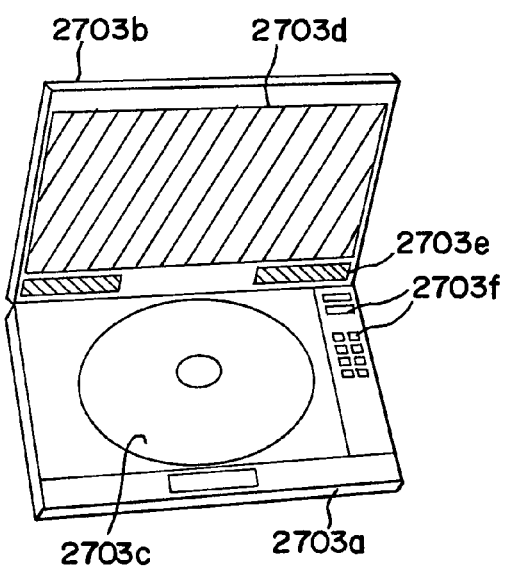

FIG. 25C is a schematic view of an image reproduction device using the display system of the present invention. The image reproduction device is composed of a main body 2703a, a cabinet 2703b, a recording medium 2703c, a display unit 2703d, a voice output unit 2703e, and an operational switch 2703f. The display system of the present invention can be used for the display unit 2703d.

Figure 25D:
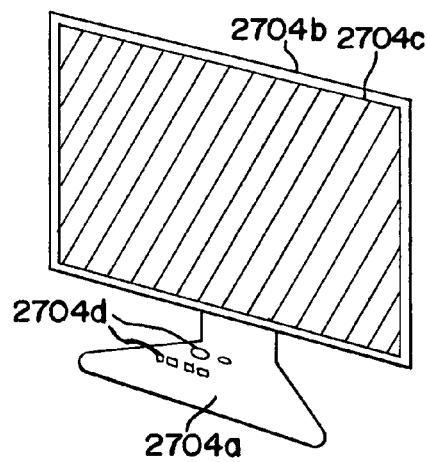

FIG. 25D is a schematic view of a television using the display system of the present invention. The television is composed of a main body 2704a, a cabinet 2704b, a display unit 2704c, and an operational switch 2704d. The display system of the present invention can be used for the display unit 2704c.

Figure 25E:
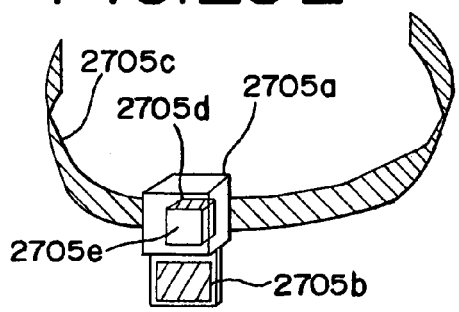

FIG. 25E is a schematic view of a head mounted display using the display system of the present invention. The head mounted display is composed of a main body 2705a, a monitor unit 2705b, a head fixing band 2705c, a display unit 2705d, and an optical system 2705e. The display system of the present invention can be used for the display unit 2705d.

Figure 25F:
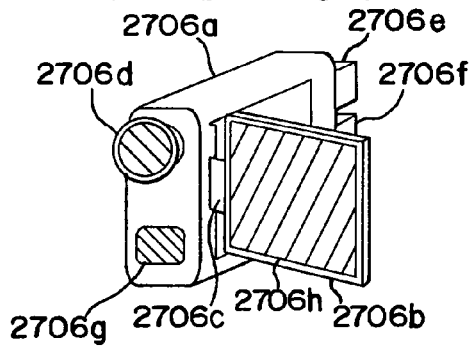

FIG. 25F is a schematic view of a video camera using the display system of the present invention. The video camera is composed of a main body 2706a, a cabinet 2706b, a connection unit 2706c, an image receiving unit 2706d, an eyepiece unit 2706e, a battery 2706f, a voice input unit 2706g, and a display unit 2706h. The display system of the present invention can be used for the display unit 2706h.

Applications of the present invention are not limited to the above electronic devices and may also include various other electronic devices.

This embodiment can be embodied by being freely combined with Embodiments 1 to 11.

According to the present invention, the memory, the memory controller, the display controller, and the like are formed on the same substrate as the display substrate on which the pixels and the driver circuits are formed. Thus, wiring capacitances of connection portions between the memory, the memory controller, and the display controller, and the driver circuits and the like in the display can be greatly reduced and the power consumption of the display system can be reduced. At this time, when a suitable structure of the TFT composing each circuit is selected according to a type of drive operation and formed, the display system having high reliability is obtained.

What is claimed is:

1. A display system comprising:
a plurality of pixels, each of the plurality of pixels comprising a first thin film transistors over a substrate having an insulating surface;
a driver circuit for outputting an inputted image signal to the plurality of pixels, the driver circuit comprising a second thin film transistor over the substrate; and
a first means for storing the image signal to be outputted to the driver circuit, the first means comprising a third thin film transistor over the substrate,
wherein each of the first to the third thin film transistors comprises a first electrode and a second electrode overlapped with a first channel region though insulating films,
wherein the first electrode and the second electrode are overlapped with each other so as to sandwich the first channel region therebetween,
wherein each of the plurality of pixels comprises a fourth thin film transistor connected to a light emitting element,
wherein the fourth thin film transistor comprises a third electrode and a fourth electrode overlapped with each other so as to sandwich a second channel region therebetween and connected to each other,
wherein the first thin film transistor further comprises a fifth electrode connected to the second electrode and overlapped with the first electrode through the insulating film,
wherein the first electrode and the fifth electrode are overlapped with each other so as to sandwich a third channel region therebetween, and
wherein an LDD region is interposed between the third channel region and the first channel region.

2. A display system according to claim 1, wherein a potential of the first electrode of the plurality of first thin film transistors is kept to be constant.

3. A display system according to claim 1, wherein the first electrode and the second electrode of the plurality of second and third thin film transistors are electrically connected with each other so as to be applied same voltage to both electrodes.

4. A display system according to claim 1, wherein a potential difference between a potential of a source region and the first electrode is set to be a threshold of the first thin film transistors or lower than the threshold when the plurality of first thin film transistors are n-channel type.

5. A display system according to claim 1, wherein a potential difference between a potential of a source region and the first electrode is set to be a threshold of the first thin film transistors or higher than the threshold when the plurality of first thin film transistors are p-channel type.

6. A display system according to claim 1, wherein the display system is incorporated at least in one selected from the group consisting of a personal digital assistant, a personal computer, an image reproduction device, a television, a head mounted display, and a camera.

7. A display system comprising:
a plurality of pixels, each of the plurality of pixels comprising a first thin film transistors over a substrate having an insulating surface;
a driver circuit for outputting an inputted image signal to the plurality of pixels, the driver circuit comprising second thin film transistor over the substrate; and
a first means for storing the image signal to be outputted to the driver circuit, the first means comprising a third thin film transistor over the substrate,
a second means for determining a drive frequency of the driver circuit, the second means comprising a fourth thin film transistor over the substrate,
wherein each of the first to the fourth thin film transistors comprises a first electrode and a second electrode overlapped with a first channel region through insulating films,
wherein the first electrode and the second electrode are overlapped with each other so as to sandwich the first channel region therebetween,
wherein each of the plurality of pixels comprises a fifth thin film transistor connected to a light emitting element,
wherein the fifth thin film transistor comprises a third electrode and a fourth electrode overlapped with each other so as to sandwich a second channel region therebetween and connected to each other,
wherein the first thin film transistor further comprises a fifth electrode connected to the second electrode and overlapped with the first electrode through the insulating film,
wherein the first electrode and the fifth electrode are overlapped with each other so as to sandwich a third channel region therebetween, and
wherein an LDD region is interposed between the third channel region and the first channel region.

8. A display system according to claim 7, wherein a potential of the first electrode of the plurality of first thin film transistors is kept to be constant.

9. A display system according to claim 7, wherein the first electrode and the second electrode of the plurality of second to fourth thin film transistors are electrically connected with each other so as to be applied same voltage to both electrodes.

10. A display system according to claim 7, wherein a potential difference between a potential of a source region and the first electrode is set to be a threshold of the first thin film transistors or lower than the threshold when the plurality of first thin film transistors are n-channel type.

11. A display system according to claim 7, wherein a potential difference between a potential of a source region and the first electrode is set to be a threshold of the first thin film transistors or higher than the threshold when the plurality of first thin film transistors are p-channel type.

12. A display system according to claim 7, wherein the display system is incorporated at least in one selected from the group consisting of a personal digital assistant, a personal computer, an image reproduction device, a television, a head mounted display, and a camera.

13. A display system comprising:
a plurality of pixels, each of the plurality of pixels comprising a first thin film transistors over a substrate having an insulating surface;
a driver circuit for outputting an inputted image signal to the plurality of pixels, the driver circuit comprising a second thin film transistor over the substrate; and
a memory for storing the image signal to be outputted to the driver circuit, the memory comprising a third thin film transistor over the substrate,
wherein each of the first to the third thin film transistors comprises a first electrode and a second electrode overlapped with a first channel region through insulating films,
wherein the first electrode and the second electrode are overlapped with each other so as to sandwich the first channel region therebetween, wherein each of the plurality of pixels comprises a fourth thin film transistor connected to a light emitting element, wherein the fourth thin film transistor comprises a third electrode and a fourth electrode overlapped with each other so as to sandwich a second channel region therebetween and connected to each other, wherein the first thin film transistor further comprises a fifth electrode connected to the second electrode and overlapped with the first electrode through the insulating film, wherein the first electrode and the fifth electrode are overlapped with each other so as to sandwich a third channel region therebetween, and wherein an LDD region is interposed between the third channel region and the first channel region.

14. A display system according to claim 13, wherein a potential of the first electrode of the plurality of first thin film transistors is kept to be constant.

15. A display system according to claim 13, wherein the first electrode and the second electrode of the plurality of second to third thin film transistors are electrically connected with each other so as to be applied same voltage to both electrodes.

16. A display system according to claim 13, wherein a potential difference between a potential of a source region and the first electrode is set to be a threshold of the first thin film transistors or lower than the threshold when the plurality of first thin film transistors are n-channel type.

17. A display system according to claim 13, wherein a potential difference between a potential of a source region and the first electrode is set to be a threshold of the first thin film transistors or higher than the threshold when the plurality of first thin film transistors are p-channel type.

18. A display system according to claim 13, wherein the memory comprises a SRAM circuit.

19. A display system according to claim 13, wherein the display system is incorporated at least in one selected from the group consisting of a personal digital assistant, a personal computer, an image reproduction device, a television, a head mounted display, and a camera.

20. A display system comprising:
a plurality of pixels, each of the plurality of pixels comprising a first thin film transistors over a substrate having an insulating surface;
a driver circuit for outputting an inputted image signal to the plurality of pixels, the driver circuit comprising a second thin film transistor over the substrate; and
a memory for storing the image signal to be outputted to the driver circuit, the memory comprising a plurality of third thin film transistor over the substrate,
a memory controller for assigning an address of the memory and outputting a write signal and a read signal, the memory controller comprising a fourth thin film transistor over the substrate,
wherein each of the first to the fourth thin film transistors comprises a first electrode and a second electrode overlapped with a first channel region through insulating films,
wherein the first electrode and the second electrode are overlapped with each other so as to sandwich the first channel region therebetween,
wherein each of the plurality of pixels comprises a fifth thin film transistor connected to a light emitting element,
wherein the fifth thin film transistor comprises a third electrode and a fourth electrode overlapped with each other so as to sandwich a second channel region therebetween and connected to each other, wherein the first thin film transistor further comprises a fifth electrode connected to the second electrode and overlapped with the first electrode through the insulating film, wherein the first electrode and the fifth electrode are overlapped with each other so as to sandwich a third channel region therebetween, and wherein an LDD region is interposed between the third channel region and the first channel region.

21. A display system according to claim 20, wherein a potential of the first electrode of the plurality of first thin film transistors is kept to be constant.

22. A display system according to claim 20, wherein the first electrode and the second electrode of the plurality of second to fourth thin film transistors are electrically connected with each other so as to be applied same voltage to both electrodes.

23. A display system according to claim 20, wherein a potential difference between a potential of a source region and the first electrode is set to be a threshold of the first thin film transistors or lower than the threshold when the plurality of first thin film transistors are n-channel type.

24. A display system according to claim 20, wherein a potential difference between a potential of a source region and the first electrode is set to be a threshold or of the first thin film transistors higher than the threshold when the plurality of first thin film transistors are p-channel type.

25. A display system according to claim 20, wherein the memory comprises a SRAM circuit.

26. A display system according to claim 20, wherein the display system is incorporated at least in one selected from the group consisting of a personal digital assistant, a personal computer, an image reproduction device, a television, a head mounted display, and a camera.

27. A display system comprising:
a plurality of pixels, each of the plurality of pixels comprising a first thin film transistors over a substrate having an insulating surface;
a driver circuit for outputting an inputted image signal to the plurality of pixels, the driver circuit comprising a second thin film transistor over the substrate; and
a memory for storing the image signal to be outputted to the driver circuit, the memory comprising a third thin film transistor over the substrate,
a memory controller for assigning an address of the memory and outputting a write signal and a read signal, the memory controller comprising a fourth thin film transistor over the substrate,
a CPU for outputting a signal to the memory controller, the CPU comprising a fifth thin film transistor over the substrate,
wherein each of the plurality of first to fifth thin film transistors comprises a first electrode and a second electrode overlapped with a first channel region through insulating films,
wherein the first electrode and the second electrode are overlapped with each other so as to sandwich the first channel region therebetween,
wherein each of the plurality of pixels comprises a sixth thin film transistor connected to a light emitting element,
wherein the sixth thin film transistor comprises a third electrode and a fourth electrode overlapped with each other so as to sandwich a second channel region therebetween and connected to each other, wherein the first thin film transistor further comprises a fifth electrode connected to the second electrode and overlapped with the first electrode through the insulating film, wherein the first electrode and the fifth electrode are overlapped with each other so as to sandwich a third channel region therebetween, and wherein an LDD region is interposed between the third channel region and the first channel region.

28. A display system according to claim 27, wherein a potential of the first electrode of the plurality of first thin film transistors is kept to be constant.

29. A display system according to claim 27, wherein the first electrode and the second electrode of the plurality of second to fifth thin film transistors are electrically connected with each other so as to be applied same voltage to both electrodes.

30. A display system according to claim 27, wherein a potential difference between a potential of a source region and the first electrode is set to be a threshold of the first thin film transistors or lower than the threshold when the plurality of first thin film transistors are n-channel type.

31. A display system according to claim 27, wherein a potential difference between a potential of a source region and the first electrode is set to be a threshold of the first thin film transistors or higher than the threshold when the plurality of first thin film transistors are p-channel type.

32. A display system according to claim 27, wherein the memory comprises a SRAM circuit.

33. A display system according to claim 27, wherein the display system is incorporated at least in one selected from the group consisting of a personal digital assistant, a personal computer, an image reproduction device, a television, a head mounted display, and a camera.

34. A display system comprising:
a plurality of pixels, each of the plurality of pixels comprising a first thin film transistors over a substrate having an insulating surface;
a driver circuit for outputting an inputted image signal to the plurality of pixels, the driver circuit comprising a second thin film transistor over the substrate; and
a memory for storing the image signal to be outputted to the driver circuit, the memory comprising a third thin film transistor over the substrate,
a memory controller for assigning an address of the memory and outputting a write signal and a read signal, the memory controller comprising a fourth thin film transistor over the substrate,
a CPU for outputting a signal to the memory controller, the CPU comprising a fifth thin film transistor over the substrate,
a display controller for outputting a clock pulse and a start pulse to the driver circuit, the display controller comprising a sixth thin film transistor over the substrate, wherein each of the first to the sixth thin film transistors comprises a first electrode and a second electrode overlapped with a first channel region through insulating films, wherein the first electrode and the second electrode are overlapped with each other so as to sandwich the first channel region therebetween, wherein each of the plurality of pixels comprises a seventh thin film transistor connected to a light emitting element, wherein the seventh thin film transistor comprises a third electrode and a fourth electrode overlapped with each other so as to sandwich a channel region therebetween and connected to each other, wherein the first thin film transistor further comprises a fifth electrode connected to the second electrode and overlapped with the first electrode through the insulating film, wherein the first electrode and the fifth electrode are overlapped with each other so as to sandwich a third channel region therebetween, and wherein an LDD region is interposed between the third channel region and the first channel region.

35. A display system according to claim 34, wherein a potential of the first electrode of the plurality of first thin film transistors is kept to be constant.

36. A display system according to claim 34, wherein the first electrode and the second electrode of the plurality of second to sixth thin film transistors are electrically connected with each other so as to be applied same voltage to both electrodes.

37. A display system according to claim 34, wherein a potential difference between a potential of a source region and the first electrode is set to be a threshold of the first thin film transistors or lower than the threshold when the plurality of first thin film transistors are n-channel type.

38. A display system according to claim 34, wherein a potential difference between a potential of a source region and the first electrode is set to be a threshold of the first thin film transistors or higher than the threshold when the plurality of the first thin film transistors are p-channel type.

39. A display system according to claim 34, wherein the memory comprises a SRAM circuit.

40. A display system according to claim 34, wherein the display system is incorporated at least in one selected from the group consisting of a personal digital assistant, a personal computer, an image reproduction device, a television, a head mounted display, and a camera.

* * * * *